(12) United States Patent
Simms et al.

(10) Patent No.: US 11,258,017 B2
(45) Date of Patent: Feb. 22, 2022

(54) SEMICONDUCTING COMPOSITIONS COMPRISING SEMICONDUCTING POLYMERS

(71) Applicant: NeuDrive Limited, Alderley Park (GB)

(72) Inventors: Michael James Simms, Macclesfield (GB); Simon Dominic Ogier, Macclesfield (GB)

(73) Assignee: Wuhan Xinqu Chuangrou Optoelectronics Technology Co., LTD, Wuhan (CN)

( * ) Notice: Subject to any disclaimer, the term of this patent is extended or adjusted under 35 U.S.C. 154(b) by 67 days.

(21) Appl. No.: 16/096,450

(22) PCT Filed: Apr. 25, 2017

(86) PCT No.: PCT/GB2017/051154
§ 371 (c)(1),
(2) Date: Oct. 25, 2018

(87) PCT Pub. No.: WO2017/187162
PCT Pub. Date: Nov. 2, 2017

(65) Prior Publication Data
US 2019/0131533 A1    May 2, 2019

(30) Foreign Application Priority Data

Apr. 27, 2016 (GB) .................................... 1607297
Aug. 1, 2016 (GB) .................................... 1613246

(51) Int. Cl.
*C08G 61/02* (2006.01)
*H01L 51/00* (2006.01)
(Continued)

(52) U.S. Cl.
CPC ........ *H01L 51/0055* (2013.01); *C07F 7/0803* (2013.01); *C08G 61/02* (2013.01);
(Continued)

(58) Field of Classification Search
CPC ............ H01L 51/0055; H01L 51/0056; H01L 51/0043; C08G 61/02; C08G 61/10;
(Continued)

(56) References Cited

U.S. PATENT DOCUMENTS 3,557,233 A    1/1971   Zweig et al.
5,900,327 A *  5/1999   Pei .................... C08G 61/00
                                                        313/504

(Continued)

FOREIGN PATENT DOCUMENTS

GB    1541101       2/1979
GB    2482974 A     2/2012

(Continued)

OTHER PUBLICATIONS

British Office Action for GB1706570.7 dated Feb. 13, 2020.
(Continued)

*Primary Examiner* — Jane L Stanley
(74) *Attorney, Agent, or Firm* — Thomas|Horstemeyer LLP

(57) ABSTRACT

A semiconducting composition comprising a semiconducting polymer and a semiconducting non-polymeric polycyclic compound, wherein the semiconducting polymer comprises units of A and/or B:

(Continued)

-continued

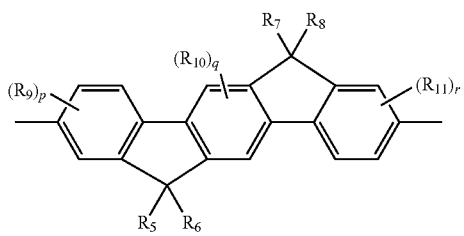

B wherein $R_1$, $R_2$, $R_5$, $R_6$, $R_7$, $R_8$, x, y, p, q, r, $R_3$, $R_4$, $R_9$, $R_{10}$ and $R_{11}$ have any of the meanings defined in the description.

20 Claims, 1 Drawing Sheet

(51) Int. Cl.
*H01L 51/05* (2006.01)
*C08L 65/00* (2006.01)
*C08K 5/00* (2006.01)
*C07F 7/08* (2006.01)

(52) U.S. Cl.
CPC ........... *C08K 5/00* (2013.01); *C08L 65/00* (2013.01); *H01L 51/0039* (2013.01); *H01L 51/0043* (2013.01); *H01L 51/0044* (2013.01); *H01L 51/0094* (2013.01); *H01L 51/0558* (2013.01); *C08G 2261/11* (2013.01); *C08G 2261/12* (2013.01); *C08G 2261/143* (2013.01); *C08G 2261/1424* (2013.01); *C08G 2261/314* (2013.01); *C08G 2261/3142* (2013.01); *C08G 2261/92* (2013.01)

(58) Field of Classification Search
CPC ............ C08G 2261/11; C08G 2261/12; C08G 2261/143; C08G 2261/3142; C08K 5/0091; C08K 11/02; C08K 11/06; C08K 2211/14
See application file for complete search history.

(56) References Cited

U.S. PATENT DOCUMENTS

| | | | |
|---|---|---|---|
| 5,965,281 | A | 10/1999 | Cao |
| 6,169,163 | B1 | 1/2001 | Woo et al. |
| 6,309,763 | B1 * | 10/2001 | Woo .................. C07C 25/22 313/504 |
| 6,690,029 | B1 | 2/2004 | Anthony et al. |
| 6,835,468 | B2 | 12/2004 | Cho et al. |
| 2002/0051895 | A1 | 5/2002 | Cho et al. |
| 2003/0099838 | A1 | 5/2003 | Cho et al. |
| 2003/0116755 | A1 | 6/2003 | Takahashi et al. |
| 2009/0230860 | A1 * | 9/2009 | Kamatani ............ H05B 33/14 313/504 |
| 2011/0251401 | A1 * | 10/2011 | Zheng ................ H01L 51/0072 548/305.1 |
| 2012/0097938 | A1 | 4/2012 | Meyer et al. |
| 2013/0134405 | A1 * | 5/2013 | Wang .................. C09K 11/06 257/40 |
| 2013/0313536 | A1 * | 11/2013 | Nishimura .......... H01L 51/5024 257/40 |
| 2021/0273175 | A1 * | 9/2021 | Pak .................... C09K 11/06 |

FOREIGN PATENT DOCUMENTS

| | | |
|---|---|---|
| GB | 2486480 A | 6/2012 |
| JP | 2000506916 A | 6/2000 |
| JP | 2002161130 | 6/2002 |
| JP | 2014516210 | 7/2014 |
| JP | 2015513580 | 5/2015 |
| JP | 2015514816 | 5/2015 |
| JP | 2015514817 | 5/2015 |
| JP | 2015515505 | 5/2015 |
| JP | 2015516991 | 6/2015 |
| JP | 2018556413 | 4/2017 |
| KR | 20080043160 | 5/2008 |
| WO | WO 97/33323 A1 | 9/1997 |
| WO | WO 1999/032537 A1 | 7/1999 |
| WO | 2004/095599 A1 | 4/2004 |
| WO | WO 2004/102690 A2 | 11/2004 |
| WO | WO 2007/068326 A1 | 6/2007 |
| WO | WO 2007/078993 A1 | 7/2007 |
| WO | WO 2008/128618 A1 | 10/2008 |
| WO | WO 2012/160382 A1 | 11/2012 |
| WO | WO 2012/160383 A1 | 11/2012 |
| WO | WO 2012/164282 A1 | 12/2012 |
| WO | 2013/041822 A1 | 3/2013 |
| WO | 2013/124682 A1 | 8/2013 |
| WO | 2013/190255 A2 | 12/2013 |
| WO | 2014/140568 A1 | 9/2014 |
| WO | WO 2015/015183 A1 | 2/2015 |
| WO | WO 2015/168638 A1 | 11/2015 |

OTHER PUBLICATIONS

International Search Report and Written Opinion for PCT/GB2017/051154, dated Apr. 25, 2017, 10 pages.
Soo-Hyun et al, "A Newly Designed Polyfluorene as an Efficient Host Material for Phosphorescent-Dye-Doped Polymer Light-Emitting Diodes", Japanese Journal of Applied Physics, vol. 52, No. 10S, Oct. 1, 2013, p. 10MB11, XP0055385534, JP ISSN: 0021-4922, DOI: 10.7567/JJAP.52.10MB11, Section 2.3; Figure 2.
Mallavia et al, "Characterization and Side Chain Manipulation in Violet-Blue Poly-[(9,9-dialkylfluoren-2,7-diyl)-alt-co-(benzen-1,4-diyl)] Backbones", Macromolecules, vol. 38, No. 8, Apr. 1, 2005, pp. 3185-3192.
Springer, Advances in Polymer Science, 212:Polyfluorenes, pp. 275-278.
Polymer Chemistry (1990), vol. 28, No. 2, pp. 367-383.
Macromolecular Rapid Communications (2009), vol. 30, pp. 653-687.
Journal of Fluorine Chemistry (2015), vol. 178, pp. 195-200.
Polymer Chemistry (2015), vol. 6, No. 28, pp. 5070-5076.
Journal of Applied Polymer Science (2014), vol. 131, No. 19, pp. 40878/1-40878/8.
Journal of Medicinal Chemistry (2006), vol. 49, No. 15.
Journal of Polymer Science Part A: Polymer Chemistry (2009), vol. 47, No. 19, pp. 5044-5056.
Journal of Labelled Compounds and Radiopharmaceuticals (2012), vol. 55, No. 1, pp. 39-43.
Journal of Organic Chemistry (2011), vol. 76, No. 13, pp. 5198-5206.
Journal of Organic Chemistry (2014), vol. 79, No. 19, pp. 8960-8967.
Organic Letters (2004), vol. 6, No. 10, pp. 1609-1612.
Zhang et al, (2014) Journal of American Chemical Society, vol. 136, pp. 9248-9251.

* cited by examiner

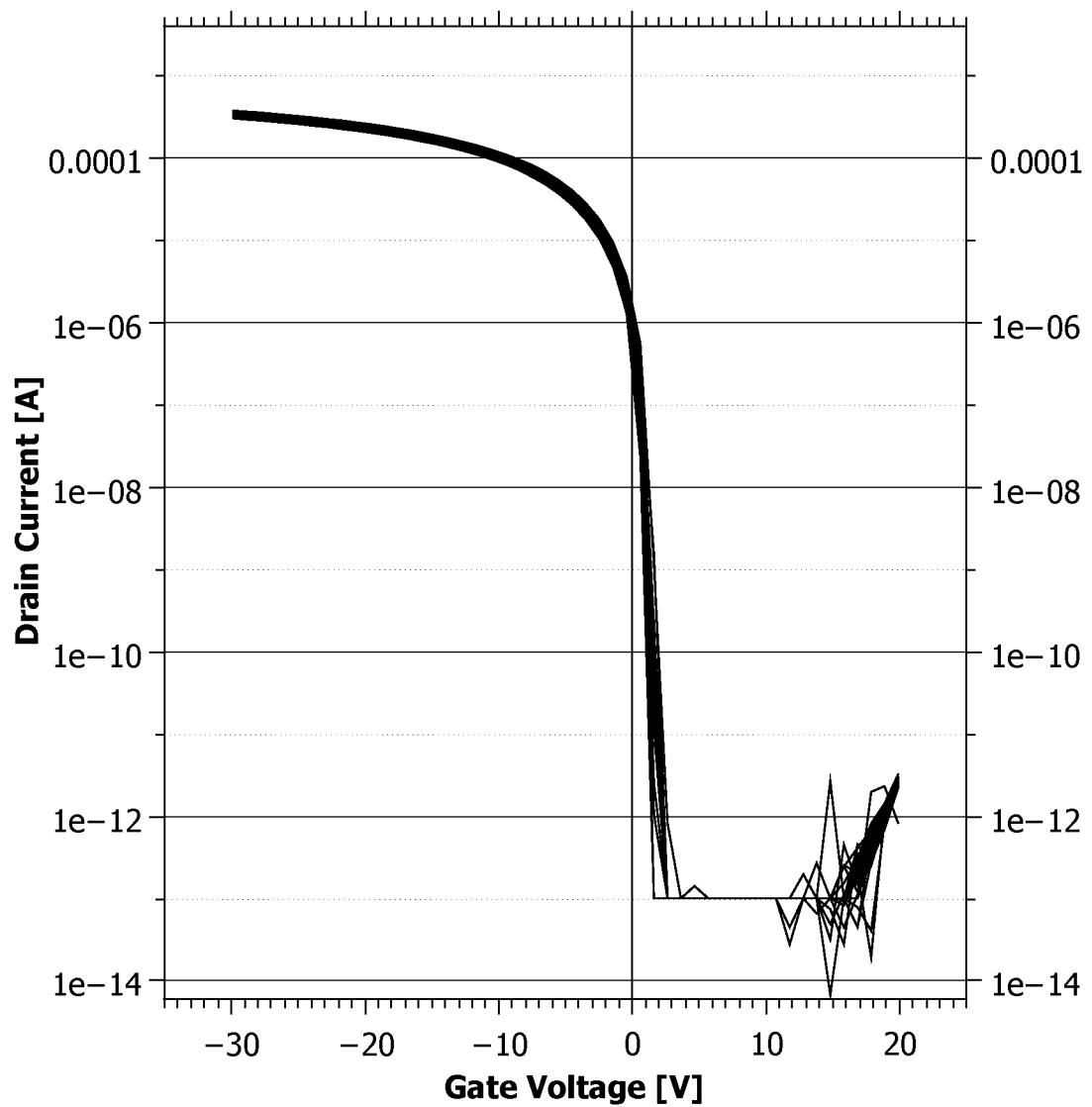

SEMICONDUCTING COMPOSITIONS COMPRISING SEMICONDUCTING POLYMERS

CROSS-REFERENCE TO RELATED APPLICATIONS

The present application is a U.S. National Phase Entry of International PCT Application No. PCT/GB2017/051154 having an international filing date of Apr. 25, 2017, which claims priority to Great Britain Patent Application No. 1607297.7 filed on Apr. 27, 2016 and Great Britain Patent Application No. 1613246.6 filed on Aug. 1, 2016. The present application claims priority and the benefit of the above-identified applications and the above-identified applications are incorporated by reference herein in their entirety.

FIELD OF THE INVENTION

The present invention relates to semiconducting compositions and to semiconducting copolymers that are suitable for use as binders in semiconducting compositions. The present invention also relates to semiconducting layers comprising the semiconducting compositions and to electronic devices comprising the semiconducting compositions and layers.

BACKGROUND OF THE INVENTION

Various semiconductor compositions have been proposed as alternatives to silicon-based semiconductors. Typically, such semiconductor compositions comprise a polymeric binder and a semiconducting material. For example, WO 2012/164282 discloses organic semiconductor compositions that comprise a polyacene compound and an organic binder, wherein the organic binder is a polymeric semiconducting binder having a relative permittivity at 1000 Hz of between 3.4 and 8. WO 2012/160383 discloses semiconductor compositions that comprise a soluble polyacene semiconductor and a polymeric semiconducting binder. WO 2012/160382 discloses semiconducting polytriarylamine polymers and their use in electronic components.

Whilst the aforementioned polymeric binders are suitable for use in semiconductor compositions, there remains a need for alternative polymeric binders which may have alternative and/or improved properties. For example, it would be desirable to provide alternative polymeric binders that have improved solubility in typical processing solvents and/or that have improved film forming properties. It is also desirable to provide polymeric binders that are relatively easy to make, especially on large scales, and/or that can be prepared having high molecular weights. Such alternative polymeric binders should exhibit high relative permittivity, such as a relative permittivity of greater than 3.4 at 1000 Hz.

There is therefore a need for alternative semiconducting compositions and for alternative polymers which have desirable properties for use in semiconducting compositions, for example for use as binders in semiconducting compositions.

SUMMARY OF THE INVENTION

The present invention provides semiconducting compositions.

In a first aspect, the present invention provides a semiconducting composition comprising a semiconducting polymer and a semiconducting non-polymeric polycyclic compound, wherein the semiconducting polymer comprises units of A and/or B:

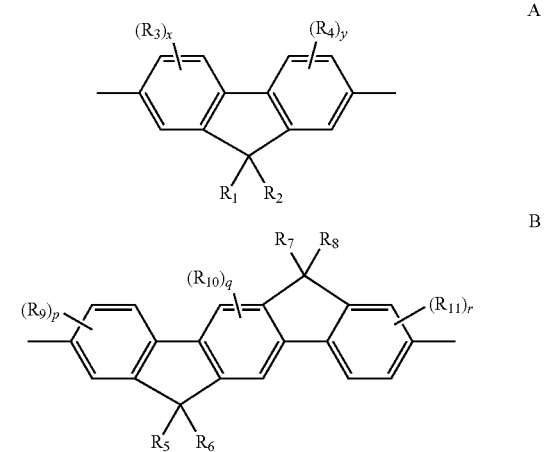

wherein $R_1$, $R_2$, $R_5$, $R_6$, $R_7$ and $R_8$ are each independently selected from $C_1$-$C_{12}$ alkyl, $C_2$-$C_{12}$ alkenyl and aryl;
wherein when any $R_1$, $R_2$, $R_5$, $R_6$, $R_7$ and/or $R_8$ group is $C_1$-$C_{12}$ alkyl or $C_2$-$C_{12}$ alkenyl, then each $R_1$, $R_2$, $R_5$, $R_6$, $R_7$ and/or $R_8$ group is optionally substituted by one or more substituents independently selected from cyano, hydroxy, $C_1$-$C_{10}$ alkoxy, $C_3$-$C_8$ cycloalkyl, heterocyclyl, aryl and a group of the formula —(OCH$_2$CH$_2$)$_z$—OR$_{12}$, wherein z is 1, 2, 3, 4, 5 or 6 and $R_{12}$ is $C_1$-$C_4$ alkyl;
and wherein any aryl group present in $R_1$, $R_2$, $R_5$, $R_6$, $R_7$ and/or $R_8$ is optionally substituted by one or more substituents independently selected from $C_1$-$C_4$ alkyl, $C_1$-$C_4$ alkoxy, cyano, hydroxy, fluoro, chloro, trifluoromethyl and trifluoromethoxy;
wherein in the units A (when present) at least one of the $R_1$ and $R_2$ groups is substituted by one or more cyano groups and in the units B (when present) at least one of the $R_5$, $R_6$, $R_7$ and $R_8$ groups is substituted by one or more cyano groups;
x represents 0, 1, 2 or 3;
y represents 0, 1, 2 or 3;
p represents 0, 1, 2 or 3;
q represents 0, 1 or 2;
r represents 0, 1, 2 or 3;
wherein each $R_3$, $R_4$, $R_9$, $R_{10}$ and $R_{11}$ (when present) is independently selected from $C_1$-$C_6$ alkyl and $C_1$-$C_4$ alkoxy.

The present invention provides semiconducting copolymers.

In a second aspect, the present invention provides a semiconducting copolymer comprising units of A and/or B:

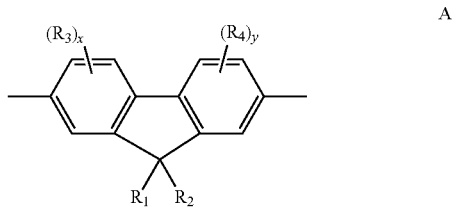

-continued

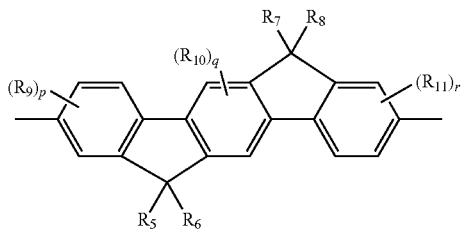

B wherein $R_1$, $R_2$, $R_5$, $R_6$, $R_7$ and $R_8$ are each independently selected from $C_1$-$C_{12}$ alkyl, $C_2$-$C_{12}$ alkenyl and aryl;
wherein when any $R_1$, $R_2$, $R_5$, $R_6$, $R_7$ and/or $R_8$ group is $C_1$-$C_{12}$ alkyl or $C_2$-$C_{12}$ alkenyl, then each $R_1$, $R_2$, $R_5$, $R_6$, $R_7$ and/or $R_8$ group is optionally substituted by one or more substituents independently selected from cyano, hydroxy, $C_1$-$C_{10}$ alkoxy, $C_3$-$C_8$ cycloalkyl, heterocyclyl, aryl and a group of the formula —(OCH$_2$CH$_2$)$_z$—OR$_{12}$, wherein z is 1, 2, 3, 4, 5 or 6 and $R_{12}$ is $C_1$-$C_4$ alkyl;
and wherein any aryl group present in $R_1$, $R_2$, $R_5$, $R_6$, $R_7$ and/or $R_8$ is optionally substituted by one or more substituents independently selected from $C_1$-$C_4$ alkyl, $C_1$-$C_4$ alkoxy, cyano, hydroxy, fluoro, chloro, trifluoromethyl and trifluoromethoxy;
wherein in the units A (when present) at least one of the $R_1$ and $R_2$ groups is substituted by one or more cyano groups and in the units B (when present) at least one of the $R_5$, $R_6$, $R_7$ and $R_8$ groups is substituted by one or more cyano groups;
x represents 0, 1, 2 or 3;
y represents 0, 1, 2 or 3;
p represents 0, 1, 2 or 3;
q represents 0, 1 or 2;
r represents 0, 1, 2 or 3;
wherein each $R_3$, $R_4$, $R_9$, $R_{10}$ and $R_{11}$ (when present) is independently selected from $C_1$-$C_6$ alkyl and $C_1$-$C_4$ alkoxy.

DETAILED DESCRIPTION OF THE INVENTION

Unless otherwise stated, the following terms used in the specification and claims have the meanings set out below.

The term "alkyl" includes both straight and branched chain alkyl groups. References to individual alkyl groups such as "propyl" are specific for the straight chain version only and references to individual branched chain alkyl groups such as "isopropyl" are specific for the branched chain version only. For example, "$C_1$-$C_{12}$ alkyl" includes $C_1$-$C_6$ alkyl, $C_1$-$C_4$ alkyl, propyl, isopropyl and t-butyl.

The term "alkenyl" includes both straight and branched chain alkenyl groups. References to individual alkenyl groups such as "propenyl" are specific for the straight chain version only and references to individual branched chain alkenyl groups such as "isopropenyl" are specific for the branched chain version only. For example, "$C_2$-$C_2$ alkenyl" includes $C_1$-$C_6$ alkenyl, $C_1$-$C_4$ alkenyl, propenyl, isopropenyl and t-butenyl.

The term "$C_3$-$C_8$ cycloalkyl" means a hydrocarbon ring containing from 3 to 8 carbon atoms, for example, cyclopropyl, cyclobutyl, cyclopentyl, cyclohexyl, cycloheptyl, bicyclo[2.2.2]octyl, bycyclo[2.1.1]hexyl, bicyclo[1.1.1]pentyl and bicyclo[2.2.1]heptyl.

The term "alkoxy" includes both straight and branched chain alkoxy groups. References to individual alkoxy groups such as "propoxy" are specific for the straight chain version only and references to individual branched chain alkyl groups such as "isopropoxy" are specific for the branched chain version only. For example, "$C_1$-$C_{10}$ alkoxy" includes $C_1$-$C_6$ alkoxy, $C_1$-$C_4$ alkoxy, propoxy, isopropoxy and t-butoxy.

The term "heterocyclyl" means a non-aromatic saturated or partially saturated monocyclic or fused, bridged or spiro bicyclic heterocyclic ring system. Monocyclic heterocyclic rings contain from about 3 to 12 (suitably from about 3 to 7) ring atoms with from 1 to 5 (suitably 1, 2 or 3) heteroatoms selected from nitrogen, oxygen or sulfur in the ring. Bicyclic heterocyclic rings contain from about 7 to 17 (suitably from about 7 to 12) ring atoms with from 1 to 5 (suitably 1, 2 or 3) heteroatoms selected from nitrogen, oxygen or sulfur in the ring(s). Bicyclic heterocyclic rings may be fused, spiro or bridged ring systems. As the skilled person would appreciate, any heterocyclyl group may be linked to another group via any suitable atom, such as via a carbon or nitrogen atom.

The term "aryl" means a cyclic or polycyclic aromatic ring having from 5 to 12 carbon atoms. The term "aryl" includes both monovalent species and divalent species. Examples of aryl groups include, but are not limited to, phenyl, biphenyl and naphthyl. In a particular embodiment, an aryl group may be phenyl.

References to "homopolymer(s)" herein refer to polymers that include a single type of repeat unit.

References to "copolymer(s)" herein refer to polymers that include more than one type of repeat unit.

References to "alternating copolymer(s)" herein refer to copolymers that possess regularly repeating alternating repeat units.

References to "periodic copolymer(s)" herein refer to copolymers having units arranged in a repeating sequence.

References to "random copolymer(s)" herein refer to copolymers having repeat units that are arranged randomly in the copolymer chain.

References to "block copolymer(s)" herein refer to copolymers having two or more dimer, oligomer or homopolymer subunits linked by covalent bonds.

References to "diblock copolymer(s)" herein refer to block copolymers having two distinct homopolymer subunits or blocks.

References to "triblock copolymer(s)" herein refer to block copolymers having three distinct homopolymer subunits or blocks.

References to a "binder" herein refer to a substance (for example a polymer) that will form a film on a substrate. In other words, the binder may be a film forming polymer that can be used as a film forming component, for example in a composition.

References to "semiconducting" herein refer to a material (for example polymer, composition or layer) the conductivity of which, due to charge carriers, is normally in the range between that of a conductor and an insulating medium and in which the volumic numbers of charge carriers can be changed by external means.

References to the "relative permittivity" of a material herein refer to the materials dielectric permittivity expressed as a ratio relative to the permittivity of vacuum.

Throughout this specification, the term "comprising" or "comprises" means including the component(s) specified but not to the exclusion of the presence of other components. The term "consisting essentially of" or "consists essentially of" means including the components specified but excluding other components except for components added for a purpose other than achieving the technical effect of the invention. The term "consisting of" or "consists of" means including the components specified but excluding other components.

Whenever appropriate, depending upon the context, the use of the term "comprises" or "comprising" may also be taken to include the meaning "consists essentially of" or "consisting essentially of", and also may also be taken to include the meaning "consists of" or "consisting of".

The optional features set out herein may be used either individually or in combination with each other where appropriate and particularly in the combinations as set out in the accompanying claims. The optional features for each exemplary embodiment of the invention, as set out herein are also applicable to any other aspects or exemplary embodiments of the invention, where appropriate. In other words, the skilled person reading this specification should consider the optional features for each aspect or embodiment of the invention as interchangeable and combinable between different aspects of the invention.

Semiconducting Compositions

In a first aspect, the present invention provides a semiconducting composition comprising a semiconducting polymer and a semiconducting non-polymeric polycyclic compound, wherein the semiconducting polymer comprises units of A and/or B:

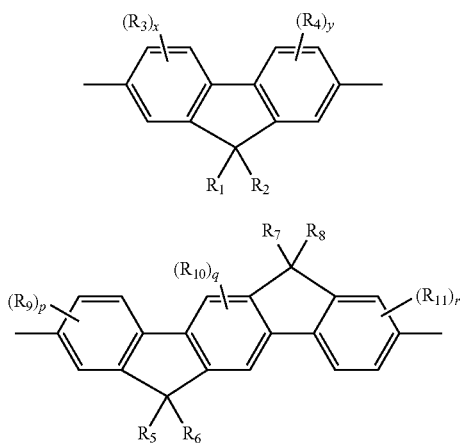

wherein $R_1$, $R_2$, $R_5$, $R_6$, $R_7$ and $R_8$ are each independently selected from $C_1$-$C_{12}$ alkyl, $C_2$-$C_{12}$ alkenyl and aryl;
wherein when any $R_1$, $R_2$, $R_5$, $R_6$, $R_7$ and/or $R_8$ group is $C_1$-$C_{12}$ alkyl or $C_2$-$C_{12}$ alkenyl, then each $R_1$, $R_2$, $R_5$, $R_6$, $R_7$ and/or $R_8$ group is optionally substituted by one or more substituents independently selected from cyano, hydroxy, $C_1$-$C_{10}$ alkoxy, $C_3$-$C_8$ cycloalkyl, heterocyclyl, aryl and a group of the formula —$(OCH_2CH_2)_z$—$OR_{12}$, wherein z is 1, 2, 3, 4, 5 or 6 and $R_{12}$ is $C_1$-$C_4$ alkyl;
and wherein any aryl group present in $R_1$, $R_2$, $R_5$, $R_6$, $R_7$ and/or $R_8$ is optionally substituted by one or more substituents independently selected from $C_1$-$C_4$ alkyl, $C_1$-$C_4$ alkoxy, cyano, hydroxy, fluoro, chloro, trifluoromethyl and trifluoromethoxy;
wherein in the units A (when present) at least one of the $R_1$ and $R_2$ groups is substituted by one or more cyano groups and in the units B (when present) at least one of the $R_5$, $R_6$, $R_7$ and $R_8$ groups is substituted by one or more cyano groups;

x represents 0, 1, 2 or 3;
y represents 0, 1, 2 or 3;
p represents 0, 1, 2 or 3;
q represents 0, 1 or 2;
r represents 0, 1, 2 or 3;
wherein each $R_3$, $R_4$, $R_9$, $R_{10}$ and $R_{11}$ (when present) is independently selected from $C_1$-$C_6$ alkyl and $C_1$-$C_4$ alkoxy.

Suitably, the semiconducting polymer which is comprised in the semiconducting composition may comprise units of A and/or B:
wherein $R_1$, $R_2$, $R_5$, $R_6$, $R_7$ and $R_8$ are each independently selected from $C_1$-$C_{12}$ alkyl, wherein each $C_1$-$C_{12}$ alkyl group is optionally substituted by one or more substituents independently selected from cyano, hydroxy, $C_1$-$C_{10}$ alkoxy, $C_3$-$C_8$ cycloalkyl, heterocyclyl, aryl and a group of the formula —$(OCH_2CH_2)_z$—$OR_{12}$, wherein z is 1, 2, 3, 4, 5 or 6 and $R_{12}$ is $C_1$-$C_4$ alkyl;
and wherein any aryl group present in $R_1$, $R_2$, $R_5$, $R_6$, $R_7$ and/or $R_8$ is optionally substituted by one or more substituents independently selected from $C_1$-$C_4$ alkyl, $C_1$-$C_4$ alkoxy, cyano, hydroxy, fluoro, chloro, trifluoromethyl and trifluoromethoxy;
wherein in the units A (when present) at least one of the $R_1$ and $R_2$ groups is substituted by one or more cyano groups and in the units B (when present) at least one of the $R_5$, $R_6$, $R_7$ and $R_8$ groups is substituted by one or more cyano groups;
x represents 0 or 1 (such as 0);
y represents 0 or 1 (such as 0);
p represents 0 or 1 (such as 0);
q represents 0 or 1 (such as 0);
r represents 0 or 1 (such as 0);
wherein each $R_3$, $R_4$, $R_9$, $R_{10}$ and $R_{11}$ (when present) is independently selected from $C_1$-$C_6$ alkyl and $C_1$-$C_4$ alkoxy.

The semiconducting composition of the first aspect comprises a semiconducting polymer that comprises units of A and/or B. It will be clear to a person skilled in the art that the units of A and B are shown as monomeric or repeat units that may be linked together to form a polymer.

In the units A (when present), at least one of the $R_1$ and $R_2$ groups is substituted by one or more cyano groups and in the units B (when present) at least one of the $R_5$, $R_6$, $R_7$ and $R_8$ groups is substituted by one or more cyano groups. As well as being substituted by one or more cyano groups, the $R_1$, $R_2$, $R_5$, $R_6$, $R_7$ and $R_8$ groups may be substituted by one or more further substituents as defined herein, i.e. selected from cyano, hydroxy, $C_1$-$C_{10}$ alkoxy, $C_3$-$C_8$ cycloalkyl, heterocyclyl, aryl and a group of the formula —$(OCH_2CH_2)_z$—$OR_{12}$, wherein z is 1, 2, 3, 4, 5 or 6 and $R_{12}$ is $C_1$-$C_4$ alkyl. References herein to optional substituents on the $R_1$, $R_2$ $R_5$, $R_6$, $R_7$ and $R_8$ groups is to optional substituents in addition to the mandatory one or more cyano group substituents.

The semiconducting polymer which is comprised in the semiconducting composition of the first aspect of the invention comprises any suitable number of the units A and/or any suitable number of the units B. The semiconducting polymer may further comprise units of other structural types (provided that at least a unit A and/or B is present). The semiconducting polymer may therefore be a homopolymer or a copolymer.

When the semiconducting polymer is a homopolymer, it may be composed of the units A only or of the units B only. When the semiconducting polymer is a homopolymer, the homopolymer may have a formula as follows:

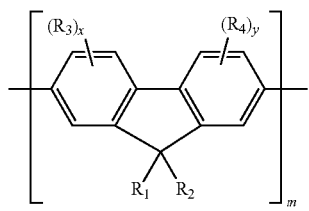

wherein m is the number of monomeric A units in the homopolymer and $R_1$, $R_2$, $R_3$, $R_4$, x and y are as defined herein. Suitably, m is greater than 5, more suitably greater than 10, and even more suitably greater than 20.

When the semiconducting polymer is a homopolymer, the homopolymer may have a formula as follows:

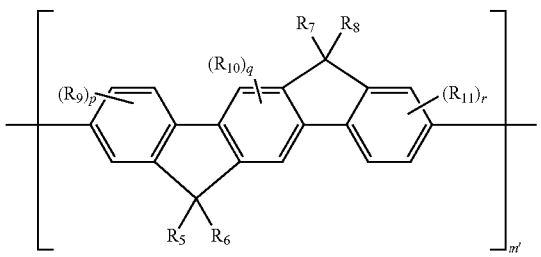

wherein m' is the number of monomeric B units in the homopolymer and $R_5$, $R_6$, $R_7$, $R_8$, $R_9$, $R_{10}$, $R_{11}$, p, q and r are as defined herein. Suitably, m' is greater than 5, more suitably greater than 10, and even more suitably greater than 20.

As the skilled person would appreciate, polymers are typically polydisperse products having a distribution of molecular weights. The values for m and m' are typically average values calculated from a molecular weight distribution for the polymer. Monodisperse polymers may be prepared using specific synthesis or purification methods, but are not necessary for the applications of the polymers defined herein.

When the semiconducting polymer which is comprised in the semiconducting composition of the first aspect of the invention is a copolymer, it may be composed of the units A in addition to suitable units of one or more other structural types. Suitable units of other structural types include the units B.

When the semiconducting polymer which is comprised in the semiconducting composition of the first aspect of the invention is a copolymer, it may be composed of the units B in addition to suitable units of one or more other structural types. Suitable units of other structural types include the units A.

When the semiconducting polymer which is comprised in the semiconducting composition of the first aspect of the invention is a copolymer, it may comprise units A and suitable additional units. For example, when the semiconducting polymer which is comprised in the semiconducting composition of the first aspect of the invention is a copolymer, it may comprise units of A and units of B as follows:

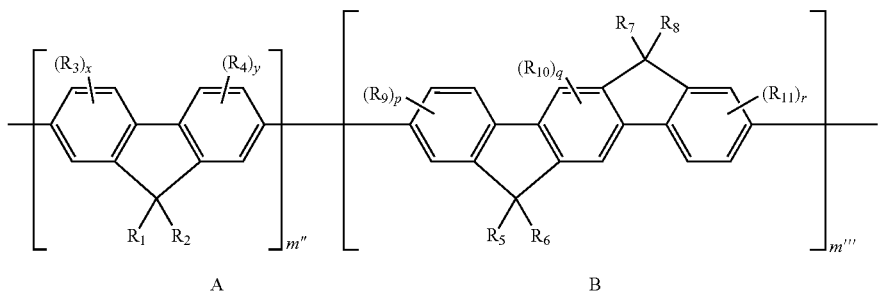

wherein m'' is the number of monomeric A units in the copolymer, m''' is the number of monomeric B units in the copolymer and $R_1$, $R_2$, $R_3$, $R_4$, $R_5$, $R_6$, $R_7$, $R_8$, $R_9$, $R_{10}$, $R_{11}$, x, y, p, q and r are as defined herein. The copolymer may comprise other suitable monomeric units in addition to the units A and B. As discussed above, the values m'' and m''' are typically average values calculated from a molecular weight distribution for the polymer. Suitably m'' and m''' are each independently greater than 5, more suitable greater than 10, even more suitably greater than 20.

The copolymers may comprise single units of A and single units of B linked so as to provide an alternating copolymer, a periodic copolymer or a random copolymer. For example, the copolymer may comprise single units of A and B linked so as to provide an alternating copolymer, i.e. of the structure -[-A-B-A-B-]-.

The copolymers may comprise blocks of the units A and blocks of the units B so as to provide a block copolymer. For example, in the block copolymer, the blocks of the units A and the blocks of the units B may be dimers, oligomers or polymers, for example dimers, oligomers or polymers A1 and B1 represented as follows:

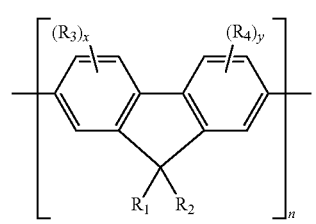

-continued

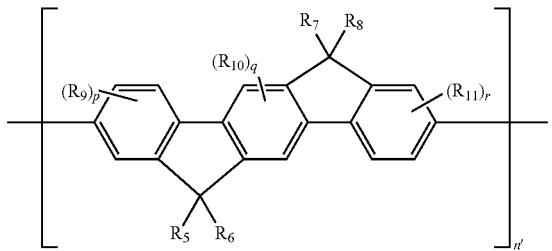

B1 wherein n and n' are each greater than 1. For example, n and n', which may be the same or different, may each be greater than 10. Thus, it would be clear to a person skilled in the art that the copolymers may comprise units of A and B as blocks of A (i.e. A1) and/or as blocks of B (i.e. B1).

Suitable block copolymers include di and tri block copolymers.

When the semiconducting polymer which is comprised in the semiconducting composition of the first aspect of the invention is a copolymer, it may alternatively comprise different A units.

For example, any unit A as defined herein may be combined with a different unit A as defined herein to provide a copolymer.

When the semiconducting polymer which is comprised in the semiconducting composition of the first aspect of the invention is a copolymer, it may alternatively comprise different B units.

For example, any unit B as defined herein may be combined with a different unit B as defined herein to provide a copolymer.

When the semiconducting polymer which is comprised in the semiconducting composition of the first aspect of the invention is a copolymer, it may consist essentially of (or consist of) units of A and B. Suitably, the semiconducting polymer may be an alternating copolymer which consists essentially of (or consists of) the units A and B. In other words, the semiconducting polymer may be a copolymer consisting essentially of (or consisting of) alternating A and B units. Suitably, the semiconducting polymer may be a random copolymer which consists essentially of (or consists of) the units A and B.

The semiconducting polymer which is comprised in the semiconducting composition of the first aspect of the invention may have a relative permittivity of greater than 3.4 at 1000 Hz. For example, the semiconducting polymer may have a relative permittivity of from 3.4 to 8 at 1000 Hz, such as from 3.4 to 6 at 1000 Hz, particularly from 3.4 to 4.5 at 1000 Hz. For example, the semiconducting polymer may have a relative permittivity of greater than 4 at 1000 Hz, such as from 4 to 8 at 1000 Hz, particularly from 4 to 7.5 at 1000 Hz.

It is believed that the desired relative permittivity of the semiconducting polymer may be obtained by selecting a suitable number of the monomeric A and/or B units for including in the polymer. The optimum number of A and/or B units will depend on the particular substituents provided.

The relative permittivity of the semiconducting polymer can be measured using any standard method known to those skilled in the art. Preferably, the relative permittivity is determined by the method disclosed in WO 2004/102690 or by using the method disclosed herein, more preferably by using the method disclosed herein.

Preferably, the semiconducting polymer which is comprised in the semiconducting composition of the first aspect of the invention has a charge mobility of greater than $10^{-7}$ $cm^2/Vs$, such as greater than $10^{-6}$ $cm^2/Vs$, particularly greater than $10^{-5}$ $cm^2/Vs$. Preferably, the semiconducting polymer, composition or layer has an ionisation potential close to that of a crystalline small molecule organic semiconductor material (OSC), most preferably within a range of +/−0.6 eV, even more preferably within a range of +/−0.4 eV, of the ionisation potential of a small molecule OSC. The references to "charge mobility" specifically for the semiconducting polymer relate to the charge mobility measured in the pure state, i.e. refer to a measurement of the intrinsic charge mobility of the pure polymer, rather than as a mixture with any other conducting, semiconducting or insulating materials.

The semiconducting polymer which is comprised in the semiconducting composition of the first aspect of the invention may comprise at least 20%, preferably at least 30%, monomeric A and/or B units, such as at least 50% monomeric A and/or B units.

The semiconducting polymer which is comprised in the semiconducting composition of the first aspect of the invention may comprise at least 20%, preferably at least 30%, monomeric A units, such as at least 50% monomeric A units.

The semiconducting polymer which is comprised in the semiconducting composition of the first aspect of the invention may comprise at least 20%, preferably at least 30%, monomeric B units, such as at least 50% monomeric B units.

The semiconducting polymer which is comprised in the semiconducting composition of the first aspect of the invention may be a homopolymer comprising 100% monomeric A units.

The semiconducting polymer which is comprised in the semiconducting composition of the first aspect of the invention may be a homopolymer comprising 100% monomeric B units.

The semiconducting polymer which is comprised in the semiconducting composition of the first aspect of the invention may be a copolymer comprising at least 20%, for example at least 30%, particularly at least 50%, monomeric A and/or B units. For example, the semiconducting polymer which is comprised in the semiconducting composition of the first aspect of the invention may be a copolymer comprising 50% monomeric A units and 50% monomeric B units, which copolymer may be an alternating copolymer.

The semiconducting polymer which is comprised in the semiconducting composition of the first aspect of the invention may have a number average molecular weight (Mn) in the range of 500 to 10,000,000 Dalton, particularly in the range of 1500 to 1,000,000 Dalton, more particularly in the range of 3000 to 200,000 Dalton. The number average molecular weight may be measured by any suitable method, for example by Gel Permeation Chromatography (GPC).

In the units of A, $R_1$ and $R_2$ are each independently selected from $C_1$-$C_{12}$ alkyl, $C_2$-$C_{12}$ alkenyl and aryl; wherein when any $R_1$ and/or $R_2$ group is $C_1$-$C_{12}$ alkyl or $C_2$-$C_{12}$ alkenyl, then each $R_1$ and/or $R_2$ group is optionally substituted by one or more substituents independently selected from cyano, hydroxy, $C_1$-$C_{10}$ alkoxy, $C_3$-$C_8$ cycloalkyl, heterocyclyl, aryl and a group of the formula —$(OCH_2CH_2)_z$—$OR_{12}$, wherein z is 1, 2, 3, 4, 5 or 6 and $R_{12}$ is $C_1$-$C_4$ alkyl;

and wherein any aryl group present in $R_1$ and/or $R_2$ is optionally substituted by one or more substituents independently selected from $C_1$-$C_4$ alkyl, $C_1$-$C_4$ alkoxy, cyano, hydroxy, fluoro, chloro, trifluoromethyl and trifluoromethoxy;

wherein in the units A (when present) at least one of the $R_1$ and $R_2$ groups is substituted by one or more cyano groups.

Suitably, in the units of A, $R_1$ and $R_2$ are each independently selected from $C_1$-$C_{12}$ alkyl, wherein the $C_1$-$C_{12}$ alkyl group is optionally substituted by one or more substituents independently selected from cyano, hydroxy, $C_1$-$C_{10}$ alkoxy, $C_3$-$C_8$ cycloalkyl, heterocyclyl, aryl and a group of the formula —(OCH$_2$CH$_2$)$_z$—OR$_{12}$, wherein z is 1, 2, 3, 4, 5 or 6 and $R_{12}$ is $C_1$-$C_4$ alkyl;

and wherein any aryl group present in $R_1$ and/or $R_2$ is optionally substituted by one or more substituents independently selected from $C_1$-$C_4$ alkyl, $C_1$-$C_4$ alkoxy, cyano, hydroxy, fluoro, chloro, trifluoromethyl and trifluoromethoxy;

wherein in the units A (when present) at least one of the $R_1$ and $R_2$ groups is substituted by one or more cyano groups.

Suitably, in the units of A, $R_1$ and $R_2$ are each independently selected from $C_1$-$C_{12}$ alkyl (such as $C_6$-$C_7$ alkyl), wherein at least one of the $C_1$-$C_{12}$ alkyl (such as $C_6$-$C_7$ alkyl) groups is substituted by one or more cyano groups.

Suitably, in the units of A, $R_1$ and $R_2$ are each independently selected from $C_1$-$C_{12}$ alkyl, wherein the $C_1$-$C_{12}$ alkyl group is substituted by one or more cyano groups.

Suitably, in the units of A, $R_1$ and $R_2$ are each independently selected from $C_6$-$C_{10}$ alkyl (such as $C_6$-$C_7$ alkyl), wherein at least one of the $C_6$-$C_{10}$ alkyl (such as $C_6$-$C_7$ alkyl) groups is substituted by one or more cyano groups.

Suitably, in the units of A, $R_1$ and $R_2$ are each independently selected from $C_6$-$C_{10}$ alkyl (such as $C_6$-$C_7$ alkyl), wherein the $C_6$-$C_{10}$ alkyl (such as $C_6$-$C_7$ alkyl) group is substituted by one or more cyano groups.

It is preferred (particularly when the semiconducting polymer is a copolymer) in the units of A that the groups $R_1$ and $R_2$ are the same. For example, preferably $R_1$ and $R_2$ are both the same and both represent a $C_1$-$C_{12}$ alkyl group substituted by one or more cyano groups. More preferably, $R_1$ and $R_2$ are both the same and both represent a $C_6$-$C_{10}$ alkyl, such as a $C_6$-$C_7$ alkyl, group substituted by one or more cyano groups.

In the units of A, x represents 0, 1, 2 or 3 and y represents 0, 1, 2 or 3. Suitably, x represents 0 or 1 and y represents 0 or 1. More suitably, x and y both represent 0.

When x is 0 then there are no $R_3$ substituents on the phenyl ring such that the phenyl ring has hydrogens at the unsubstituted positions. When y is 0 then there are no $R_4$ substituents on the phenyl ring such that the phenyl ring has hydrogens at the unsubstituted positions.

When x is 1 for example then there is one $R_3$ substituent on the phenyl ring and two hydrogens at the other unsubstituted positions. In this case, the $R_3$ substituent may be located at any of the available locations on the phenyl ring. When y is 1 for example then there is one $R_4$ substituent on the phenyl ring and two hydrogens at the other unsubstituted positions. In this case, the $R_4$ substituent may be located at any of the available locations on the phenyl ring. The same considerations apply when x and y are each 2 or 3.

In the units of A when x and/or y represent 1, 2 or 3, each of $R_3$ and $R_4$ is independently selected from $C_1$-$C_6$ alkyl and $C_1$-$C_4$ alkoxy, particularly from $C_1$-$C_3$ alkyl and $C_1$-$C_2$ alkoxy.

In the units of B, $R_5$, $R_6$, $R_7$ and $R_8$ are each independently selected from $C_1$-$C_{12}$ alkyl, $C_2$-$C_{12}$ alkenyl and aryl;

wherein when any $R_5$, $R_6$, $R_7$ and/or $R_8$ group is $C_1$-$C_{12}$ alkyl or $C_2$-$C_{12}$ alkenyl, then each $R_5$, $R_6$, $R_7$ and/or $R_8$ group is optionally substituted by one or more substituents independently selected from cyano, hydroxy, $C_1$-$C_{10}$ alkoxy, $C_3$-$C_8$ cycloalkyl, heterocyclyl, aryl and a group of the formula —(OCH$_2$CH$_2$)$_z$—OR$_{12}$, wherein z is 1, 2, 3, 4, 5 or 6 and $R_{12}$ is $C_1$-$C_4$ alkyl;

and wherein any aryl group present in $R_5$, $R_6$, $R_7$ and/or $R_8$ is optionally substituted by one or more substituents independently selected from $C_1$-$C_4$ alkyl, $C_1$-$C_4$ alkoxy, cyano, hydroxy, fluoro, chloro, trifluoromethyl and trifluoromethoxy;

wherein in the units B (when present) at least one of the $R_5$, $R_6$, $R_7$ and $R_8$ groups is substituted by one or more cyano groups.

Suitably, in the units of B, $R_5$, $R_6$, $R_7$ and $R_8$ are each independently selected from $C_1$-$C_{12}$ alkyl, wherein the $C_1$-$C_{12}$ alkyl group is optionally substituted by one or more substituents independently selected from cyano, hydroxy, $C_1$-$C_{10}$ alkoxy, $C_3$-$C_8$ cycloalkyl, heterocyclyl, aryl and a group of the formula —(OCH$_2$CH$_2$)$_z$—OR$_{12}$, wherein z is 1, 2, 3, 4, 5 or 6 and $R_{12}$ is $C_1$-$C_4$ alkyl;

and wherein any aryl group present in $R_5$, $R_6$, $R_7$ and/or $R_8$ is optionally substituted by one or more substituents independently selected from $C_1$-$C_4$ alkyl, $C_1$-$C_4$ alkoxy, cyano, hydroxy, fluoro, chloro, trifluoromethyl and trifluoromethoxy;

wherein in the units B (when present) at least one of the $R_5$, $R_6$, $R_7$ and $R_8$ groups is substituted by one or more cyano groups.

Suitably, in the units of B, $R_5$, $R_6$, $R_7$ and $R_8$ are each independently selected from $C_1$-$C_{12}$ alkyl (such as $C_6$-$C_7$ alkyl), wherein at least one of the $C_1$-$C_{12}$ alkyl (such as $C_6$-$C_7$ alkyl) groups is substituted by one or more cyano groups.

Suitably, in the units of B, $R_5$, $R_6$, $R_7$ and $R_8$ are each independently selected from $C_1$-$C_{12}$ alkyl, substituted by one or more cyano groups.

Suitably, in the units of B, $R_5$, $R_6$, $R_7$ and $R_8$ are each independently selected from $C_6$-$C_{10}$ alkyl (such as $C_6$-$C_7$ alkyl), wherein at least one of the $C_6$-$C_{10}$ alkyl (such as $C_6$-$C_7$ alkyl) groups is substituted by one or more cyano groups.

Suitably, in the units of B, $R_5$, $R_6$, $R_7$ and $R_8$ are each independently selected from $C_6$-$C_{10}$ alkyl (such as $C_6$-$C_7$ alkyl), substituted by one or more cyano groups.

It is preferred (particularly when the semiconducting polymer is a copolymer) in the units of B that the groups $R_5$, $R_6$, $R_7$ and $R_8$ are all the same. For example, preferably $R_5$, $R_6$, $R_7$ and $R_8$ are all the same and represent a $C_1$-$C_{12}$ alkyl group substituted by one or more cyano groups. More preferably, $R_5$, $R_6$, $R_7$ and $R_8$ are all the same and represent a $C_6$-$C_{10}$ alkyl, such as $C_6$-$C_7$ alkyl, group substituted by one or more cyano groups.

In the units of B, p represents 0, 1, 2 or 3, q represents 0, 1 or 2 and r represents 0, 1, 2 or 3. Suitably, p represents 0 or 1, q represents 0 or 1 and r represents 0 or 1. More suitably, p, q and r all represent 0.

When p is 0 then there are no $R_9$ substituents on the phenyl ring such that the phenyl ring has hydrogens at the unsubstituted positions. When q is 0 then there are no $R_{10}$ substituents on the phenyl ring such that the phenyl ring has hydrogens at the unsubstituted positions. When r is 0 then there are no $R_{11}$ substituents on the phenyl ring such that the phenyl ring has hydrogens at the unsubstituted positions.

When p is 1 for example then there is one $R_9$ substituent on the phenyl ring and two hydrogens at the other unsubstituted positions. In this case, the $R_9$ substituent may be located at any of the available locations on the phenyl ring. When q is 1 for example then there is one $R_{10}$ substituent on the phenyl ring and two hydrogens at the other unsubstituted positions. In this case, the $R_{10}$ substituent may be located at any of the available locations on the phenyl ring. When r is 1 for example then there is one $R_{11}$ substituent on the phenyl ring and two hydrogens at the other unsubstituted positions. In this case, the $R_{11}$ substituent may be located at any of the available locations on the phenyl ring. The same considerations apply when p and r are each 2 or 3 and when q is 2.

In the units of B when p, q and/or r represent 1, 2 or 3, each of $R_9$, $R_{10}$ and $R_{11}$ is independently selected from $C_1$-$C_6$ alkyl and $C_1$-$C_4$ alkoxy, particularly from $C_1$-$C_3$ alkyl and $C_1$-$C_2$ alkoxy.

The semiconducting polymer which is comprised in the semiconducting composition of the first aspect of the invention may be a copolymer, for example a copolymer comprising units of A and/or B and further comprising units of A', B', C, D and/or E (especially units of A', B' and/or C):

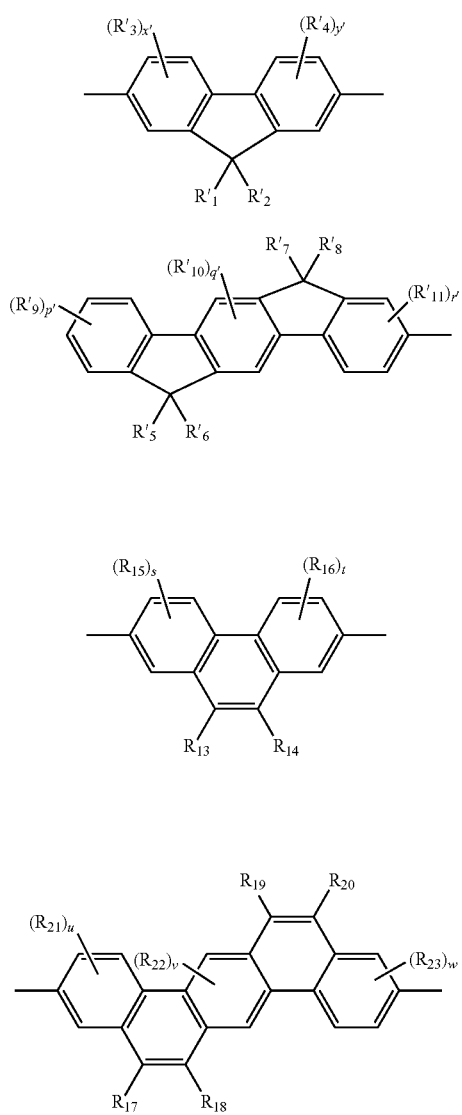

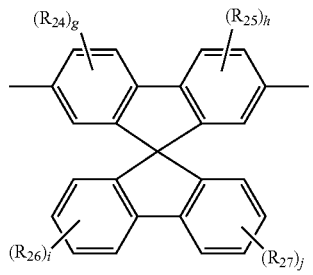

wherein $R'_1$, $R'_2$, $R'_5$, $R'_6$, $R'_7$, $R'_8$, $R_{13}$, $R_{14}$, $R_{17}$, $R_{18}$, $R_{19}$ and/or $R_{20}$ are each independently selected from $C_1$-$C_{12}$ alkyl, $C_2$-$C_{12}$ alkenyl and aryl;

wherein when any $R'_1$, $R'_2$, $R'_5$, $R'_6$, $R'_7$, $R'_8$, $R_{13}$, $R_{14}$, $R_{17}$, $R_{18}$, $R_{19}$ and/or $R_{20}$ group is $C_1$-$C_{12}$ alkyl or $C_2$-$C_{12}$ alkenyl, then each $R'_1$, $R'_2$, $R'_5$, $R'_6$, $R'_7$, $R'_8$, $R_{13}$, $R_{14}$, $R_{17}$, $R_{18}$, $R_{19}$ and/or $R_{20}$ group is optionally substituted by one or more substituents independently selected from cyano, hydroxy, $C_1$-$C_{10}$ alkoxy, $C_3$-$C_8$ cycloalkyl, heterocyclyl, aryl and a group of the formula —$(OCH_2CH_2)_{z'}$—$OR_{28}$, wherein z' is 1, 2, 3, 4, 5 or 6 and $R_{28}$ is $C_1$-$C_4$ alkyl;

and wherein any aryl group present in $R'_1$, $R'_2$, $R'_5$, $R'_6$, $R'_7$, $R'_8$, $R_{13}$, $R_{14}$, $R_{17}$, $R_{18}$, $R_{19}$ and/or $R_{20}$ is optionally substituted by one or more substituents independently selected from $C_1$-$C_4$ alkyl, $C_1$-$C_4$ alkoxy, cyano, hydroxy, fluoro, chloro, trifluoromethyl and trifluoromethoxy;

x' represents 0, 1, 2 or 3;
y' represents 0, 1, 2 or 3;
p' represents 0, 1, 2 or 3;
q' represents 0, 1 or 2;
r' represents 0, 1, 2 or 3;
s represents 0, 1, 2 or 3;
t represents 0, 1, 2 or 3;
u represents 0, 1, 2 or 3;
v represents 0, 1 or 2;
w represents 0, 1, 2 or 3;
g represents 0, 1, 2 or 3;
h represents 0, 1, 2 or 3;
i represents 0, 1, 2, 3 or 4;
j represents 0, 1, 2, 3 or 4;

wherein each $R'_3$, $R'_4$, $R'_9$, $R'_{10}$, $R'_{11}$, $R_{15}$, $R_{16}$, $R_{21}$, $R_{22}$, $R_{23}$, $R_{24}$, $R_{25}$, $R_{26}$ and $R_{27}$ (when present) is independently selected from $C_1$-$C_6$ alkyl and $C_1$-$C_4$ alkoxy.

The semiconducting polymer which is comprised in the semiconducting composition of the first aspect of the invention may be a copolymer, for example a copolymer comprising units of A and/or B and further comprising units of A', B', C, D and/or E (especially units of A', B' and/or C):

wherein $R'_1$, $R'_2$, $R'_5$, $R'_6$, $R'_7$, $R'_8$, $R_{13}$, $R_{14}$, $R_{17}$, $R_{18}$, $R_{19}$ and/or $R_{20}$ are each independently selected from $C_1$-$C_{12}$ alkyl, wherein each $C_1$-$C_{12}$ alkyl group is optionally substituted by one or more substituents independently selected from cyano, hydroxy, $C_1$-$C_{10}$ alkoxy, $C_3$-$C_8$ cycloalkyl, heterocyclyl, aryl and a group of the formula —$(OCH_2CH_2)_{z'}$—$OR_{28}$, wherein z' is 1, 2, 3, 4, 5 or 6 and $R_{28}$ is $C_1$-$C_4$ alkyl;

and wherein any aryl group present in $R'_1$, $R'_2$, $R'_5$, $R'_6$, $R'_7$, $R'_8$, $R_{13}$, $R_{14}$, $R_{17}$, $R_{18}$, $R_{19}$ and/or $R_{20}$ is optionally substituted by one or more substituents independently selected from $C_1$-$C_4$ alkyl, $C_1$-$C_4$ alkoxy, cyano, hydroxy, fluoro, chloro, trifluoromethyl and trifluoromethoxy;

x' represents 0 or 1 (such as 0);
y' represents 0 or 1 (such as 0);
p' represents 0 or 1 (such as 0);
q' represents 0 or 1 (such as 0);
r' represents 0 or 1 (such as 0);
s represents 0 or 1 (such as 0);
t represents 0 or 1 (such as 0);
u represents 0 or 1 (such as 0);
v represents 0 or 1 (such as 0);
w represents 0 or 1 (such as 0);
g represents 0 or 1 (such as 0);
h represents 0 or 1 (such as 0);
i represents 0 or 1 (such as 0);
j represents 0 or 1 (such as 0);

wherein each $R'_3$, $R'_4$, $R'_9$, $R'_{10}$, $R'_{11}$, $R_{15}$, $R_{16}$, $R_{21}$, $R_{22}$, $R_{23}$, $R_{24}$, $R_{25}$, $R_{26}$ and $R_{27}$ (when present) is independently selected from $C_1$-$C_6$ alkyl and $C_1$-$C_4$ alkoxy.

In the units of A', $R'_1$ and $R'_2$ are each independently selected from $C_1$-$C_{12}$ alkyl, $C_2$-$C_{12}$ alkenyl and aryl;
  wherein when any $R'_1$ and/or $R'_2$ group is $C_1$-$C_{12}$ alkyl or $C_2$-$C_{12}$ alkenyl, then each $R'_1$ and/or $R'_2$ group is optionally substituted by one or more substituents independently selected from cyano, hydroxy, $C_1$-$C_{10}$ alkoxy, $C_3$-$C_8$ cycloalkyl, heterocyclyl, aryl and a group of the formula —$(OCH_2CH_2)_{z'}$—$OR_{28}$, wherein z' is 1, 2, 3, 4, 5 or 6 and $R_{28}$ is $C_1$-$C_4$ alkyl;
  and wherein any aryl group present in $R'_1$ and/or $R'_2$ is optionally substituted by one or more substituents independently selected from $C_1$-$C_4$ alkyl, $C_1$-$C_4$ alkoxy, cyano, hydroxy, fluoro, chloro, trifluoromethyl and trifluoromethoxy.

Suitably, in the units of A', $R'_1$ and $R'_2$ are each independently selected from $C_1$-$C_{12}$ alkyl, wherein each $C_1$-$C_{12}$ alkyl group is optionally substituted by one or more substituents independently selected from cyano, hydroxy, $C_1$-$C_{10}$ alkoxy, $C_3$-$C_8$ cycloalkyl, heterocyclyl, aryl and a group of the formula —$(OCH_2CH_2)_{z'}$—$OR_{28}$, wherein z' is 1, 2, 3, 4, 5 or 6 and $R_{28}$ is $C_1$-$C_4$ alkyl;
  and wherein any aryl group present in $R'_1$ and/or $R'_2$ is optionally substituted by one or more substituents independently selected from $C_1$-$C_4$ alkyl, $C_1$-$C_4$ alkoxy, cyano, hydroxy, fluoro, chloro, trifluoromethyl and trifluoromethoxy.

Suitably, in the units of A', $R'_1$ and $R'_2$ are each independently selected from $C_1$-$C_{12}$ alkyl, wherein each $C_1$-$C_{12}$ alkyl group is optionally substituted by one or more substituents of the formula —$(OCH_2CH_2)_{z'}$—$OR_{28}$, wherein z' is 1, 2, 3, 4, 5 or 6 and $R_{28}$ is $C_1$-$C_4$ alkyl.

Suitably, in the units of A', $R'_1$ and $R'_2$ are each independently selected from an unsubstituted $C_1$-$C_{12}$ alkyl group, particularly an unsubstituted $C_{10}$-$C_{12}$ alkyl group.

Preferably, in the units of A', the groups $R'_1$ and $R'_2$ are the same.

In the units of A', x' represents 0, 1, 2 or 3 and y' represents 0, 1, 2 or 3. Suitably, in the units of A', x' represents 0 or 1 and y' represents 0 or 1. More suitably, in the units of A', x' and y' both represent 0.

In the units of A', each of the groups $R'_3$ and $R'_4$ (when present) is independently selected from $C_1$-$C_6$ alkyl and $C_1$-$C_4$ alkoxy, suitably $C_1$-$C_3$ alkyl and $C_1$-$C_2$ alkoxy.

In the units of B', $R'_5$, $R'_6$, $R'_7$ and $R'_8$ are each independently selected from $C_1$-$C_{12}$ alkyl, $C_2$-$C_{12}$ alkenyl and aryl;
  wherein when any $R'_5$, $R'_6$, $R'_7$ and $R'_8$ group is $C_1$-$C_{12}$ alkyl or $C_2$-$C_{12}$ alkenyl, then each $R'_5$, $R'_6$, $R'_7$ and $R'_8$ group is optionally substituted by one or more substituents independently selected from cyano, hydroxy, $C_1$-$C_{10}$ alkoxy, $C_3$-$C_8$ cycloalkyl, heterocyclyl, aryl and a group of the formula —$(OCH_2CH_2)_{z'}$—$OR_{28}$, wherein z' is 1, 2, 3, 4, 5 or 6 and $R_{28}$ is $C_1$-$C_4$ alkyl;
  and wherein any aryl group present in $R'_5$, $R'_6$, $R'_7$ and/or $R'_8$ is optionally substituted by one or more substituents independently selected from $C_1$-$C_4$ alkyl, $C_1$-$C_4$ alkoxy, cyano, hydroxy, fluoro, chloro, trifluoromethyl and trifluoromethoxy.

In the units of B', $R'_5$, $R'_6$, $R'_7$ and $R'_8$ are each independently selected from $C_1$-$C_{12}$ alkyl, wherein each $C_1$-$C_{12}$ alkyl group is optionally substituted by one or more substituents independently selected from cyano, hydroxy, $C_1$-$C_{10}$ alkoxy, $C_3$-$C_8$ cycloalkyl, heterocyclyl, aryl and a group of the formula —$(OCH_2CH_2)_{z'}$—$OR_{28}$, wherein z' is 1, 2, 3, 4, 5 or 6 and $R_{28}$ is $C_1$-$C_4$ alkyl;
  and wherein any aryl group present in $R'_5$, $R'_6$, $R'_7$ and/or $R'_8$ is optionally substituted by one or more substituents independently selected from $C_1$-$C_4$ alkyl, $C_1$-$C_4$ alkoxy, cyano, hydroxy, fluoro, chloro, trifluoromethyl and trifluoromethoxy.

Suitably, in the units of B', $R'_5$, $R'_6$, $R'_7$ and $R'_8$ are each independently selected from $C_1$-$C_{12}$ alkyl, wherein each $C_1$-$C_{12}$ alkyl group is optionally substituted by one or more substituents of the formula —$(OCH_2CH_2)_{z'}$—$OR_{28}$, wherein z' is 1, 2, 3, 4, 5 or 6 and $R_{28}$ is $C_1$-$C_4$ alkyl.

In the units of B', $R'_5$, $R'_6$, $R'_7$ and $R'_8$ are each independently selected from an unsubstituted $C_1$-$C_{12}$ (for example $C_7$-$C_9$) alkyl group.

Preferably, in the units of B', the groups $R'_5$, $R'_6$, $R'_7$ and $R'_8$ are all the same.

In the units of B', p' represents 0, 1, 2 or 3, q' represents 0, 1 or 2 and r' represents 0, 1, 2 or 3. Suitably, in the units of B', p' represents 0 or 1, q' represents 0 or 1 and r' represents 0 or 1. More suitably, in the units of B', p', q' and r' all represent 0.

In the units of B', each of the groups $R'_9$, $R'_{10}$ and $R'_{11}$ (when present) is independently selected from $C_1$-$C_6$ alkyl and $C_1$-$C_4$ alkoxy, suitably $C_1$-$C_3$ alkyl and $C_1$-$C_2$ alkoxy.

In the units of C, $R_{13}$ and $R_{14}$ are each independently selected from $C_1$-$C_{12}$ alkyl, $C_2$-$C_{12}$ alkenyl and aryl;
  wherein when any $R_{13}$ and $R_{14}$ group is $C_1$-$C_{12}$ alkyl or $C_2$-$C_{12}$ alkenyl, then each $R_{13}$ and/or $R_{14}$ group is optionally substituted by one or more substituents independently selected from cyano, hydroxy, $C_1$-$C_{10}$ alkoxy, $C_3$-$C_8$ cycloalkyl, heterocyclyl, aryl and a group of the formula —$(OCH_2CH_2)_{z'}$—$OR_{28}$, wherein z' is 1, 2, 3, 4, 5 or 6 and $R_{28}$ is $C_1$-$C_4$ alkyl;
  and wherein any aryl group present in $R_{13}$ and $R_{14}$ is optionally substituted by one or more substituents independently selected from $C_1$-$C_4$ alkyl, $C_1$-$C_4$ alkoxy, cyano, hydroxy, fluoro, chloro, trifluoromethyl and trifluoromethoxy.

Suitably, in the units of C, $R_{13}$ and $R_{14}$ are each independently selected from $C_1$-$C_{12}$ alkyl, wherein each $C_1$-$C_{12}$ alkyl group is optionally substituted by one or more substituents independently selected from cyano, hydroxy, $C_1$-$C_{10}$ alkoxy, $C_3$-$C_8$ cycloalkyl, heterocyclyl, aryl and a group of the formula —$(OCH_2CH_2)_{z'}$—$OR_{28}$, wherein z' is 1, 2, 3, 4, 5 or 6 and $R_{28}$ is $C_1$-$C_4$ alkyl;
  and wherein any aryl group present in $R_{13}$ and $R_{14}$ is optionally substituted by one or more substituents independently selected from $C_1$-$C_4$ alkyl, $C_1$-$C_4$ alkoxy, cyano, hydroxy, fluoro, chloro, trifluoromethyl and trifluoromethoxy.

Suitably, in the units of C, $R_{13}$ and $R_{14}$ are each independently selected from $C_1$-$C_{12}$ alkyl, wherein each $C_1$-$C_{12}$ alkyl group is optionally substituted by one or more substituents of the formula —$(OCH_2CH_2)_{z'}$—$OR_{28}$, wherein $z'$ is 1, 2, 3, 4, 5 or 6 and $R_{28}$ is $C_1$-$C_4$ alkyl.

Suitably, in the units of C, $R_{13}$ and $R_{14}$ are each independently selected from an unsubstituted $C_1$-$C_{12}$ (for example $C_7$-$C_9$) alkyl group. More suitably, in the units of C, $R_{13}$ and $R_{14}$ are each independently selected from an unsubstituted $C_6$-$C_{12}$ alkyl group.

Preferably, in the units of C, the groups $R_{13}$ and $R_{14}$ are the same.

In the units of C, s represents 0, 1, 2 or 3 and t represents 0, 1, 2 or 3. Suitably, in the units of C, s represents 0 or 1 and t represents 0 or 1. More suitably, in the units of C, s and t both represent 0.

In the units of C, each of the groups $R_{15}$ and $R_{16}$ (when present) is independently selected from $C_1$-$C_6$ alkyl and $C_1$-$C_4$ alkoxy, suitably $C_1$-$C_3$ alkyl and $C_1$-$C_2$ alkoxy.

In the units of D, $R_{17}$, $R_{18}$, $R_{19}$ and $R_{20}$ are each independently selected from $C_1$-$C_{12}$ alkyl, $C_2$-$C_{12}$ alkenyl and aryl;

wherein when any $R_{17}$, $R_{18}$, $R_{19}$ and/or $R_{20}$ group is $C_1$-$C_{12}$ alkyl or $C_2$-$C_{12}$ alkenyl, then each $R_{17}$, $R_{18}$, $R_{19}$ and/or $R_{20}$ group is optionally substituted by one or more substituents independently selected from cyano, hydroxy, $C_1$-$C_{10}$ alkoxy, $C_3$-$C_8$ cycloalkyl, heterocyclyl, aryl and a group of the formula —$(OCH_2CH_2)_{z'}$—$OR_{28}$, wherein $z'$ is 1, 2, 3, 4, 5 or 6 and $R_{28}$ is $C_1$-$C_4$ alkyl;

and wherein any aryl group present in $R_{17}$, $R_{18}$, $R_{19}$ and/or $R_{20}$ is optionally substituted by one or more substituents independently selected from $C_1$-$C_4$ alkyl, $C_1$-$C_4$ alkoxy, cyano, hydroxy, fluoro, chloro, trifluoromethyl and trifluoromethoxy.

Suitably, in the units of D, $R_{17}$, $R_{18}$, $R_{19}$ and $R_{20}$ are each independently selected from $C_1$-$C_{12}$ alkyl, wherein each $C_1$-$C_{12}$ alkyl group is optionally substituted by one or more substituents independently selected from cyano, hydroxy, $C_1$-$C_{10}$ alkoxy, $C_3$-$C_8$ cycloalkyl, heterocyclyl, aryl and a group of the formula —$(OCH_2CH_2)_{z'}$—$OR_{28}$, wherein $z'$ is 1, 2, 3, 4, 5 or 6 and $R_{28}$ is $C_1$-$C_4$ alkyl;

and wherein any aryl group present in $R_{17}$, $R_{18}$, $R_{19}$ and/or $R_{20}$ is optionally substituted by one or more substituents independently selected from $C_1$-$C_4$ alkyl, $C_1$-$C_4$ alkoxy, cyano, hydroxy, fluoro, chloro, trifluoromethyl and trifluoromethoxy.

Suitably, in the units of D, $R_{17}$, $R_{18}$, $R_{19}$ and $R_{20}$ are each independently selected from $C_1$-$C_{12}$ alkyl, wherein each $C_1$-$C_{12}$ alkyl group is optionally substituted by one or more substituents of the formula —$(OCH_2CH_2)_{z'}$—$OR_{28}$, wherein $z'$ is 1, 2, 3, 4, 5 or 6 and $R_{28}$ is $C_1$-$C_4$ alkyl.

Suitably, in the units of D, $R_{17}$, $R_{18}$, $R_{19}$ and $R_{20}$ are each independently selected from an unsubstituted $C_1$-$C_{12}$ alkyl group. More suitably, in the units of D, $R_{17}$, $R_{18}$, $R_{19}$ and/or $R_{20}$ are each independently selected from an unsubstituted $C_6$-$C_{12}$ alkyl group.

Suitably, in the units of D, the groups $R_{17}$, $R_{18}$, $R_{19}$ and $R_{20}$ are all the same.

In the units of D, u represents 0, 1, 2 or 3, v represents 0, 1 or 2 and w represents 0, 1, 2 or 3. Suitably, in the units of D, u represents 0 or 1, v represents 0 or 1 and w represents 0 or 1. More suitably, in the units of D, u, v and w all represent 0.

In the units of D, each of the groups $R_{21}$, $R_{22}$ and $R_{23}$ (when present) is independently selected from $C_1$-$C_6$ alkyl and $C_1$-$C_4$ alkoxy, suitably $C_1$-$C_3$ alkyl and $C_1$-$C_2$ alkoxy.

In the units of E, g represents 0, 1, 2 or 3, h represents 0, 1, 2 or 3, i represents 0, 1, 2, 3 or 4 and j represents 0, 1, 2, 3 or 4. Suitably, in the units of E, g represents 0 or 1, h represents 0 or 1, i represents 0 or 1 and j represents 0 or 1. More suitably, in the units of E, g, h, i and j all represent 0.

In the units of E, each of the groups $R_{24}$, $R_{25}$, $R_{26}$ and $R_{27}$ (when present) is independently selected from $C_1$-$C_6$ alkyl and $C_1$-$C_4$ alkoxy, suitably $C_1$-$C_3$ alkyl and $C_1$-$C_2$ alkoxy.

The groups $R'_3$, $R'_4$, $R'_9$, $R'_{10}$, $R'_{11}$, $R_{15}$, $R_{16}$, $R_{21}$, $R_{22}$, $R_{23}$, $R_{24}$, $R_{25}$, $R_{26}$ and $R_{27}$ (which are optional) may be located at any available ring position when present, as discussed above in relation to the groups $R_3$, $R_4$, $R_9$, $R_{10}$ and $R_{11}$.

The semiconducting polymer which is comprised in the semiconducting composition of the first aspect of the invention may be a homopolymer comprising units of A, wherein $R_1$ and $R_2$ are each independently selected from $C_1$-$C_{12}$ alkyl, wherein the $C_1$-$C_{12}$ alkyl is optionally substituted by one or more substituents independently selected from cyano, hydroxyl, $C_1$-$C_{10}$ alkoxy, $C_3$-$C_8$ cycloalkyl, heterocyclyl, aryl and —$(OCH_2CH_2)_z$—$OR_{12}$, wherein z is 1, 2, 3, 4, 5 or 6 and $R_{12}$ is $C_1$-$C_4$ alkyl;

wherein at least one of the $R_1$ and/or $R_2$ groups is substituted by one or more cyano groups;

wherein x represents 0, 1, 2 or 3 and y represents 0, 1, 2 or 3; and wherein each $R_3$ and $R_4$ (when present) is independently selected from $C_1$-$C_6$ alkyl and $C_1$-$C_4$ alkoxy.

Suitably, the semiconducting polymer which is comprised in the semiconducting composition of the first aspect of the invention may be a copolymer comprising units of A and units of A', B', C, D and/or E (especially units of A', B' or C). For example, the semiconducting polymer may be a copolymer comprising units of A and units of A'. For example, the semiconducting polymer may be a copolymer comprising units of A and units of B'. For example, the semiconducting polymer may be a copolymer comprising units of A and units of C. For example, the semiconducting polymer may be a copolymer comprising units of A and units of D. For example, the semiconducting polymer may be a copolymer comprising units of A and units of E.

The semiconducting polymer which is comprised in the semiconducting composition of the first aspect of the invention may be a copolymer comprising units of B and units of A', B', C, D and/or E (especially units of A', B' or C). For example, the semiconducting polymer may be a copolymer comprising units of B and units of B'. For example, the semiconducting polymer may be a copolymer comprising units of B and units of A'. For example, the semiconducting polymer may be a copolymer comprising units of B and units of C. For example, the semiconducting polymer may be a copolymer comprising units of B and units of D. For example, the semiconducting polymer may be a copolymer comprising units of B and units of E.

When the semiconducting polymer which is comprised in the semiconducting composition of the first aspect of the invention is a copolymer, it may consist essentially of (or consist of) units of A and units of A', B', C, D or E (especially A', B' or C). Suitably, the semiconducting polymer may be an alternating copolymer which consists essentially of (or consists of) units of A and units of A', B' or C. In other words, the semiconducting polymer may be a copolymer consisting essentially of (or consisting of) alternating A and A', B' or C units. Suitably, the semiconducting polymer may be a random copolymer which consists essentially of (or consists of) units of A and units of A', B' or C.

When the semiconducting polymer which is comprised in the semiconducting composition of the first aspect of the invention is a copolymer, it may consist essentially of (or consist of) units of A and A'. Suitably, the semiconducting polymer may be an alternating copolymer which consists essentially of (or consists of) units of A and A'. In other words, the semiconducting polymer may be a copolymer consisting essentially of (or consisting of) alternating A and A' units. Suitably, the semiconducting polymer may be a random copolymer which consists essentially of (or consists of) units of A and A'.

When the semiconducting polymer which is comprised in the semiconducting composition of the first aspect of the invention is a copolymer, it may consist essentially of (or consist of) units of A and B'. Suitably, the semiconducting polymer may be an alternating copolymer which consists essentially of (or consists of) units of A and B'. In other words, the semiconducting polymer may be a copolymer consisting essentially of (or consisting of) alternating A and B' units. Suitably, the semiconducting polymer may be a random copolymer which consists essentially of (or consists of) units of A and B'.

When the semiconducting polymer which is comprised in the semiconducting composition of the first aspect of the invention is a copolymer, it may consist essentially of (or consist of) units of A and C. Suitably, the semiconducting polymer may be an alternating copolymer which consists essentially of (or consists of) units of A and C. In other words, the semiconducting polymer may be a copolymer consisting essentially of (or consisting of) alternating A and C units. Suitably, the semiconducting polymer may be a random copolymer which consists essentially of (or consists of) units of A and C.

The semiconducting polymer which is comprised in the semiconducting composition of the first aspect of the invention may be a copolymer comprising at least 20%, for example at least 30%, particularly at least 50%, monomeric A and/or A', B', C, D or E (especially A', B' or C) units. For example, the semiconducting polymer which is comprised in the semiconducting composition of the first aspect of the invention may be a copolymer comprising 50% monomeric A units and 50% monomeric A', B' or C units, which copolymer may be an alternating copolymer.

The semiconducting polymer which is comprised in the semiconducting composition of the first aspect of the invention may be a copolymer comprising at least 20%, for example at least 30%, particularly at least 50%, monomeric A and A' units. For example, the semiconducting polymer which is comprised in the semiconducting composition of the first aspect of the invention may be a copolymer comprising 50% monomeric A units and 50% monomeric A' units, which copolymer may be an alternating copolymer.

The semiconducting polymer which is comprised in the semiconducting composition of the first aspect of the invention may be a copolymer comprising at least 20%, for example at least 30%, particularly at least 50%, monomeric A and B' units.

The semiconducting polymer which is comprised in the semiconducting composition of the first aspect of the invention may be a copolymer comprising at least 20%, for example at least 30%, particularly at least 50%, monomeric A and C units.

The semiconducting polymer which is comprised in the semiconducting composition of the first aspect of the invention may be a copolymer comprising units of A and units of A', wherein $R_1$ and $R_2$ are each independently selected from $C_1$-$C_{12}$ alkyl, wherein the $C_1$-$C_{12}$ alkyl is optionally substituted by one or more substituents independently selected from cyano, hydroxyl, $C_1$-$C_{10}$ alkoxy, $C_3$-$C_8$ cycloalkyl, heterocyclyl, aryl and —$(OCH_2CH_2)_z$—$OR_{12}$, wherein z is 1, 2, 3, 4, 5 or 6 and $R_{12}$ is $C_1$-$C_4$ alkyl;

and wherein any aryl group present in $R_1$ and/or $R_2$ is optionally substituted by one or more substituents independently selected from $C_1$-$C_4$ alkyl, $C_1$-$C_4$ alkoxy, cyano, hydroxy, fluoro, chloro, trifluoromethyl and trifluoromethoxy;

wherein at least one of the $R_1$ and/or $R_2$ groups is substituted by one or more cyano groups;

wherein x represents 0, 1, 2 or 3 and y represents 0, 1, 2 or 3;

wherein each $R_3$ and $R_4$ (when present) is independently selected from $C_1$-$C_6$ alkyl and $C_1$-$C_4$ alkoxy;

wherein $R'_1$ and $R'_2$ are each independently selected from $C_1$-$C_2$ alkyl, wherein the $C_1$-$C_{12}$ alkyl is optionally substituted by one or more substituents independently selected from cyano, hydroxy, $C_1$-$C_{10}$ alkoxy, $C_3$-$C_8$ cycloalkyl, heterocyclyl, aryl and a group of the formula —$(OCH_2CH_2)_z$—$OR_{28}$, wherein z' is 1, 2, 3, 4, 5 or 6 and $R_{28}$ is $C_1$-$C_4$ alkyl;

and wherein any aryl group present in R', and/or $R'_2$ is optionally substituted by one or more substituents independently selected from $C_1$-$C_4$ alkyl, $C_1$-$C_4$ alkoxy, cyano, hydroxy, fluoro, chloro, trifluoromethyl and trifluoromethoxy;

wherein x' represents 0, 1, 2 or 3 and y' represents 0, 1, 2 or 3;

and wherein each $R'_3$ and $R'_4$ (when present) is independently selected from $C_1$-$C_6$ alkyl and $C_1$-$C_4$ alkoxy.

The semiconducting polymer which is comprised in the semiconducting composition of the first aspect of the invention may be a copolymer comprising units of A and units of A', wherein $R_1$ and $R_2$ are each independently selected from $C_1$-$C_{12}$ alkyl, wherein the $C_1$-$C_{12}$ alkyl is optionally substituted by one or more substituents independently selected from cyano, hydroxyl, $C_1$-$C_{10}$ alkoxy, $C_3$-$C_8$ cycloalkyl, heterocyclyl, aryl and —$(OCH_2CH_2)_z$—$OR_{12}$, wherein z is 1, 2, 3, 4, 5 or 6 and $R_{12}$ is $C_1$-$C_4$ alkyl;

and wherein any aryl group present in $R_1$ and/or $R_2$ is optionally substituted by one or more substituents independently selected from $C_1$-$C_4$ alkyl, $C_1$-$C_4$ alkoxy, cyano, hydroxy, fluoro, chloro, trifluoromethyl and trifluoromethoxy;

wherein at least one of the $R_1$ and/or $R_2$ groups is substituted by one or more cyano groups;

wherein x represents 0, 1, 2 or 3 and y represents 0, 1, 2 or 3;

wherein each $R_3$ and $R_4$ (when present) is independently selected from $C_1$-$C_6$ alkyl and $C_1$-$C_4$ alkoxy;

wherein $R'_1$ and $R'_2$ are each independently selected from $C_1$-$C_{12}$ alkyl, wherein the $C_1$-$C_{12}$ alkyl is optionally substituted by one or more substituents of the formula —$(OCH_2CH_2)_z$—$OR_{28}$, wherein z' is 1, 2, 3, 4, 5 or 6 and $R_{28}$ is $C_1$-$C_4$ alkyl;

wherein x' represents 0, 1, 2 or 3 and y' represents 0, 1, 2 or 3;

and wherein each $R'_3$ and $R'_4$ (when present) is independently selected from $C_1$-$C_6$ alkyl and $C_1$-$C_4$ alkoxy.

The semiconducting polymer which is comprised in the semiconducting composition of the first aspect of the invention may be a copolymer comprising units of A and units of A', wherein $R_1$ and $R_2$ are each independently selected from $C_1$-$C_{12}$ alkyl, wherein the $C_1$-$C_{12}$ alkyl group is substituted by one or more cyano groups;

wherein x represents 0 and y represents 0;
wherein R'$_1$ and R'$_2$ are each independently selected from $C_1$-$C_{12}$ alkyl, wherein the $C_1$-$C_{12}$ alkyl is optionally substituted by one or more substituents independently selected from cyano, hydroxy, $C_1$-$C_{10}$ alkoxy, $C_3$-$C_8$ cycloalkyl, heterocyclyl, aryl and a group of the formula —(OCH$_2$CH$_2$)$_{z'}$—OR$_{28}$, wherein z' is 1, 2, 3, 4, 5 or 6 and $R_{28}$ is $C_1$-$C_4$ alkyl;
and wherein any aryl group present in R'$_1$ and/or R'$_2$ is optionally substituted by one or more substituents independently selected from $C_1$-$C_4$ alkyl, $C_1$-$C_4$ alkoxy, cyano, hydroxy, fluoro, chloro, trifluoromethyl and trifluoromethoxy; and
wherein x' represents 0 and y' represents 0.

The semiconducting polymer which is comprised in the semiconducting composition of the first aspect of the invention may be a copolymer comprising units of A and units of B',
wherein $R_1$ and $R_2$ are each independently selected from $C_1$-$C_{12}$ alkyl, wherein the $C_1$-$C_{12}$ alkyl is optionally substituted by one or more substituents independently selected from cyano, hydroxyl, $C_1$-$C_{10}$ alkoxy, $C_3$-$C_8$ cycloalkyl, heterocyclyl, aryl and —(OCH$_2$CH$_2$)$_z$—OR$_{12}$, wherein z is 1, 2, 3, 4, 5 or 6 and $R_{12}$ is $C_1$-$C_4$ alkyl;
and wherein any aryl group present in $R_1$ and/or $R_2$ is optionally substituted by one or more substituents independently selected from $C_1$-$C_4$ alkyl, $C_1$-$C_4$ alkoxy, cyano, hydroxy, fluoro, chloro, trifluoromethyl and trifluoromethoxy;
wherein at least one of the $R_1$ and/or $R_2$ groups is substituted by one or more cyano groups;
wherein x represents 0, 1, 2 or 3 and y represents 0, 1, 2 or 3;
wherein each $R_3$ and $R_4$ (when present) is independently selected from $C_1$-$C_6$ alkyl and $C_1$-$C_4$ alkoxy;
wherein R'$_5$, R'$_6$, R'$_7$ and R'$_8$ are each independently selected from an unsubstituted $C_1$-$C_{12}$ alkyl group,
p' represents 0 or 1 (such as 1);
q' represents 0 or 1 (such as 1);
r' represents 0 or 1 (such as 1);
wherein each of R'$_9$, R'$_{10}$ and R'$_{11}$ (when present) is independently selected from $C_1$-$C_6$ alkyl and $C_1$-$C_4$ alkoxy.

The semiconducting polymer which is comprised in the semiconducting composition of the first aspect of the invention may be a copolymer comprising units of A and units of B',
wherein $R_1$ and $R_2$ are each independently selected from $C_1$-$C_{12}$ alkyl, wherein the $C_1$-$C_{12}$ alkyl is optionally substituted by one or more substituents independently selected from cyano, hydroxyl, $C_1$-$C_{10}$ alkoxy, $C_3$-$C_8$ cycloalkyl, heterocyclyl, aryl and —(OCH$_2$CH$_2$)$_z$—OR$_{12}$, wherein z is 1, 2, 3, 4, 5 or 6 and $R_{12}$ is $C_1$-$C_4$ alkyl;
and wherein any aryl group present in $R_1$ and/or $R_2$ is optionally substituted by one or more substituents independently selected from $C_1$-$C_4$ alkyl, $C_1$-$C_4$ alkoxy, cyano, hydroxy, fluoro, chloro, trifluoromethyl and trifluoromethoxy;
wherein at least one of the $R_1$ and/or $R_2$ groups is substituted by one or more cyano groups;
wherein x represents 0, 1, 2 or 3 and y represents 0, 1, 2 or 3;
wherein each $R_3$ and $R_4$ (when present) is independently selected from $C_1$-$C_6$ alkyl and $C_1$-$C_4$ alkoxy;
wherein R'$_5$, R'$_6$, R'$_7$ and R'$_8$ are each independently selected from an unsubstituted $C_1$-$C_{12}$ alkyl group,
p' represents 0 or 1 (such as 1);
q' represents 0 or 1 (such as 1);
r' represents 0 or 1 (such as 1);
wherein each of R'$_9$, R'$_{10}$ and R'$_{11}$ (when present) is independently selected from $C_1$-$C_6$ alkyl and $C_1$-$C_4$ alkoxy.

The semiconducting polymer which is comprised in the semiconducting composition of the first aspect of the invention may be a copolymer comprising units of A and units of B',
wherein $R_1$ and $R_2$ are each independently selected from $C_1$-$C_{12}$ alkyl, wherein the $C_1$-$C_{12}$ alkyl group is substituted by one or more cyano groups;
wherein x represents 0 and y represents 0;
wherein R'$_5$, R'$_6$, R'$_7$ and R'$_8$ are each independently selected from an unsubstituted $C_1$-$C_2$ alkyl group,
p' represents 0 or 1 (such as 1);
q' represents 0 or 1 (such as 1);
r' represents 0 or 1 (such as 1);
wherein each of R'$_9$, R'$_{10}$ and R'$_n$(when present) is independently selected from $C_1$-$C_6$ alkyl and $C_1$-$C_4$ alkoxy.

The semiconducting polymer which is comprised in the semiconducting composition of the first aspect of the invention may be a copolymer comprising units of A and units of C,
wherein $R_1$ and $R_2$ are each independently selected from $C_1$-$C_{12}$ alkyl, wherein the $C_1$-$C_{12}$ alkyl is optionally substituted by one or more substituents independently selected from cyano, hydroxyl, $C_1$-$C_{10}$ alkoxy, $C_3$-$C_8$ cycloalkyl, heterocyclyl, aryl and —(OCH$_2$CH$_2$)$_z$—OR$_{12}$, wherein z is 1, 2, 3, 4, 5 or 6 and $R_{12}$ is $C_1$-$C_4$ alkyl;
and wherein any aryl group present in $R_1$ and/or $R_2$ is optionally substituted by one or more substituents independently selected from $C_1$-$C_4$ alkyl, $C_1$-$C_4$ alkoxy, cyano, hydroxy, fluoro, chloro, trifluoromethyl and trifluoromethoxy;
wherein at least one of the $R_1$ and/or $R_2$ groups is substituted by one or more cyano groups;
wherein x represents 0, 1, 2 or 3 and y represents 0, 1, 2 or 3;
wherein each $R_3$ and $R_4$ (when present) is independently selected from $C_1$-$C_6$ alkyl and $C_1$-$C_4$ alkoxy;
wherein $R_{13}$ and $R_{14}$ are each independently selected from $C_1$-$C_{12}$ alkyl, wherein the $C_1$-$C_2$ alkyl group is optionally substituted by one or more substituents independently selected from cyano, hydroxy, $C_1$-$C_{10}$ alkoxy, $C_3$-$C_8$ cycloalkyl, heterocyclyl, aryl and a group of the formula —(OCH$_2$CH$_2$)$_{z'}$—OR$_{28}$, wherein z' is 1, 2, 3, 4, 5 or 6 and $R_{28}$ is $C_1$-$C_4$ alkyl;
and wherein any aryl group present in $R_{13}$ and $R_{14}$ is optionally substituted by one or more substituents independently selected from $C_1$-$C_4$ alkyl, $C_1$-$C_4$ alkoxy, cyano, hydroxy, fluoro, chloro, trifluoromethyl and trifluoromethoxy;
s represents 0, 1, 2 or 3;
t represents 0, 1, 2 or 3;
wherein each $R_{15}$ and $R_{16}$ (when present) is independently selected from $C_1$-$C_6$ alkyl and $C_1$-$C_4$ alkoxy.

The semiconducting polymer which is comprised in the semiconducting composition of the first aspect of the invention may be a copolymer comprising units of A and units of C,
wherein $R_1$ and $R_2$ are each independently selected from $C_1$-$C_{12}$ alkyl, wherein the $C_1$-$C_{12}$ alkyl is optionally substituted by one or more substituents independently selected from cyano, hydroxyl, $C_1$-$C_{10}$ alkoxy, $C_3$-$C_8$ cycloalkyl, heterocyclyl, aryl and —$(OCH_2CH_2)_z$—$OR_{12}$, wherein z is 1, 2, 3, 4, 5 or 6 and $R_{12}$ is $C_1$-$C_4$ alkyl;

and wherein any aryl group present in $R_1$ and/or $R_2$ is optionally substituted by one or more substituents independently selected from $C_1$-$C_4$ alkyl, $C_1$-$C_4$ alkoxy, cyano, hydroxy, fluoro, chloro, trifluoromethyl and trifluoromethoxy;

wherein at least one of the $R_1$ and/or $R_2$ groups is substituted by one or more cyano groups;

wherein x represents 0 and y represents 0;

wherein $R_{13}$ and $R_{14}$ are each independently selected from $C_1$-$C_{12}$ alkyl, wherein the $C_1$-$C_{12}$ alkyl group is optionally substituted by one or more substituents independently selected from cyano, hydroxy, $C_1$-$C_{10}$ alkoxy, $C_3$-$C_8$ cycloalkyl, heterocyclyl, aryl and a group of the formula —$(OCH_2CH_2)_{z'}$—$OR_{28}$, wherein z' is 1, 2, 3, 4, 5 or 6 and $R_{28}$ is $C_1$-$C_4$ alkyl;

and wherein any aryl group present in $R_{13}$ and $R_{14}$ is optionally substituted by one or more substituents independently selected from $C_1$-$C_4$ alkyl, $C_1$-$C_4$ alkoxy, cyano, hydroxy, fluoro, chloro, trifluoromethyl and trifluoromethoxy; and s represents 0 and t represents 0.

In particular, the semiconducting polymer which is comprised in the semiconducting composition of the first aspect of the invention may be:

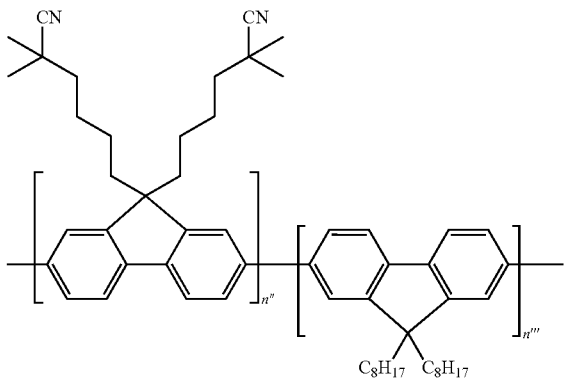

wherein n" and n'" are each an integer greater than 3 (preferably greater than 6, more preferably greater than 12) and wherein n" and n'" may be the same or different.

In particular, the semiconducting polymer which is comprised in the semiconducting composition of the first aspect of the invention may be:

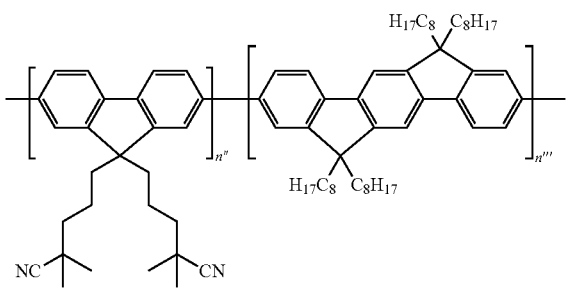

wherein n" and n'" are each an integer greater than 3 (preferably greater than 6, more preferably greater than 12) and wherein n" and n'" may be the same or different.

In particular, the semiconducting polymer which is comprised in the semiconducting composition of the first aspect of the invention may be:

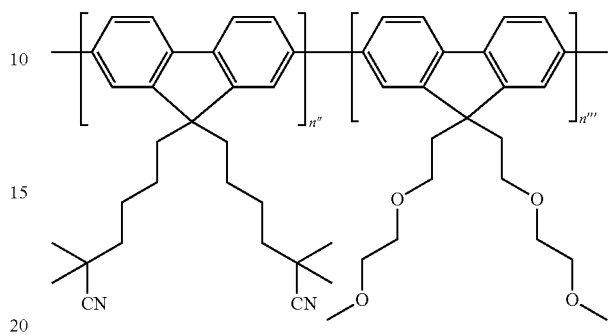

wherein n" and n'" are each an integer greater than 3 (preferably greater than 6, more preferably greater than 12) and wherein n" and n'" may be the same or different.

In particular, the semiconducting polymer which is comprised in the semiconducting composition of the first aspect of the invention may be:

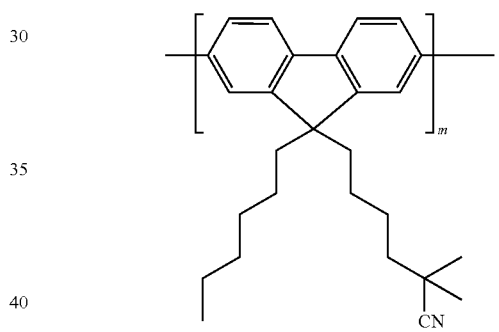

wherein m is an integer greater than 3 (preferably greater than 6, more preferably greater than 12.

In particular, the semiconducting polymer which is comprised in the semiconducting composition of the first aspect of the invention may be:

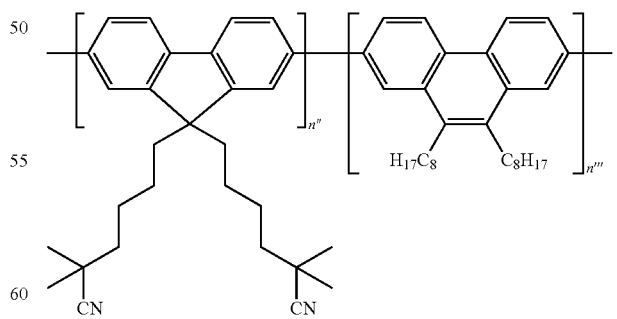

wherein n" and n'" are each an integer greater than 3 (preferably greater than 6, more preferably greater than 12) and wherein n" and n'" may be the same or different.

Suitably, the semiconducting polymer which is comprised in the semiconducting composition of the first aspect of the invention may comprise 9,9-bis(5-cyano-5-methylhexyl) fluorene units and, optionally, 9,9-dioctyl-9H-fluorene units. More suitably, the semiconducting polymer may comprise 9,9-bis(5-cyano-5-methylhexyl)fluorene units and 9,9-dioctyl-9H-fluorene units. For example, the semiconducting polymer may be a 9,9-bis(5-cyano-5-methylhexyl)fluorene: 9,9-dioctyl-9H-fluorene copolymer, such as a 30:70 9,9-bis (5-cyano-5-methylhexyl)fluorene:9,9-dioctyl-9H-fluorene copolymer or a 50:50 9,9-bis(5-cyano-5-methylhexyl)fluorene:9,9-dioctyl-9H-fluorene copolymer. Preferably, the semiconducting polymer may be a 30:70 9,9-bis(5-cyano-5-methylhexyl)fluorene:9,9-dioctyl-9H-fluorene random copolymer or a 50:50 9,9-bis(5-cyano-5-methylhexyl)fluorene:9,9-dioctyl-9H-fluorene alternating copolymer.

Suitably, the semiconducting polymer which is comprised in the semiconducting composition of the first aspect of the invention may comprise 9,9-bis(4-cyano-4-methylpentyl) fluorene units and, optionally, 9,9-dioctyl-9H-fluorene units. More suitably, the semiconducting polymer may comprise 9,9-bis(4-cyano-4-methylpentyl)fluorene units and 9,9-dioctyl-9H-fluorene units. For example, the semiconducting polymer may be a 9,9-bis(4-cyano-4-methylpentyl)fluorene: 9,9-dioctyl-9H-fluorene copolymer, such as a 30:70 9,9-bis (4-cyano-4-methylpentyl)fluorene:9,9-dioctyl-9H-fluorene copolymer or a 50:50 9,9-bis(4-cyano-4-methylpentyl)fluorene:9,9-dioctyl-9H-fluorene copolymer. Preferably, the semiconducting polymer may be a 30:70 9,9-bis(4-cyano-4-methylpentyl)fluorene:9,9-dioctyl-9H-fluorene random copolymer or a 50:50 9,9-bis(4-cyano-4-methylpentyl)fluorene:9,9-dioctyl-9H-fluorene alternating copolymer.

Suitably, the semiconducting polymer which is comprised in the semiconducting composition of the first aspect of the invention may comprise 9,9-bis(5-cyano-5-methylhexyl) fluorene units and, optionally, 9,10-dioctylphenanthrene units. More suitably, the semiconducting polymer may comprise 9,9-bis(5-cyano-5-methylhexyl)fluorene units and 9,10-dioctylphenanthrene units. For example, the semiconducting polymer may be a 9,9-bis(5-cyano-5-methylhexyl) fluorene:9,10-dioctylphenanthrene copolymer, such as a 30:70 9,9-bis(5-cyano-5-methylhexyl)fluorene:9,10-dioctylphenanthrene copolymer or a 50:50 9,9-bis(5-cyano-5-methylhexyl)fluorene:9,10-dioctylphenanthrene copolymer. Preferably, the semiconducting polymer may be a 30:70 9,9-bis(5-cyano-5-methylhexyl)fluorene:9,10-dioctylphenanthrene random copolymer or a 50:50 9,9-bis(5-cyano-5-methylhexyl)fluorene:9,10-dioctylphenanthrene alternating copolymer.

Suitably, the semiconducting polymer which is comprised in the semiconducting composition of the first aspect of the invention may comprise 9,9-bis(4-cyano-4-methylpentyl) fluorene units and, optionally, 6,6,12,12-tetraoctyl-6,12-dihydroindeno[1,2-b]fluorene units. More suitably, the semiconducting polymer may comprise 9,9-bis(4-cyano-4-methylpentyl)fluorene units and 6,6,12,12-tetraoctyl-6,12-dihydroindeno[1,2-b]fluorene units. For example, the semiconducting polymer may be a 9,9-bis(4-cyano-4-methylpentyl)fluorene:6,6,12,12-tetraoctyl-6,12-dihydroindeno[1,2-b]fluorene copolymer, such as a 50:50 9,9-bis(4-cyano-4-methylpentyl)fluorene:6,6,12,12-tetraoctyl-6,12-dihydroindeno[1,2-b]fluorene copolymer. Preferably, the semiconducting polymer may be a 50:50 9,9-bis(4-cyano-4-methylpentyl)fluorene:6,6,12,12-tetraoctyl-6,12-dihydroindeno[1,2-b]fluorene random copolymer.

Suitably, the semiconducting polymer which is comprised in the semiconducting composition of the first aspect of the invention may comprise 9,9-bis(5-cyano-5-methylhexyl) fluorene units and, optionally, 9,9-bis[2-(2-methoxyethoxy) ethyl]-9H-fluorene units. More suitably, the semiconducting polymer may comprise 9,9-bis(5-cyano-5-methylhexyl) fluorene units and 9,9-bis[2-(2-methoxyethoxy)ethyl]-9H-fluorene units. For example, the semiconducting polymer may be a 9,9-bis(5-cyano-5-methylhexyl)fluorene:9,9-bis [2-(2-methoxyethoxy)ethyl]-9H-fluorene copolymer, such as a 50:50 9,9-bis(5-cyano-5-methylhexyl)fluorene:9,9-bis [2-(2-methoxyethoxy)ethyl]-9H-fluorene copolymer. Preferably, the semiconducting polymer may be a 50:50 9,9-bis (5-cyano-5-methylhexyl)fluorene:9,9-bis[2-(2-methoxyethoxy)ethyl]-9H-fluorene random copolymer.

Suitably, the semiconducting polymer which is comprised in the semiconducting composition of the first aspect of the invention may comprise 9-hexyl-9-(5-cyano-5-methylhexyl))fluorene units. For example, the semiconducting polymer may be a 9-hexyl-9-(5-cyano-5-methylhexyl))fluorene homopolymer.

The semiconducting polymer may be prepared using any suitable chemical process, as would be known to persons skilled in the art, so as to form the desired polymer, such as the desired homopolymer or copolymer. General methods are, for example, described in *Advances in Polymer Science,* 212:Polyfluorenes (Springer) p 275 to 278—general methods of polyfluorene synthesis, *Polymer Chemistry* 1990, 28, 2, 367-383, WO 1999/032537 and *Macromolecular Rapid Communications* 2009, 30, 653-687 and discussed below.

A method of forming a semiconducting polymer which is comprised in the semiconducting composition of the first aspect of the invention comprises polymerising sources of units of A and/or sources of units of B. For example, when the semiconducting polymer is a homopolymer, the method may comprise polymerising sources of the units of A or sources of the units of B. When the semiconducting polymer is a copolymer, the method may comprise copolymerising sources of the units of A and sources of additional units, such as sources of the units of B, A', B', C, D and/or E. When the semiconducting polymer is a copolymer, the method may comprise copolymerising sources of the units of B and sources of additional units, such as sources of the units of A, A', B', C, D and/or E. When the semiconducting polymer is a copolymer, the method may comprise copolymerising sources of the units of A and sources of additional units, such as sources of different A units. When the semiconducting polymer is a copolymer, the method may comprise copolymerising sources of the units of B and sources of additional units, such as sources of different B units. The units of A, B, A', B', C, D and/or E may of course be individual units and/or blocks of the units of A, B, A', B', C, D and/or E.

The polymerisation reaction by which the semiconducting polymer may be prepared may be terminated by any suitable method. For example, the polymerisation reaction may be terminated by a method in which one or more of the monomeric reactants are completely used up in the reaction, so that the reaction ends. Alternatively, the polymerisation reaction may be terminated by a method in which a monofunctional reagent is added which results in chain ends devoid of functional groups so as to prevent further reaction. The semiconducting polymer which is comprised in the semiconducting composition of the first aspect of the invention can be terminated by any suitable end group, as would be appreciated by persons skilled in the art. The nature of the end groups depends on the method by which the polymer is formed and the reagents used.

Sources of units of A and A' include compounds (or monomers) of the formula A'' and A''':

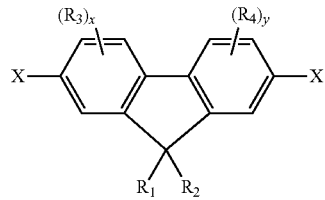

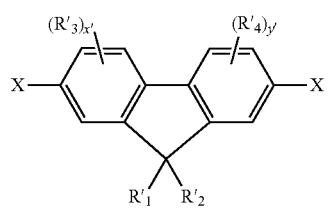

wherein $R_1$, $R_2$, $R_3$, $R_4$, $R'_1$, $R'_2$, $R'_3$, $R'_4$, x, y, x' and y' are as defined herein and X is a suitable leaving group, such as halo (for example bromo), boronic acid or a boronic ester group.

Sources of units of B and B' include compounds (or monomers) of the formula B'' and B''':

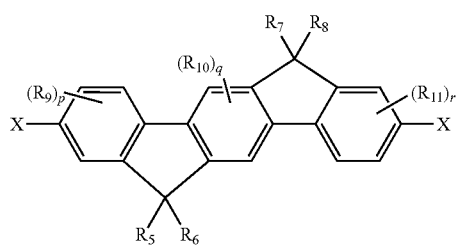

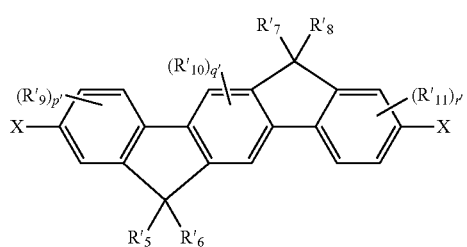

wherein $R_5$, $R_6$, $R_7$, $R_8$, $R'_5$, $R'_6$, $R'_7$, $R'_8$, $R_9$, $R_{10}$, $R_{11}$, $R'_9$, $R'_{10}$, $R'_{11}$, p, q, r, p', q' and r' are as defined herein and X is a suitable leaving group, such as halo (for example bromo), boronic acid or a boronic ester group.

Sources of the units C, D and E include compounds (or monomers) of the formula C', D' and E':

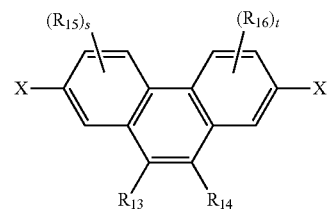

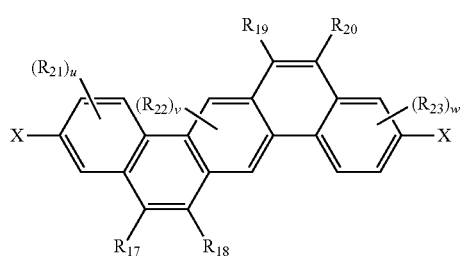

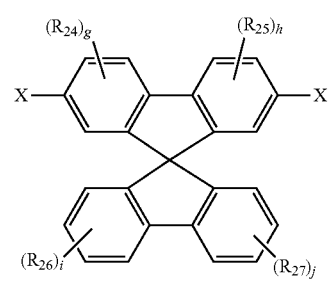

wherein $R_{13}$, $R_{14}$, $R_{17}$, $R_{18}$, $R_{19}$, $R_{20}$, S, t, u, v, w, g, h, i, j, $R_{15}$, $R_{16}$, $R_{21}$, $R_{22}$, $R_{23}$, $R_{24}$, $R_{25}$, $R_{26}$ and $R_{27}$ are as defined herein and X is a suitable leaving group, such as halo (for example bromo), boronic acid or a boronic ester group.

Compounds of the formulae A'', A''', B'', B''', C', D' and/or E' may be polymerised using methods known in the art, for example as described in *Advances in Polymer Science*, 212:Polyfluorenes (Springer), pages 275 to 278.

For example, the polymerisation reaction may be conducted in the presence of a nickel catalyst (including Yamamoto type polymerisation), which involves the cross coupling of halo terminated monomeric units. For this polymerisation, suitable leaving groups would be reactive halo groups such as chloro, bromo or iodo. This method is suitable for preparing both homopolymers and random copolymers. Where copolymers are required, the stoichiometry of the compounds of the formulae A'', A''', B'', B''', C', D' and/or E' being reacted can be varied so as to provide the desired copolymer. An example of a suitable nickel catalysed polymer synthesis is described in *Polymer Chemistry* 1990, 28, 2, 367-383 and WO 1999/032537.

The polymerisation reaction may be conducted by means of a Suzuki polymerisation reaction, which is typically a palladium catalysed cross coupling reaction between compounds wherein the leaving group is boronic acid or a boronic ester and compounds wherein the leaving group is a halo group. If two compounds used in this polymerisation reaction have the same core structure but are present as a mixture of boronic acid (or boronic ester) terminated compounds/monomers and halo terminated compounds/monomers then a homopolymer will result. If the two compounds/monomers are different then a 50:50 copolymer will result. The ratio of repeat units in a copolymer prepared by means of a Suzuki polymerisation reaction can be controlled by the use of a ternary monomer mixture, for example using a single compound/monomer A" having halo leaving groups mixed with two compounds/monomers B" where the first B" compound/monomer comprises halo leaving groups and the second B" compound/monomer comprises boronic acid (or boronic ester) leaving groups. This combination typically yields a copolymer containing <50% A units. If desired a polymer with >50% A units could be prepared through the use of two A type units. Suzuki polymerisation is described in *Macromolecular Rapid Communications* 2009, 30, 653-687. As well known in the art, in addition to the monomeric reagents, Suzuki polymerisation reactions comprise a base such as tripotassium phosphate ($K_3PO_4$), a catalyst (typically an inorganic or organometallic palladium containing species, and optionally a ligand for the catalyst) and one or more suitable solvents. An example of a suitable catalyst for use in a Suzuki polymerisation is tris(dibenzylideneacetone) dipalladium(0).

Alternatively, a compound of the formula A" and B" wherein X represents hydrogen may be polymerised by means of a C—C coupling reaction using an iron (III) chloride catalyst.

Compounds of the formula A", A'", B", B'", C', D' and E' are either commercially available or have syntheses described in the art.

The compounds of formula A" and A'" can be prepared using methods known in the art. For example, the compounds of formula A" and A'" wherein the leaving group X is a halo group can be prepared by alkylation of a halogenated fluorene compound such as 2,7-dibromofluorene or 2,7-dichlorofluorene. 2,7-dibromofluorene and 2,7-dichlorofluorene are commercially available. The alkylation may be conducted using an appropriate alkyl halide and a suitable base, such as KOH, NaOH, NaOtBu or KOtBu. Suitable solvents for this reaction include dipolar aprotic solvents, such as dimethyl sulfoxide (DMSO) or N-methylpyrrolidinone (NMP), and tetrahydrofuran. Suitable alkylation reactions are discussed in *Journal of Fluorine Chemistry* 2015, 178, 195-200, *Polymer Chemistry* 2015, 6, 28, 5070-5076 and *Journal of Applied Polymer Science*, 2014, 131, 19, 40878/1-40878/8, WO 97/33323 and U.S. Pat. No. 6,169,163.

For example, 2,7-dibromo-9,9-bis(5-cyano-5-methylhexylfluorene) can be prepared from 2,7-dibromofluorene as follows:

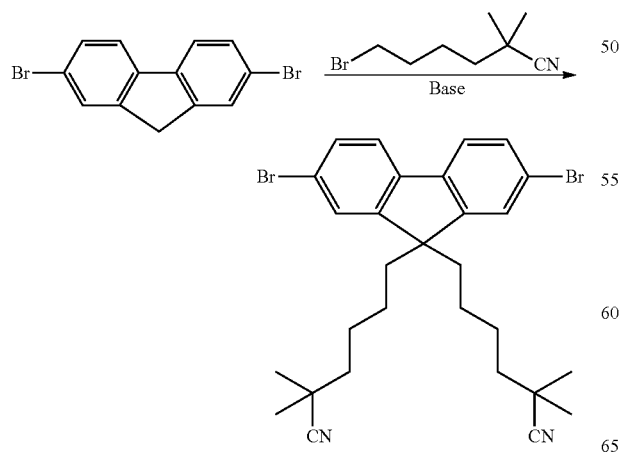

wherein the base is KOH, NaOH, NaOtBu or KOtBu.

Alternatively, a compound of the formula A" and B" wherein X represents hydrogen may be prepared using methods known in the art. For example, the compounds of formula A" wherein the group X is hydrogen can be prepared by alkylation of fluorene (which is commercially available). The alkylation may be conducted using an appropriate alkyl halide and a suitable base, such as n-butyl lithium, in a suitable solvent such as tetrahydrofuran.

Compounds of formula A" and A'" wherein the leaving group X is a diboronic acid or diboronic ester derivative can be prepared from the corresponding dihalo compounds using methods well known in the art (for example a Suzuki-Miyaura borylation reaction), for example as follows:

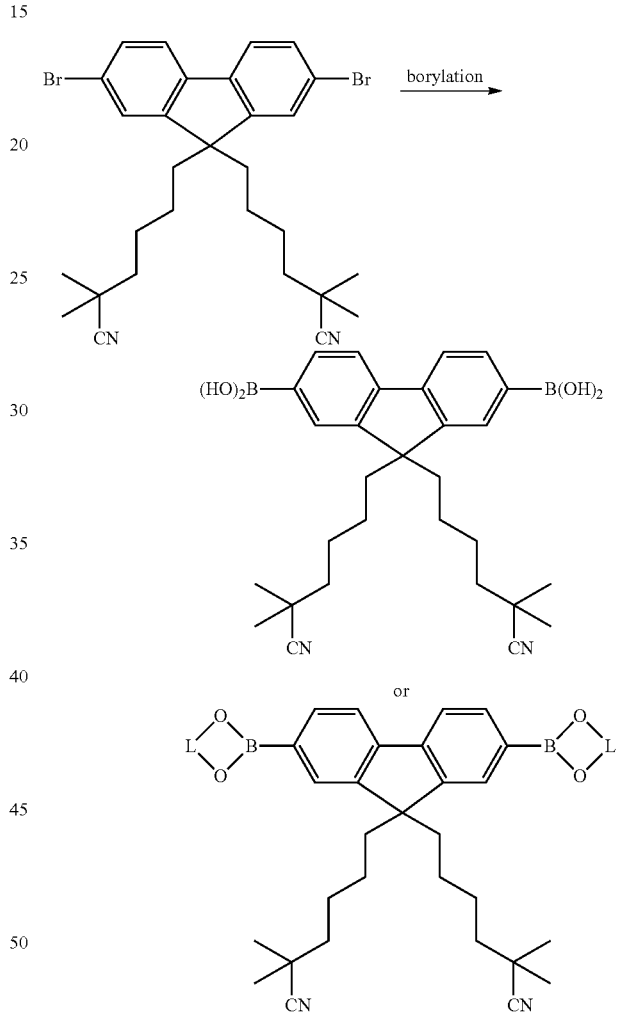

wherein L represents —C(CH$_3$)$_2$—C(CH$_3$)$_2$— or —CH$_2$—C(CH$_3$)$_2$—CH$_2$—. Methods described in *Journal of Medicinal Chemistry* 2006, 49, 15 can be used when it is desired to introduce the groups —CH$_2$CH$_2$CN to the fluorene ring, using a Michael reaction known to persons skilled in the art.

The compounds of formula B" and B'" can be prepared using methods known in the art. For example, the compounds of formula B" and B'" wherein the leaving group X is a bromo group can be prepared by alkylation of indeno[1,2-b]fluorene, followed by bromination at the 2- and 8-positions. The alkylation reaction may be conducted using a suitable alkyl bromide and a base such as KOtBu (see, for example, WO 2007/068326). The bromination reaction may then be conveniently carried out using bromine in the presence of catalytic FeCl$_3$, for example as described in *Journal of Polymer Science Part A: Polymer Chemistry* 2009, 47, 19, 5044-5056. The resulting dibromide may be converted to a boronic acid or ester by standard methodology, if required for the target polymer (see comments above).

Compounds of the formula B'' and B''' bearing substituted alkyl substituents at the 6-position (i.e. comprising at least one CN group) and aryl substituents at the 12-position may be conveniently prepared using the methods described in US 2012/0097938.

Cyano substituted alkyl halides for use in preparing the compounds A'', A''', B'' and B''' as discussed above are commercially available or can be readily synthesised using methods known in the art. For example, dibromoalkanes such as 1,6-dibromohexane can be reacted with sodium cyanide in isopropanol to yield 6-bromohexanenitrile (see *Journal of Labelled Compounds and Radiopharmaceuticals* 2012, 55, 1, 39-43).

α,α'-dialkylcyano substituted alkyl halides may be synthesised by a variety of methods. One convenient method involves the reaction of isobutyronitrile with a chlorobromoalkane to displace at the bromo group, followed by halogen exchange to convert the chloride into a more reactive leaving group for the subsequent fluorene alkylation (see *Journal of Organic Chemistry* 2011, 76, 13, 5198-5206).

Compounds of the formula A''' and B''' may be prepared using the methods described herein for preparing compounds of the formula A'' and B'', provided that appropriate reactants are used.

Compounds of the formula C' having a halo leaving group or in which X represents hydrogen may be prepared as described in WO 2015/015183 and *Journal of Organic Chemistry* 2014, 79, 19, 8960-8967. For example, these compounds can be prepared using an iridium catalysed annulation method.

The semiconducting composition of the first aspect of the invention comprises a semiconducting non-polymeric polycyclic compound, such as a semiconducting non-polymeric organic polycyclic compound, which is an organic semiconductor material (OSC) (also known as a small molecule organic semiconductor).

Preferably, the semiconducting non-polymeric polycyclic compounds according to the present invention have charge carrier mobilities of $10^{-1}$ cm$^2$/Vs or more, more preferably of 0.5 cm$^2$/Vs or more, even more preferably of 2 cm$^2$/Vs or more. Preferably, the semiconducting non-polymeric polycyclic compounds according to the present invention have charge carrier mobilities of less than 100 cm$^2$/Vs. The semiconducting non-polymeric polycyclic compound charge mobility can be determined through field effect transistor measurements on drop cast films or thermally evaporated single crystal films.

Any suitable semiconducting non-polymeric polycyclic compound may be used.

Examples of suitable semiconducting non-polymeric polycyclic compounds include polyacenes. Suitable polyacenes are disclosed in WO 2012/164282. For example, suitable polyacenes may have the formula (I):

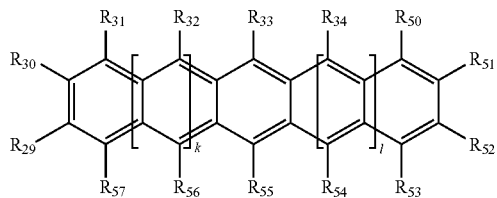

(I)

wherein each of $R_{54}$, $R_{56}$, $R_{32}$ and $R_{34}$ are hydrogen; $R_{55}$ and $R_{33}$ are each —C≡C—SiR$_{35}$R$_{36}$R$_{37}$, wherein R$_{35}$, R$_{36}$ and R$_{37}$ are each independently selected from C$_1$-C$_4$ alkyl, C$_2$-C$_4$ alkenyl and C$_3$-C$_6$ cycloalkyl; R$_{50}$, R$_{51}$, R$_{52}$, R$_{53}$, R$_{57}$, R$_{29}$, R$_{30}$ and R$_{31}$ are each independently selected from hydrogen, C$_1$-C$_4$ alkyl, C$_1$-C$_6$ alkoxy and C$_6$-C$_{12}$ aryloxy; or wherein independently each pair of R$_{51}$ and R$_{52}$ and/or R$_{29}$ and R$_{30}$ may be cross-bridged to form a C$_4$-C$_{10}$ saturated or unsaturated ring, which saturated or unsaturated ring may be intervened by an oxygen atom, a sulfur atom or a group shown by formula —N(R$_{49}$)— (wherein R$_{49}$ is a hydrogen atom, a C$_1$-C$_6$ alkyl group or a C$_1$-C$_{10}$ perfluoroalkyl group; and wherein k and l are independently 0 or 1, preferably both k and l are 1 or both k and l are 0.

Suitably, in compounds of Formula (I), k and l are both 1; R$_{55}$ and R$_{33}$ are —C≡C—SiR$_{35}$R$_{36}$R$_{37}$, wherein R$_{35}$, R$_{36}$ and R$_{37}$ are each independently selected from ethyl, n-propyl, isopropyl, 1-propenyl, 2-propenyl and C$_3$-C$_6$ cycloalkyl; and R$_{50}$, R$_{51}$, R$_{52}$, R$_{53}$, R$_{57}$, R$_{29}$, R$_{30}$ and R$_{31}$ are each independently selected from hydrogen, methyl, ethyl and methoxy.

Suitably, in compounds of Formula (I), k and l are both 0; R$_{55}$ and R$_{33}$ are —C≡C—SiR$_{35}$R$_{36}$R$_{37}$, wherein R$_{35}$, R$_{36}$ and R$_{37}$ are each independently selected from ethyl, n-propyl, isopropyl, 1-propenyl, 2-propenyl and C$_3$-C$_6$ cycloalkyl; R$_{50}$, R$_{53}$, R$_{57}$ and R$_{31}$ are hydrogen; and R$_{51}$ and R$_{52}$ together, and R$_{29}$ and R$_{30}$ together, form 5-membered heterocyclic rings containing 1 or 2 nitrogen atoms, 1 or 2 sulfur atoms or 1 or 2 oxygen atoms, wherein the heterocyclic rings may be optionally substituted, for example by C$_1$-C$_6$ alkyl and halo.

Especially preferred polyacene compounds according to the present invention are those of Formulae (II) and (III):

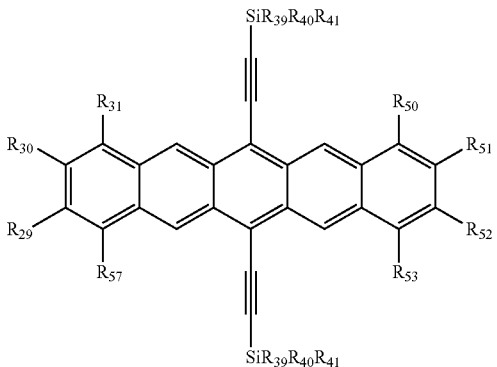

(II)

wherein R$_{50}$, R$_{53}$, R$_{57}$ and R$_{31}$ are each independently selected from hydrogen, C$_1$-C$_6$ alkyl and C$_1$-C$_6$ alkoxy (preferably R$_{50}$, R$_{53}$, R$_{57}$ and R$_{31}$ are each independently selected from hydrogen, methyl, ethyl, propyl, n-butyl, isobutyl, t-butyl, methoxy, ethoxy, propyloxy and butyloxy, more preferably hydrogen, methyl, propyl and methoxy);

$R_{51}$, $R_{52}$, $R_{29}$ and $R_{30}$ are each independently selected from hydrogen, $C_1$-$C_6$ alkyl and $C_1$-$C_6$ alkoxy, or each pair of $R_{51}$ and $R_{52}$ and/or $R_{29}$ and $R_{30}$, are cross-bridged to form a $C_4$-$C_{10}$ saturated or unsaturated ring, which saturated or unsaturated ring may be intervened by an oxygen atom, a sulfur atom or a group shown by formula —N($R_{38}$)— (wherein $R_{38}$ is hydrogen or $C_1$-$C_{10}$ alkyl); and wherein one or more of the carbon atoms of the polyacene skeleton may optionally be substituted by a heteroatom selected from N, P, As, O, S, Se and Te (preferably, $R_{51}$, $R_{52}$, $R_{29}$ and $R_{30}$ are each independently selected from hydrogen, methyl, ethyl, propyl, n-butyl, isobutyl, t-butyl, methoxy, ethoxy, propyloxy and butyloxy, more preferably hydrogen, methyl, ethyl, propyl and methoxy); and $R_{39}$, $R_{40}$ and $R_{41}$ are each independently selected from $C_1$-$C_6$ alkyl and $C_2$-$C_6$ alkenyl (preferably $R_{39}$, $R_{40}$ and $R_{41}$ are each independently selected from methyl, ethyl, propyl, isopropyl, n-butyl, isobutyl, t-butyl, 1-propenyl and 2-propenyl, more preferably ethyl, n-propyl and isopropyl);

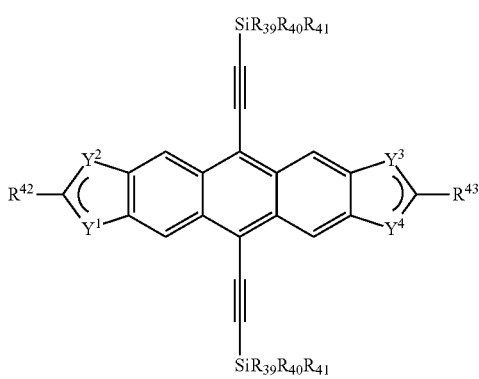

(III)

wherein $R_{39}$, $R_{40}$ and $R_{41}$ are each independently selected from $C_1$-$C_6$ alkyl and $C_2$-$C_6$ alkenyl (preferably $R_{39}$, $R_{40}$ and $R_{41}$ are each independently selected from methyl, ethyl, propyl, isopropyl, n-butyl, isobutyl, t-butyl, 1-propenyl and 2-propenyl, more preferably ethyl, n-propyl and isopropyl);

$R_{42}$ and $R_{43}$ are each independently selected from hydrogen, halogen, cyano, optionally fluorinated or perfluorinated $C_1$-$C_{20}$ alkyl, fluorinated or perfluorinated, $C_1$-$C_{20}$ alkoxy, fluorinated or perfluorinated $C_6$-$C_{30}$ aryl and $CO_2R_{44}$, wherein $R_{44}$ is hydrogen, fluorinated or perfluorinated $C_1$-$C_{20}$ alkyl, or fluorinated or perfluorinated $C_6$-$C_{30}$ aryl (preferably $R_{42}$ and $R_{43}$ are each independently selected from fluorinated or perfluorinated $C_1$-$C_8$ alkyl, fluorinated or perfluorinated $C_1$-$C_8$ alkoxy and $C_6F_5$); and $Y^1$, $Y^2$, $Y^3$ and $Y^4$ are each independently selected from —CH=, =CH—, O, S, Se or $NR_{45}$ (wherein $R_{45}$ is hydrogen or $C_1$-$C_{10}$ alkyl).

In yet another preferred embodiment, the polyacene compounds of the present invention are those of Formulae (IV) and (V):

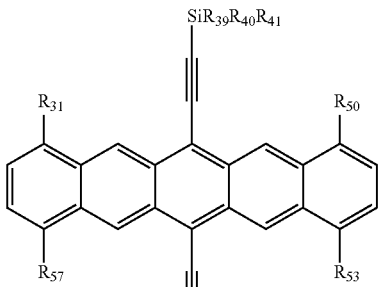

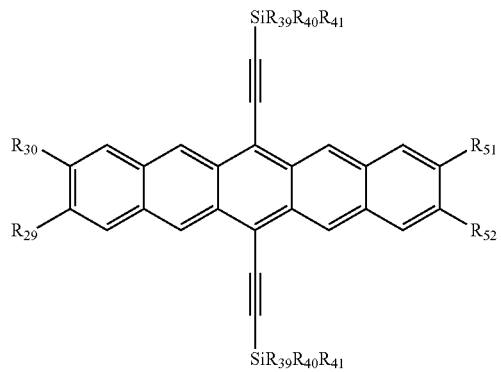

wherein $R_{39}$, $R_{40}$ and $R_{41}$ are each independently selected from methyl, ethyl and isopropyl;

wherein $R_{50}$, $R_{51}$, $R_{52}$, $R_{53}$, $R_{57}$, $R_{29}$, $R_{30}$ and $R_{31}$ are each independently selected from $C_1$-$C_6$ alkyl, $C_1$-$C_6$ alkoxy and $C_6$-$C_{20}$ aryloxy. Preferably $R_{50}$, $R_{51}$, $R_{52}$, $R_{53}$, $R_{57}$, $R_{29}$, $R_{30}$ and $R_{31}$ are each independently selected from methyl, ethyl, propyl, n-butyl, isobutyl, t-butyl, methoxy, ethoxy, propyloxy and butyloxy.

Polyacene compounds may be synthesised by any known method within the common general knowledge of a person skilled in the art. In a preferred embodiment, methods disclosed in US 2003/0116755 A, U.S. Pat. Nos. 3,557,233, 6,690,029 WO 2007/078993, WO 2008/128618 and *Organic Letters*, 2004, Volume 6, number 10, pages 1609-1612 can be employed for the synthesis of polyacene compounds.

Preferably, the polyacene compounds have charge carrier mobilities of $10^{-1}$ cm$^2$/Vs or more, more preferably of 0.5 cm$^2$/Vs or more, even more preferably of 2 cm$^2$/Vs or more. Preferably, the polyacene compounds have charge carrier mobilities of less than 100 cm$^2$/Vs. The polyacene charge mobility can be determined through field effect transistor measurements on drop cast films or thermally evaporated single crystal films.

For example, a suitable polyacene is 1,4,8,11-tetramethyl-6,13-bis(triethylsilylethynyl)pentacene (TMTES).

A further aspect of the invention may provide a semiconducting composition comprising a semiconducting polymer, wherein the semiconducting polymer comprises units of A and/or B as defined herein, and a polyacene. A further aspect of the invention may provide a semiconducting composition comprising a semiconducting polymer, wherein the semiconducting polymer comprises units of A and/or B as defined herein, and 1,4,8,11-tetramethyl-6,13-bis(triethylsilylethynyl)pentacene.

A further aspect of the invention may provide a semiconducting composition comprising a semiconducting polymer, wherein the semiconducting polymer comprises units of A as defined herein, and a polyacene. A further aspect of the invention may provide a semiconducting composition comprising a semiconducting polymer, wherein the semiconducting polymer comprises units of A as defined herein, and 1,4,8,11-tetramethyl-6,13-bis(triethylsilylethynyl)pentacene.

A further aspect of the invention may provide a semiconducting composition comprising a semiconducting polymer, wherein the semiconducting polymer comprises units of B as defined herein, and a polyacene. A further aspect of the invention may provide a semiconducting composition comprising a semiconducting polymer, wherein the semiconducting polymer comprises units of B as defined herein, and 1,4,8,11-tetramethyl-6,13-bis(triethylsilylethynyl)pentacene.

A further aspect of the invention may provide a semiconducting composition comprising a semiconducting polymer, wherein the semiconducting polymer comprises units of A and units of A', B', C, D or E (especially A', B' or C) as defined herein, and a polyacene. A further aspect of the invention may provide a semiconducting composition comprising a semiconducting polymer, wherein the semiconducting polymer comprises units of A and units of A', B', C, D or E (especially A', B' or C) as defined herein, and 1,4,8,11-tetramethyl-6,13-bis(triethylsilylethynyl)pentacene.

A further aspect of the invention may provide a semiconducting composition comprising a semiconducting polymer, wherein the semiconducting polymer comprises 9,9-bis(5-cyano-5-methylhexyl)fluorene units and, optionally, 9,9-dioctyl-9H-fluorene units, and a polyacene, for example 1,4,8,11-tetramethyl-6,13-bis(triethylsilylethynyl)pentacene.

A further aspect of the invention may provide a semiconducting composition comprising a semiconducting polymer, wherein the semiconducting polymer is a 9,9-bis(5-cyano-5-methylhexyl)fluorene:9,9-dioctyl-9H-fluorene copolymer (such as a 30:70 9,9-bis(5-cyano-5-methylhexyl)fluorene:9,9-dioctyl-9H-fluorene copolymer or a 50:50 9,9-bis(5-cyano-5-methylhexyl)fluorene:9,9-dioctyl-9H-fluorene copolymer), and a polyacene, for example 1,4,8,11-tetramethyl-6,13-bis(triethylsilylethynyl)pentacene.

A further aspect of the invention may provide a semiconducting composition comprising a semiconducting polymer, wherein the semiconducting polymer comprises 9,9-bis(4-cyano-4-methylpentyl)fluorene units and, optionally, 9,9-dioctyl-9H-fluorene units, and a polyacene, for example 1,4,8,11-tetramethyl-6,13-bis(triethylsilylethynyl)pentacene.

A further aspect of the invention may provide a semiconducting composition comprising a semiconducting polymer, wherein the semiconducting polymer is a 9,9-bis(4-cyano-4-methylpentyl)fluorene:9,9-dioctyl-9H-fluorene copolymer (such as a 30:70 9,9-bis(4-cyano-4-methylpentyl)fluorene:9,9-dioctyl-9H-fluorene copolymer or a 50:50 9,9-bis(4-cyano-4-methylpentyl)fluorene:9,9-dioctyl-9H-fluorene copolymer), and a polyacene, for example 1,4,8,11-tetramethyl-6,13-bis(triethylsilylethynyl)pentacene.

A further aspect of the invention may provide a semiconducting composition comprising a semiconducting polymer, wherein the semiconducting polymer comprises 9,9-bis(5-cyano-5-methylhexyl)fluorene units and, optionally, 9,10-dioctylphenanthrene units, and a polyacene, for example 1,4,8,11-tetramethyl-6,13-bis(triethylsilylethynyl)pentacene.

A further aspect of the invention may provide a semiconducting composition comprising a semiconducting polymer, wherein the semiconducting polymer is a 9,9-bis(5-cyano-5-methylhexyl)fluorene:9,10-dioctylphenanthrene copolymer (such as a 30:70 9,9-bis(5-cyano-5-methylhexyl)fluorene:9,10-dioctylphenanthrene copolymer or a 50:50 9,9-bis(5-cyano-5-methylhexyl)fluorene:9,10-dioctylphenanthrene copolymer) and a polyacene, for example 1,4,8,11-tetramethyl-6,13-bis(triethylsilylethynyl)pentacene.

A further aspect of the invention may provide a semiconducting composition comprising a semiconducting polymer, wherein the semiconducting polymer comprises 9,9-bis(4-cyano-4-methylpentyl)fluorene units and, optionally, 6,6,12,12-tetraoctyl-6,12-dihydroindeno[1,2-b]fluorene units, and a polyacene, for example 1,4,8,11-tetramethyl-6,13-bis(triethylsilylethynyl)pentacene.

A further aspect of the invention may provide a semiconducting composition comprising a semiconducting polymer, wherein the semiconducting polymer is a 9,9-bis(4-cyano-4-methylpentyl)fluorene:6,6,12,12-tetraoctyl-6,12-dihydroindeno[1,2-b]fluorene copolymer (such as a 30:70 9,9-bis(4-cyano-4-methylpentyl)fluorene:6,6,12,12-tetraoctyl-6,12-dihydroindeno[1,2-b]fluorene copolymer or a 50:50 9,9-bis(4-cyano-4-methylpentyl)fluorene:6,6,12,12-tetraoctyl-6,12-dihydroindeno[1,2-b]fluorene copolymer), and a polyacene, for example 1,4,8,11-tetramethyl-6,13-bis(triethylsilylethynyl)pentacene.

A further aspect of the invention may provide a semiconducting composition comprising a semiconducting polymer, wherein the semiconducting polymer comprises 9,9-bis(5-cyano-5-methylhexyl)fluorene units and, optionally, 9,9-bis[2-(2-methoxyethoxy)ethyl]-9H-fluorene units, and a polyacene, for example 1,4,8,11-tetramethyl-6,13-bis(triethylsilylethynyl)pentacene.

A further aspect of the invention may provide a semiconducting composition comprising a semiconducting polymer, wherein the semiconducting polymer is a 9,9-bis(5-cyano-5-methylhexyl)fluorene:9,9-bis[2-(2-methoxyethoxy)ethyl]-9H-fluorene copolymer (such as a 30:70 9,9-bis(5-cyano-5-methylhexyl)fluorene:9,9-bis[2-(2-methoxyethoxy)ethyl]-9H-fluorene copolymer or a 50:50 9,9-bis(5-cyano-5-methylhexyl)fluorene:9,9-bis[2-(2-methoxyethoxy)ethyl]-9H-fluorene copolymer), and a polyacene, for example 1,4,8,11-tetramethyl-6,13-bis(triethylsilylethynyl)pentacene.

A further aspect of the invention may provide a semiconducting composition comprising a semiconducting polymer, wherein the semiconducting polymer comprises 9-hexyl-9-(5-cyano-5-methylhexyl))fluorene units, and a polyacene, for example 1,4,8,11-tetramethyl-6,13-bis(triethylsilylethynyl)pentacene.

A further aspect of the invention may provide a semiconducting composition comprising a semiconducting polymer, wherein the semiconducting polymer is a 9-hexyl-9-(5-cyano-5-methylhexyl))fluorene homopolymer, and a polyacene, for example 1,4,8,11-tetramethyl-6,13-bis(triethylsilylethynyl)pentacene.

Another example of a suitable polyacene is a bistetracene compound of the formula (VI):

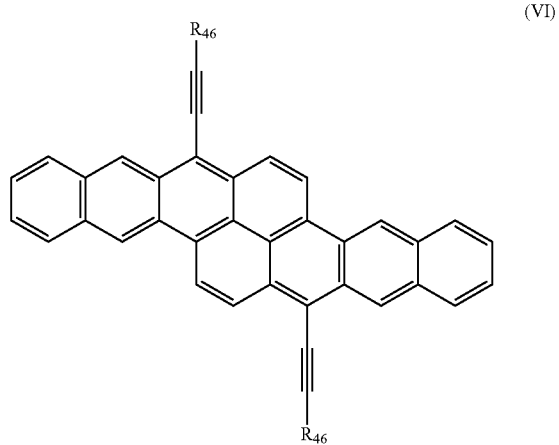

(VI)

wherein each $R_{46}$ represents —Si(CH(CH$_3$)$_2$)$_3$ or —Si(CH(CH$_3$)$_2$)$_2$((CH$_2$)$_7$CH$_3$) as described in L Zhang et al. J. Am. Chem. Soc., 2014, 136, 9248-9251. Further suitable bistetracenes are described in WO 2015/168638.

Another example of a suitable semiconducting non-polymeric polycyclic compound is a compound of the formula (VII):

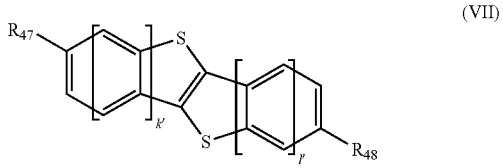

(VII)

wherein $R_{47}$ and $R_{48}$ each independently represent $C_1$-$C_{10}$ alkyl and $C_6$-$C_{12}$ aryl and k' and l' each represent 1 or 2.

Preferred compounds of the formula (VII) include 2,7-dioctyl[1]benzothieno[3,2-b][1]benzothiophene ($C_8$—BTBT) and 2,9-didecyldinaphtho[2,3-b:2',3'-t]thieno[3,2-b]thiophene ($C_{10}$-DNTT).

The semiconducting compositions of the first aspect of the invention may further comprise a suitable solvent.

Any suitable solvent may be used. Examples of suitable solvents include, but are not limited to, organic solvents such as alcohols, ketones, aromatic hydrocarbons, partially saturated aromatic hydrocarbons and fluorinated solvents. Suitably the solvent is selected from the group consisting of $C_6$-$C_{18}$ aromatic hydrocarbons, preferably containing at least one 6 membered aromatic ring, and $C_6$-$C_{18}$ aromatic hydrocarbons substituted with 1 or 2 halogen atoms, and preferably containing at least one 6 membered aromatic ring. Preferably the halogen atoms are independently selected from chlorine or bromine. Suitably the solvent is selected from the group consisting of $C_6$-$C_{18}$ partially saturated aromatic hydrocarbons, preferably containing at least one 6 membered aromatic ring, Preferably, the aromatic hydrocarbon solvent used in the present invention is selected from $C_6$-$C_{18}$ aromatic hydrocarbons, preferably containing at least one 6 membered aromatic ring, $C_6$-$C_{18}$ partially saturated aromatic hydrocarbons, preferably containing at least one 6 membered aromatic ring, and $C_6$-$C_{18}$ aromatic hydrocarbons substituted with 1 halogen atom, and preferably containing at least one 6 membered aromatic ring. Preferably the halogen atoms are independently selected from chlorine or bromine, most preferably bromine Preferably, the aromatic hydrocarbon solvent used in the present invention is a $C_6$-$C_{18}$ aromatic hydrocarbon, preferably containing at least one 6 membered aromatic ring.

Preferably, the aromatic hydrocarbon solvent used in the present invention is selected from the group consisting of tetralin, mesitylene, bromobenzene, bromomesitylene and anisole.

Preferably, the aromatic hydrocarbon has a boiling point of 150° C. or above, and more preferably a boiling point of from 200° C. to 250° C.

The semiconducting compositions of the first aspect of the invention may comprise one or more further solvents, for example selected from aliphatic hydrocarbons, polyols, aliphatic ketones, esters, amines, thiols and mixtures thereof.

Suitable alcohols may be selected from $C_1$-$C_6$ alcohols, preferably $C_2$-$C_4$ alcohols, more preferably $C_3$-$C_4$ secondary alcohols. A suitable alcohol is 2-propanol.

Suitable aliphatic ketones may be selected from $C_3$-$C_8$ straight chain ketones.

Suitable and preferred further solvents include for example, n-hexane, n-octane, isopropanol or methyl ethyl ketone.

Preferably, when present, the further solvent is an aliphatic hydrocarbon, such as a $C_4$-$C_{10}$ aliphatic hydrocarbon, preferably a straight chain $C_6$-$C_9$ aliphatic hydrocarbon.

Preferably, the further solvent has a boiling point of 150° C. or below, preferably of 100° C. or below. Preferably, when the further solvent is an aliphatic hydrocarbon, it has a boiling point of 125° C. or below, preferably of 90° C. or below.

The semiconducting composition of the first aspect of the invention (prior to deposition) may comprise less than 20% by weight, such as less than 10% by weight, preferably less than 5% by weight, of the semiconducting polymer comprising units of A and/or B as defined herein based on a total weight of the composition. For example, the semiconducting compositions of the first aspect of the invention (prior to deposition) may comprise at least 0.1% by weight of a semiconducting polymer comprising units of A and/or B as defined herein based on a total weight of the composition.

The semiconducting compositions of the first aspect of the invention (prior to deposition) may comprise less than 10% by weight, such as less than 5% by weight, preferably less than 2% by weight, of a semiconducting non-polymeric polycyclic compound, based on a total weight of the composition. For example, the semiconducting composition of the first aspect of the invention (prior to deposition) may comprise at least 0.1% by weight of a semiconducting non-polymeric polycyclic compound based on a total weight of the composition.

The semiconducting compositions of the first aspect of the invention (prior to deposition) may comprise a suitable solvent in an amount of greater than 50 wt %, such as between 80 and 99 wt %, preferably between 60 and 95 wt % based on a total weight of the composition.

The semiconducting composition of the first aspect of the invention may further comprise further additional components such as suitable surfactants, lubricating agents, conductive agents, dispersing agents, hydrophobing agents, adhesive agents, flow improvers, defoaming agents, deaerators, diluents, auxiliaries, dyes, pigments, sensitizers, stabilisers, nanoparticles and/or inhibitors.

The semiconducting composition of the first aspect of the invention may be prepared by any suitable method, which methods would be known to persons skilled in the art. For example, the compositions may be prepared by dissolution or dispersion of the semiconducting polymer and the semiconducting non-polymeric polycyclic compound and/or further additional components in a selected suitable solvent or solvent mixture.

The semiconducting composition of the first aspect of the invention may be useful in forming a semiconducting layer. Thus, according to a third aspect of the invention, there is provided a semiconducting layer comprising a semiconducting composition according to the first aspect of the invention.

The semiconducting layer of the third aspect of the invention can be used as part of an organic thin film transistor (OTFT). The other layers of the OTFT device may be deposited in different orders, depending on the end application, to form a variety of device architectures. Examples of these include top and bottom gate devices, for example top gate-bottom contact, top gate-top contact, bottom gate-bottom contact and bottom gate-top contact devices. The semiconducting layer of the third aspect of the invention can be used with any of these architectures.

Typically the semiconducting composition of the first aspect of the invention will be applied to a surface so as to form the semiconducting layer. The semiconducting compositions may be applied by any suitable solution coating method, such as by spin coating, ink jet printing or screen printing methods. The method by which the semiconducting compositions are applied will affect how they are formulated. For example, for ink jet printing it is desired to use a low viscosity, low solids loading composition, whereas for screen printing it is desired to use a high viscosity, high solids loading composition. Once the semiconducting composition has been applied to a surface, the solvent is evaporated off to provide a semiconducting layer. Typically, the solvent is evaporated off by means of the coating process and/or by hotplate baking, vacuum drying or drying using a flow of (optionally hot) air or inert gas.

The semiconducting layer may, for example, have a thickness of from 1 nm to 500 nm, such as from 5 nm to 100 nm, preferably from 10 nm to 50 nm.

The semiconducting composition of the first aspect of the invention may be applied to any suitable surface so as to form the semiconducting layer. Materials which may form a suitable surface include, but are not limited to, polymeric films such as polyamides, polycarbonates, polyimides, polyketones, polyethylene, terephthalate (PET) and polyethylene naphthalate (PEN), and inorganic substrates such as silica, alumina, silicon wafers and glass. The surface may be treated, for example by reaction of chemical functionality inherent to the surface with reagents such as silanes or exposure of the surface to plasma, in order to alter the surface characteristics. Alternatively, the surface may be coated with a suitable planarization material.

The semiconducting layer may provide a display, for example in a device.

The semiconducting composition of the first aspect of the invention may be useful in forming a semiconducting device. Thus, according to another aspect of the invention, there is provided a semiconducting device comprising a semiconducting composition according to the first aspect of the invention.

According to another aspect of the invention, there is provided an electronic device comprising a semiconducting composition according to the first aspect of the invention or a semiconducting layer according to the third aspect of the invention.

The electronic device may include, without limitation, organic thin-film transistors (OTFTs), organic field effect transistors (OFETS), organic light emitting diodes (OLEDS), photodectors, organic photovoltaic (OPV) cells, sensors, lasers, memory elements and logic circuits.

Exemplary electronic devices of the present invention may be fabricated by the solution deposition of the above-described semiconducting composition on to a substrate.

References herein to "semiconducting polymer comprising units of A and/or B" of course refer to the semiconducting polymers discussed throughout the specification and may further comprise units of A', B', C, D and/or E, and may be homopolymers or copolymers as discussed herein, unless referred to specifically as either homopolymers or copolymers.

Semiconducting Copolymers

A second aspect of the present invention provides a semiconducting copolymer comprising units of A and/or B:

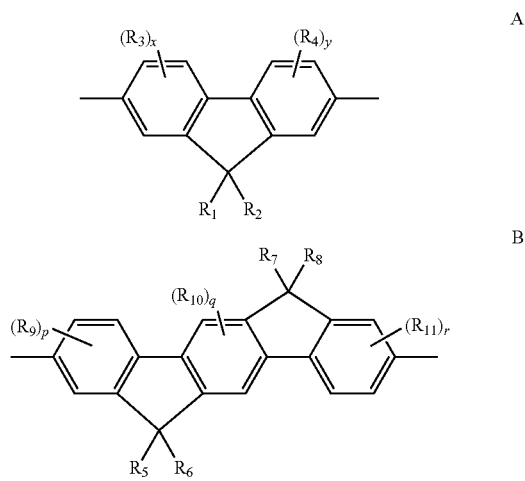

wherein $R_1$, $R_2$, $R_5$, $R_6$, $R_7$ and $R_8$ are each independently selected from $C_1$-$C_{12}$ alkyl, $C_2$-$C_{12}$ alkenyl and aryl;

wherein when any $R_1$, $R_2$, $R_5$, $R_6$, $R_7$ and/or $R_8$ group is $C_1$-$C_{12}$ alkyl or $C_2$-$C_{12}$ alkenyl, then each $R_1$, $R_2$, $R_5$, $R_6$, $R_7$ and/or $R_8$ group is optionally substituted by one or more substituents independently selected from cyano, hydroxy, $C_1$-$C_{10}$ alkoxy, $C_3$-$C_8$ cycloalkyl, heterocyclyl, aryl and a group of the formula —(OCH$_2$CH$_2$)$_z$—OR$_{12}$, wherein z is 1, 2, 3, 4, 5 or 6 and $R_{12}$ is $C_1$-$C_4$ alkyl;

and wherein any aryl group present in $R_1$, $R_2$, $R_5$, $R_6$, $R_7$ and/or $R_8$ is optionally substituted by one or more substituents independently selected from $C_1$-$C_4$ alkyl, $C_1$-$C_4$ alkoxy, cyano, hydroxy, fluoro, chloro, trifluoromethyl and trifluoromethoxy;

wherein in the units A (when present) at least one of the $R_1$ and $R_2$ groups is substituted by one or more cyano groups and in the units B (when present) at least one of the $R_5$, $R_6$, $R_7$ and $R_8$ groups is substituted by one or more cyano groups;

x represents 0, 1, 2 or 3;

y represents 0, 1, 2 or 3;

p represents 0, 1, 2 or 3;

q represents 0, 1 or 2;

r represents 0, 1, 2 or 3;

wherein each $R_3$, $R_4$, $R_9$, $R_{10}$ and $R_{11}$ (when present) is independently selected from $C_1$-$C_6$ alkyl and $C_1$-$C_4$ alkoxy.

The semiconducting copolymer according to the second aspect of the invention may further comprise units of A', B', C, D and/or E:

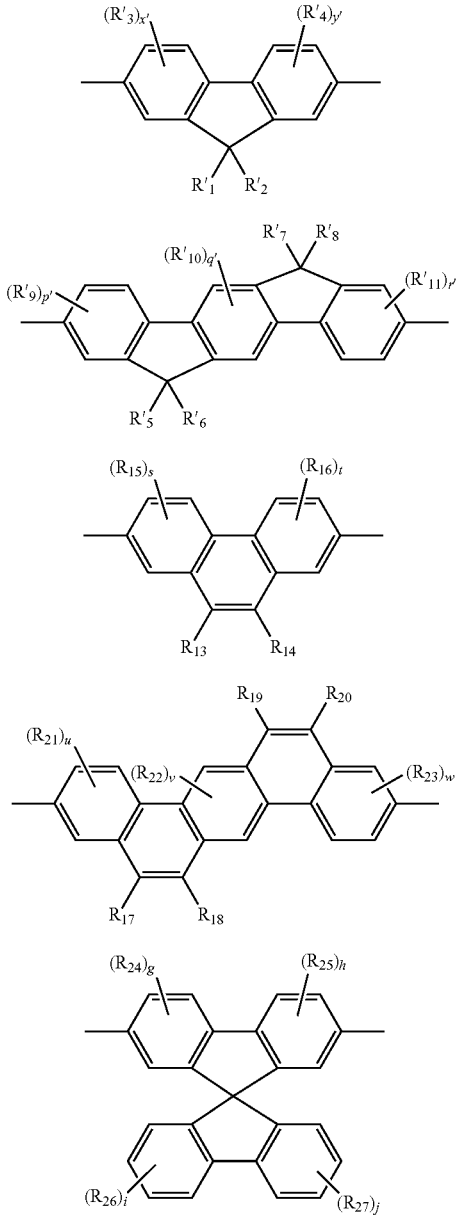

wherein R'$_1$, R'$_2$, R'$_5$, R'$_6$, R'$_7$, R'$_8$, R$_{13}$, R$_{14}$, R$_{17}$, R$_{18}$, R$_{19}$ and/or R$_{20}$ are each independently selected from C$_1$-C$_{12}$ alkyl, C$_2$-C$_{12}$ alkenyl and aryl;

wherein when any R'$_1$, R'$_2$, R'$_5$, R'$_6$, R'$_7$, R'$_8$, R$_{13}$, R$_{14}$, R$_{17}$, R$_{18}$, R$_{19}$ and/or R$_{20}$ group is C$_1$-C$_{12}$ alkyl or C$_2$-C$_{12}$ alkenyl, then each R'$_1$, R'$_2$, R'$_5$, R'$_6$, R'$_7$, R'$_8$, R$_{13}$, R$_{14}$, R$_{17}$, R$_{18}$, R$_{19}$ and/or R$_{20}$ group is optionally substituted by one or more substituents independently selected from cyano, hydroxy, C$_1$-C$_{10}$ alkoxy, C$_3$-C$_8$ cycloalkyl, heterocyclyl, aryl and a group of the formula —(OCH$_2$CH$_2$)$_{z'}$—OR$_{28}$, wherein z' is 1, 2, 3, 4, 5 or 6 and R$_{28}$ is C$_1$-C$_4$ alkyl;

and wherein any aryl group present in R'$_1$, R'$_2$, R'$_5$, R'$_6$, R'$_7$, R'$_8$, R$_{13}$, R$_{14}$, R$_{17}$, R$_{18}$, R$_{19}$ and/or R$_{20}$ is optionally substituted by one or more substituents independently selected from C$_1$-C$_4$ alkyl, C$_1$-C$_4$ alkoxy, cyano, hydroxy, fluoro, chloro, trifluoromethyl and trifluoromethoxy;

x' represents 0, 1, 2 or 3;
y' represents 0, 1, 2 or 3;
p' represents 0, 1, 2 or 3;
q' represents 0, 1 or 2;
r' represents 0, 1, 2 or 3;
s represents 0, 1, 2 or 3;
t represents 0, 1, 2 or 3;
u represents 0, 1, 2 or 3;
v represents 0, 1 or 2;
w represents 0, 1, 2 or 3;
g represents 0, 1, 2 or 3;
h represents 0, 1, 2 or 3;
i represents 0, 1, 2, 3 or 4;
j represents 0, 1, 2, 3 or 4;

wherein each R'$_3$, R'$_4$, R'$_9$, R'$_{10}$, R'$_{11}$, R$_{15}$, R$_{16}$, R$_{21}$, R$_{22}$, R$_{23}$, R$_{24}$, R$_{25}$, R$_{26}$ and R$_{27}$ (when present) is independently selected from C$_1$-C$_6$ alkyl and C$_1$-C$_4$ alkoxy.

Features of the semiconducting copolymers (including preferred features) according to the second aspect of the invention are as set out herein in relation to copolymers discussed in relation to the semiconducting compositions according to the first aspect of the invention. All suitable and preferred groups set out above in relation to the first aspect of the invention which relate to the semiconducting copolymers also relate to the copolymers as defined in relation to the second aspect of the invention.

The semiconducting copolymer according to the second aspect of the invention may have a relative permittivity of greater than 3.4 at 1000 Hz. For example, the semiconducting copolymer of the second aspect of the invention may have a relative permittivity of from 3.4 to 8 at 1000 Hz, such as from 3.4 to 6 at 1000 Hz, particularly from 3.4 to 4.5 at 1000 Hz. Therefore, the semiconducting copolymer according to the second aspect of the invention may have a relative permittivity of greater than 4 at 1000 Hz, such as from 4 to 8 at 1000 Hz, particularly from 4 to 7.5 at 1000 Hz.

It is believed that the desired relative permittivity of the semiconducting copolymer may be obtained by selecting a suitable number of the monomeric A and/or B units for including in the polymer. The optimum number of A and/or B units will depend on the particular substituents provided.

Preferably, the semiconducting copolymer according to the second aspect of the invention has a charge mobility of greater than $10^{-7}$ cm$^2$/Vs, such as greater than $10^{-6}$ cm$^2$/Vs, particularly greater than $10^{-5}$ cm$^2$/Vs. Preferably, the semiconducting copolymer, composition or layer has an ionisation potential close to that of a crystalline small molecule organic semiconductor material (OSC), most preferably within a range of +/−0.6 eV, even more preferably within a range of +/−0.4 eV, of the ionisation potential of a small molecule OSC. The references to "charge mobility" specifically for the semiconducting copolymer relate to the charge mobility measured in the pure state, i.e. refer to a measurement of the intrinsic charge mobility of the pure polymer, rather than as a mixture with any other conducting, semiconducting or insulating materials.

The semiconducting copolymer according to the second aspect of the invention may comprise any suitable number of the units A and/or any suitable number of the units B, as well any suitable number of units of other structural types (provided that at least a unit A and/or B is present).

The semiconducting copolymer according to the second aspect of the invention may be an alternating, random or periodic copolymer as discussed herein.

The semiconducting copolymer according to the second aspect of the invention may comprise units of A and units of B.

The semiconducting copolymer according to the second aspect of the invention may comprise different A units. For example, any unit A as defined herein may be combined with a different unit A as defined herein to provide a copolymer.

The semiconducting copolymer according to the second aspect of the invention may comprise different B units. For example, any unit B as defined herein may be combined with a different unit B as defined herein to provide a copolymer.

The semiconducting copolymer according to the second aspect of the invention may comprise units of A and further comprise units of A', B', C, D and/or E (especially units of A', B' and/or C). The semiconducting copolymer according to the second aspect of the invention may comprise units of B and further comprise units of A', B', C, D and/or E (especially units of A', B' and/or C).

The semiconducting copolymer according to the second aspect of the invention may comprise at least 20%, preferably at least 30%, monomeric A and/or B units, such as at least 50% monomeric A and/or B units.

The semiconducting copolymer according to the second aspect of the invention may comprise at least 20%, preferably at least 30%, monomeric A units, such as at least 50% monomeric A units. The semiconducting copolymer according to the second aspect of the invention may comprise at least 20%, preferably at least 30%, monomeric B units, such as at least 50% monomeric B units.

The semiconducting copolymer according to the second aspect of the invention may comprise units of A and further comprise units of A'. The semiconducting copolymer according to the second aspect of the invention may comprise units of A and further comprise units of B'. The semiconducting copolymer according to the second aspect of the invention may comprise units of A and further comprise units of C. The semiconducting copolymer according to the second aspect of the invention may comprise units of A and further comprise units of D. The semiconducting copolymer according to the second aspect of the invention may comprise units of A and further comprise units of E.

The semiconducting copolymer according to the second aspect of the invention may comprise units of B and further comprise units of A'. The semiconducting copolymer according to the second aspect of the invention may comprise units of B and further comprise units of B'. The semiconducting copolymer according to the second aspect of the invention may comprise units of B and further comprise units of C. The semiconducting copolymer according to the second aspect of the invention may comprise units of B and further comprise units of D. The semiconducting copolymer according to the second aspect of the invention may comprise units of B and further comprise units of E.

The semiconducting copolymer of the second aspect of the invention may consist essentially of (or consist of) units of A and B. Suitably, the semiconducting copolymer may be an alternating copolymer which consists essentially of (or consists of) the units A and B. In other words, the semiconducting polymer may be a copolymer consisting essentially of (or consisting of) alternating A and B units. Suitably, the semiconducting copolymer may be a random copolymer which consists essentially of (or consists of) the units A and B.

The semiconducting copolymer of the second aspect of the invention may consist essentially of (or consist of) units of A and A'. Suitably, the semiconducting copolymer may be an alternating copolymer which consists essentially of (or consists of) the units A and A'. In other words, the semiconducting polymer may be a copolymer consisting essentially of (or consisting of) alternating A and A' units. Suitably, the semiconducting copolymer may be a random copolymer which consists essentially of (or consists of) the units A and A'.

The semiconducting copolymer of the second aspect of the invention may consist essentially of (or consist of) units of A and B'. Suitably, the semiconducting copolymer may be an alternating copolymer which consists essentially of (or consists of) the units A and B'. In other words, the semiconducting polymer may be a copolymer consisting essentially of (or consisting of) alternating A and B' units. Suitably, the semiconducting copolymer may be a random copolymer which consists essentially of (or consists of) the units A and B'.

The semiconducting copolymer of the second aspect of the invention may consist essentially of (or consist of) units of A and C. Suitably, the semiconducting copolymer may be an alternating copolymer which consists essentially of (or consists of) the units A and C. In other words, the semiconducting polymer may be a copolymer consisting essentially of (or consisting of) alternating A and C units. Suitably, the semiconducting copolymer may be a random copolymer which consists essentially of (or consists of) the units A and C.

The semiconducting copolymer of the second aspect of the invention may consist essentially of (or consist of) units of A and D. Suitably, the semiconducting copolymer may be an alternating copolymer which consists essentially of (or consists of) the units A and D. In other words, the semiconducting polymer may be a copolymer consisting essentially of (or consisting of) alternating A and D units. Suitably, the semiconducting copolymer may be a random copolymer which consists essentially of (or consists of) the units A and D.

The semiconducting copolymer of the second aspect of the invention may consist essentially of (or consist of) units of A and E. Suitably, the semiconducting copolymer may be an alternating copolymer which consists essentially of (or consists of) the units A and E. In other words, the semiconducting polymer may be a copolymer consisting essentially of (or consisting of) alternating A and E units. Suitably, the semiconducting copolymer may be a random copolymer which consists essentially of (or consists of) the units A and E.

The semiconducting copolymer of the second aspect of the invention may consist essentially of (or consist of) units of B and A'. Suitably, the semiconducting copolymer may be an alternating copolymer which consists essentially of (or consists of) the units B and A'. In other words, the semiconducting polymer may be a copolymer consisting essentially of (or consisting of) alternating B and A' units. Suitably, the semiconducting copolymer may be a random copolymer which consists essentially of (or consists of) the units B and A'.

The semiconducting copolymer of the second aspect of the invention may consist essentially of (or consist of) units of B and B'. Suitably, the semiconducting copolymer may be an alternating copolymer which consists essentially of (or consists of) the units B and B'. In other words, the semiconducting polymer may be a copolymer consisting essentially of (or consisting of) alternating B and B' units.

Suitably, the semiconducting copolymer may be a random copolymer which consists essentially of (or consists of) the units B and B'.

The semiconducting copolymer of the second aspect of the invention may consist essentially of (or consist of) units of B and C. Suitably, the semiconducting copolymer may be an alternating copolymer which consists essentially of (or consists of) the units B and C. In other words, the semiconducting polymer may be a copolymer consisting essentially of (or consisting of) alternating B and C units. Suitably, the semiconducting copolymer may be a random copolymer which consists essentially of (or consists of) the units B and C.

The semiconducting copolymer of the second aspect of the invention may consist essentially of (or consist of) units of B and D. Suitably, the semiconducting copolymer may be an alternating copolymer which consists essentially of (or consists of) the units B and D. In other words, the semiconducting polymer may be a copolymer consisting essentially of (or consisting of) alternating B and D units. Suitably, the semiconducting copolymer may be a random copolymer which consists essentially of (or consists of) the units B and D.

The semiconducting copolymer of the second aspect of the invention may consist essentially of (or consist of) units of B and E. Suitably, the semiconducting copolymer may be an alternating copolymer which consists essentially of (or consists of) the units B and E. In other words, the semiconducting polymer may be a copolymer consisting essentially of (or consisting of) alternating B and E units. Suitably, the semiconducting copolymer may be a random copolymer which consists essentially of (or consists of) the units B and E.

The semiconducting copolymer of the second aspect of the invention may consist essentially of (or consist of) different units of A as discussed herein. Suitably, the semiconducting copolymer may be an alternating copolymer which consists essentially of (or consists of) different units of A. In other words, the semiconducting polymer may be a copolymer consisting essentially of (or consisting of) different alternating A units. Suitably, the semiconducting copolymer may be a random copolymer which consists essentially of (or consists of) different units of A.

The semiconducting copolymer of the second aspect of the invention may consist essentially of (or consist of) different units of B as discussed herein. Suitably, the semiconducting copolymer may be an alternating copolymer which consists essentially of (or consists of) different units of B. In other words, the semiconducting polymer may be a copolymer consisting essentially of (or consisting of) different alternating B units. Suitably, the semiconducting copolymer may be a random copolymer which consists essentially of (or consists of) different units of B.

The semiconducting copolymer of the second aspect of the invention may have a number average molecular weight (Mn) in the range of 500 to 10,000,000 Dalton, particularly in the range of 1500 to 1,000,000 Dalton, more particularly in the range of 3000 to 200,000 Dalton. The number average molecular weight may be measured by any suitable method, for example by Gel Permeation Chromatography (GPC).

The semiconducting copolymer according to the second aspect of the invention may comprise units of A and units of A',
wherein $R_1$ and $R_2$ are each independently selected from $C_1$-$C_{12}$ alkyl, wherein the $C_1$-$C_{12}$ alkyl is optionally substituted by one or more substituents independently selected from cyano, hydroxyl, $C_1$-$C_{10}$ alkoxy, $C_3$-$C_8$ cycloalkyl, heterocyclyl, aryl and —$(OCH_2CH_2)_z$—$OR_{12}$, wherein z is 1, 2, 3, 4, 5 or 6 and $R_{12}$ is $C_1$-$C_4$ alkyl;

and wherein any aryl group present in $R_1$ and/or $R_2$ is optionally substituted by one or more substituents independently selected from $C_1$-$C_4$ alkyl, $C_1$-$C_4$ alkoxy, cyano, hydroxy, fluoro, chloro, trifluoromethyl and trifluoromethoxy;

wherein at least one of the $R_1$ and/or $R_2$ groups is substituted by one or more cyano groups;

wherein x represents 0, 1, 2 or 3 and y represents 0, 1, 2 or 3;

wherein each $R_3$ and $R_4$ (when present) is independently selected from $C_1$-$C_6$ alkyl and $C_1$-$C_4$ alkoxy;

wherein $R'_1$ and $R'_2$ are each independently selected from $C_1$-$C_{12}$ alkyl, wherein the $C_1$-$C_{12}$ alkyl is optionally substituted by one or more substituents independently selected from cyano, hydroxy, $C_1$-$C_{10}$ alkoxy, $C_3$-$C_8$ cycloalkyl, heterocyclyl, aryl and a group of the formula —$(OCH_2CH_2)_{z'}$—$OR_{28}$, wherein z' is 1, 2, 3, 4, 5 or 6 and $R_{28}$ is $C_1$-$C_4$ alkyl;

and wherein any aryl group present in $R'_1$ and/or $R'_2$ is optionally substituted by one or more substituents independently selected from $C_1$-$C_4$ alkyl, $C_1$-$C_4$ alkoxy, cyano, hydroxy, fluoro, chloro, trifluoromethyl and trifluoromethoxy;

wherein x' represents 0, 1, 2 or 3 and y' represents 0, 1, 2 or 3;

and wherein each $R'_3$ and $R'_4$ (when present) is independently selected from $C_1$-$C_6$ alkyl and $C_1$-$C_4$ alkoxy.

The semiconducting copolymer according to the second aspect of the invention may comprise units of A and units of A',
wherein $R_1$ and $R_2$ are each independently selected from $C_1$-$C_{12}$ alkyl, wherein the $C_1$-$C_{12}$ alkyl is optionally substituted by one or more substituents independently selected from cyano, hydroxyl, $C_1$-$C_{10}$ alkoxy, $C_3$-$C_8$ cycloalkyl, heterocyclyl, aryl and —$(OCH_2CH_2)_z$—$OR_{12}$, wherein z is 1, 2, 3, 4, 5 or 6 and $R_{12}$ is $C_1$-$C_4$ alkyl;

and wherein any aryl group present in $R_1$ and/or $R_2$ is optionally substituted by one or more substituents independently selected from $C_1$-$C_4$ alkyl, $C_1$-$C_4$ alkoxy, cyano, hydroxy, fluoro, chloro, trifluoromethyl and trifluoromethoxy;

wherein at least one of the $R_1$ and/or $R_2$ groups is substituted by one or more cyano groups;

wherein x represents 0, 1, 2 or 3 (such as 0) and y represents 0, 1, 2 or 3 (such as 0);

wherein each $R_3$ and $R_4$ (when present) is independently selected from $C_1$-$C_6$ alkyl and $C_1$-$C_4$ alkoxy;

wherein $R'_1$ and $R'_2$ are each independently selected from $C_1$-$C_{12}$ alkyl, wherein the $C_1$-$C_{12}$ alkyl is optionally substituted by one or more substituents of the formula —$(OCH_2CH_2)_{z'}$—$OR_{28}$, wherein z' is 1, 2, 3, 4, 5 or 6 and $R_{28}$ is $C_1$-$C_4$ alkyl;

wherein x' represents 0, 1, 2 or 3 (such as 0) and y' represents 0, 1, 2 or 3 (such as 0);

and wherein each $R'_3$ and $R'_4$ (when present) is independently selected from $C_1$-$C_6$ alkyl and $C_1$-$C_4$ alkoxy.

The semiconducting copolymer according to the second aspect of the invention may comprise units of A and units of A', wherein $R_1$ and $R_2$ are each independently selected from $C_1$-$C_{12}$ alkyl, wherein the $C_1$-$C_2$ alkyl group is substituted by one or more cyano groups;

wherein x represents 0 and y represents 0;
wherein R'₁ and R'₂ are each independently selected from C₁-C₁₂ alkyl, wherein the C₁-C₁₂ alkyl is optionally substituted by one or more substituents independently selected from cyano, hydroxy, C₁-C₁₀ alkoxy, C₃-C₈ cycloalkyl, heterocyclyl, aryl and a group of the formula —(OCH₂CH₂)$_{z'}$—OR₂₈, wherein z' is 1, 2, 3, 4, 5 or 6 and R₂₈ is C₁-C₄ alkyl;
and wherein any aryl group present in R'₁ and/or R'₂ is optionally substituted by one or more substituents independently selected from C₁-C₄ alkyl, C₁-C₄ alkoxy, cyano, hydroxy, fluoro, chloro, trifluoromethyl and trifluoromethoxy;
wherein x' represents 0 and y' represents 0.

The semiconducting copolymer according to the second aspect of the invention may comprise units of A and units of B',
wherein R₁ and R₂ are each independently selected from C₁-C₁₂ alkyl, wherein the C₁-C₁₂ alkyl is optionally substituted by one or more substituents independently selected from cyano, hydroxyl, C₁-C₁₀ alkoxy, C₃-C₈ cycloalkyl, heterocyclyl, aryl and —(OCH₂CH₂)$_z$—OR₁₂, wherein z is 1, 2, 3, 4, 5 or 6 and R₁₂ is C₁-C₄ alkyl;
and wherein any aryl group present in R₁ and/or R₂ is optionally substituted by one or more substituents independently selected from C₁-C₄ alkyl, C₁-C₄ alkoxy, cyano, hydroxy, fluoro, chloro, trifluoromethyl and trifluoromethoxy;
wherein at least one of the R₁ and/or R₂ groups is substituted by one or more cyano groups;
wherein x represents 0, 1, 2 or 3 and y represents 0, 1, 2 or 3;
wherein each R₃ and R₄ (when present) is independently selected from C₁-C₆ alkyl and C₁-C₄ alkoxy;
wherein R'₅, R'₆, R'₇ and R'₈ are each independently selected from an unsubstituted C₁-C₁₂ alkyl group,
p' represents 0 or 1 (such as 0);
q' represents 0 or 1 (such as 0);
r' represents 0 or 1 (such as 0);
wherein each of R'₉, R'₁₀ and R'₁₁ (when present) is independently selected from C₁-C₆ alkyl and C₁-C₄ alkoxy.

The semiconducting copolymer according to the second aspect of the invention may comprise units of A and units of B',
wherein R₁ and R₂ are each independently selected from C₁-C₁₂ alkyl, wherein the C₁-C₁₂ alkyl group is substituted by one or more cyano groups;
wherein x represents 0, 1, 2 or 3 (such as 0) and y represents 0, 1, 2 or 3 (such as 0);
wherein each R₃ and R₄ (when present) is independently selected from C₁-C₆ alkyl and C₁-C₄ alkoxy;
wherein R'₅, R'₆, R'₇ and R'₈ are each independently selected from an unsubstituted C₁-C₁₂ alkyl group,
p' represents 0 or 1 (such as 0);
q' represents 0 or 1 (such as 0);
r' represents 0 or 1 (such as 0);
wherein each of R'₉, R'₁₀ and R'₁₁ (when present) is independently selected from C₁-C₆ alkyl and C₁-C₄ alkoxy.

The semiconducting copolymer according to the second aspect of the invention may comprise units of A and units of B',
wherein R₁ and R₂ are each independently selected from C₁-C₁₂ alkyl, wherein the C₁-C₁₂ alkyl group is substituted by one or more cyano groups;
wherein x represents 0 and y represents 0;
wherein R'₅, R'₆, R'₇ and R'₈ are each independently selected from an unsubstituted C₁-C₁₂ alkyl group,
p' represents 0 or 1 (such as 0);
q' represents 0 or 1 (such as 0);
r' represents 0 or 1 (such as 0);
wherein each of R'₉, R'₁₀ and R'₁₁ (when present) is independently selected from C₁-C₆ alkyl and C₁-C₄ alkoxy.

The semiconducting copolymer according to the second aspect of the invention may comprise units of A and units of C,
wherein R₁ and R₂ are each independently selected from C₁-C₁₂ alkyl, wherein the C₁-C₁₂ alkyl is optionally substituted by one or more substituents independently selected from cyano, hydroxyl, C₁-C₁₀ alkoxy, C₃-C₈ cycloalkyl, heterocyclyl, aryl and —(OCH₂CH₂)$_z$—OR₁₂, wherein z is 1, 2, 3, 4, 5 or 6 and R₁₂ is C₁-C₄ alkyl;
and wherein any aryl group present in R₁ and/or R₂ is optionally substituted by one or more substituents independently selected from C₁-C₄ alkyl, C₁-C₄ alkoxy, cyano, hydroxy, fluoro, chloro, trifluoromethyl and trifluoromethoxy;
wherein at least one of the R₁ and/or R₂ groups is substituted by one or more cyano groups;
wherein x represents 0, 1, 2 or 3 and y represents 0, 1, 2 or 3;
wherein each R₃ and R₄ (when present) is independently selected from C₁-C₆ alkyl and C₁-C₄ alkoxy;
wherein R₁₃ and R₁₄ are each independently selected from C₁-C₁₂ alkyl, wherein the C₁-C₁₂ alkyl group is optionally substituted by one or more substituents independently selected from cyano, hydroxy, C₁-C₁₀ alkoxy, C₃-C₈ cycloalkyl, heterocyclyl, aryl and a group of the formula —(OCH₂CH₂)$_{z'}$—OR₂₈, wherein z' is 1, 2, 3, 4, 5 or 6 and R₂₈ is C₁-C₄ alkyl;
and wherein any aryl group present in R₁₃ and R₁₄ is optionally substituted by one or more substituents independently selected from C₁-C₄ alkyl, C₁-C₄ alkoxy, cyano, hydroxy, fluoro, chloro, trifluoromethyl and trifluoromethoxy;
s represents 0, 1, 2 or 3;
t represents 0, 1, 2 or 3;
wherein each R₁₅ and R₁₆ (when present) is independently selected from C₁-C₆ alkyl and C₁-C₄ alkoxy.

The semiconducting copolymer according to the second aspect of the invention may comprise units of A and units of C,
wherein R₁ and R₂ are each independently selected from C₁-C₁₂ alkyl, wherein the C₁-C₁₂ alkyl is optionally substituted by one or more substituents independently selected from cyano, hydroxyl, C₁-C₁₀ alkoxy, C₃-C₈ cycloalkyl, heterocyclyl, aryl and —(OCH₂CH₂)$_z$—OR₁₂, wherein z is 1, 2, 3, 4, 5 or 6 and R₁₂ is C₁-C₄ alkyl;
and wherein any aryl group present in R₁ and/or R₂ is optionally substituted by one or more substituents independently selected from C₁-C₄ alkyl, C₁-C₄ alkoxy, cyano, hydroxy, fluoro, chloro, trifluoromethyl and trifluoromethoxy;
wherein at least one of the R₁ and/or R₂ groups is substituted by one or more cyano groups;
wherein x represents 0 and y represents 0;
wherein R₁₃ and R₁₄ are each independently selected from C₁-C₁₂ alkyl, wherein the C₁-C₁₂ alkyl group is optionally substituted by one or more substituents independently selected from cyano, hydroxy, C₁-C₁₀ alkoxy, C₃-C₈ cycloalkyl, heterocyclyl, aryl and a group of the formula —(OCH$_2$CH$_2$)$_{z'}$—OR$_{28}$, wherein z' is 1, 2, 3, 4, 5 or 6 and R$_{28}$ is C$_1$-C$_4$ alkyl;

and wherein any aryl group present in R$_{13}$ and R$_{14}$ is optionally substituted by one or more substituents independently selected from C$_1$-C$_4$ alkyl, C$_1$-C$_4$ alkoxy, cyano, hydroxy, fluoro, chloro, trifluoromethyl and trifluoromethoxy; and s represents 0 and t represents 0.

In particular, the semiconducting copolymer of the second aspect of the invention may be:

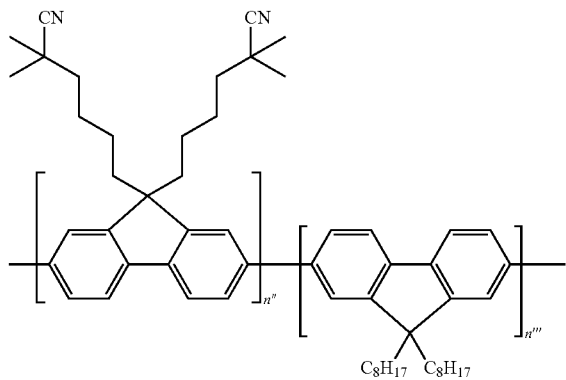

wherein n" and n'" are each an integer greater than 3 (preferably greater than 6, more preferably greater than 12) and wherein n" and n'" may be the same or different.

In particular, the semiconducting copolymer of the second aspect of the invention may be:

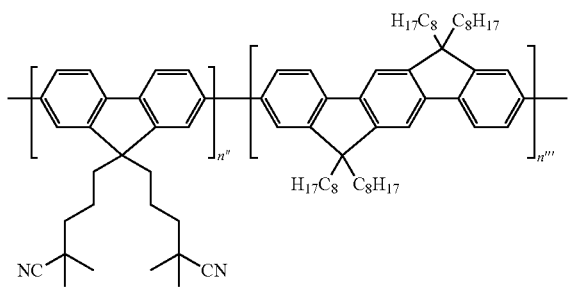

wherein n" and n'" are each an integer greater than 3 (preferably greater than 6, more preferably greater than 12) and wherein n" and n'" may be the same or different.

In particular, the semiconducting copolymer of the second aspect of the invention may be:

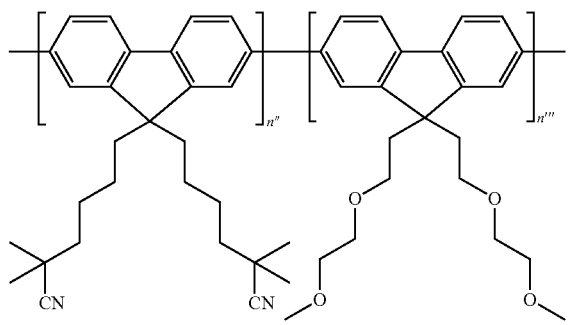

wherein n" and n'" are each an integer greater than 3 (preferably greater than 6, more preferably greater than 12) and wherein n" and n'" may be the same or different.

In particular, the semiconducting copolymer of the second aspect of the invention may be:

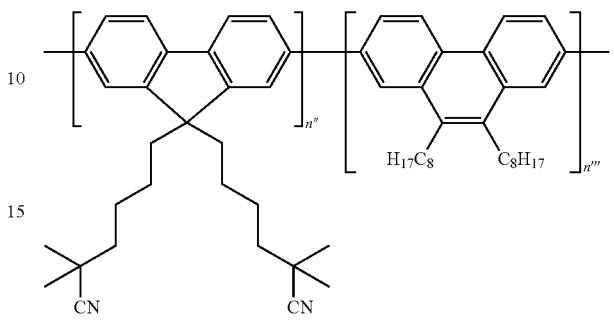

wherein n" and n'" are each an integer greater than 3 (preferably greater than 6, more preferably greater than 12) and wherein n" and n'" may be the same or different.

Suitably, the semiconducting copolymer of the second aspect of the invention may comprise 9,9-bis(5-cyano-5-methylhexyl)fluorene units and 9,9-dioctyl-9H-fluorene units. For example, the semiconducting copolymer may be a 9,9-bis(5-cyano-5-methylhexyl)fluorene:9,9-dioctyl-9H-fluorene copolymer, such as a 30:70 9,9-bis(5-cyano-5-methylhexyl)fluorene:9,9-dioctyl-9H-fluorene copolymer or a 50:50 9,9-bis(5-cyano-5-methylhexyl)fluorene:9,9-dioctyl-9H-fluorene copolymer. Preferably, the semiconducting copolymer may be a 30:70 9,9-bis(5-cyano-5-methylhexyl)fluorene:9,9-dioctyl-9H-fluorene random copolymer or a 50:50 9,9-bis(5-cyano-5-methylhexyl)fluorene:9,9-dioctyl-9H-fluorene alternating copolymer.

Suitably, the semiconducting copolymer of the second aspect of the invention may comprise 9,9-bis(4-cyano-4-methylpentyl)fluorene units and 9,9-dioctyl-9H-fluorene units. For example, the semiconducting copolymer may be a 9,9-bis(4-cyano-4-methylpentyl)fluorene:9,9-dioctyl-9H-fluorene copolymer, such as a 30:70 9,9-bis(4-cyano-4-methylpentyl)fluorene:9,9-dioctyl-9H-fluorene copolymer or a 50:50 9,9-bis(4-cyano-4-methylpentyl)fluorene:9,9-dioctyl-9H-fluorene copolymer. Preferably, the semiconducting copolymer may be a 30:70 9,9-bis(4-cyano-4-methylpentyl)fluorene:9,9-dioctyl-9H-fluorene random copolymer or a 50:50 9,9-bis(4-cyano-4-methylpentyl)fluorene:9,9-dioctyl-9H-fluorene alternating copolymer.

Suitably, the semiconducting copolymer of the second aspect of the invention may comprise 9,9-bis(5-cyano-5-methylhexyl)fluorene units and 9,10-dioctylphenanthrene units. For example, the semiconducting copolymer may be a 9,9-bis(5-cyano-5-methylhexyl)fluorene:9,10-dioctylphenanthrene copolymer, such as a 30:70 9,9-bis(5-cyano-5-methylhexyl)fluorene:9,10-dioctylphenanthrene copolymer or a 50:50 9,9-bis(5-cyano-5-methylhexyl)fluorene:9,10-dioctylphenanthrene copolymer. Preferably, the semiconducting copolymer may be a 30:70 9,9-bis(5-cyano-5-methylhexyl)fluorene:9,10-dioctylphenanthrene random copolymer or a 50:50 9,9-bis(5-cyano-5-methylhexyl)fluorene 9,10-dioctylphenanthrene alternating copolymer.

Suitably, the semiconducting copolymer of the second aspect of the invention may comprise 9,9-bis(4-cyano-4-methylpentyl)fluorene units and 6,6,12,12-tetraoctyl-6,12-dihydroindeno[1,2-b]fluorene units. For example, the semiconducting copolymer may be a 9,9-bis(4-cyano-4- methylpentyl)fluorene:6,6,12,12-tetraoctyl-6,12-dihydroindeno[1,2-b]fluorene copolymer, such as a 50:50 9,9-bis(4-cyano-4-methylpentyl)fluorene:6,6,12,12-tetraoctyl-6,12-dihydroindeno[1,2-b]fluorene copolymer. Preferably, the semiconducting copolymer may be a 50:50 9,9-bis(4-cyano-4-methylpentyl)fluorene:6,6,12,12-tetraoctyl-6,12-dihydroindeno[1,2-b]fluorene random copolymer.

Suitably, the semiconducting copolymer of the second aspect of the invention may comprise 9,9-bis(5-cyano-5-methylhexyl)fluorene units and 9,9-bis[2-(2-methoxyethoxy)ethyl]-9H-fluorene units. For example, the semiconducting copolymer may be a 9,9-bis(5-cyano-5-methylhexyl)fluorene:9,9-bis[2-(2-methoxyethoxy)ethyl]-9H-fluorene copolymer, such as a 50:50 9,9-bis(5-cyano-5-methylhexyl)fluorene:9,9-bis[2-(2-methoxyethoxy)ethyl]-9H-fluorene copolymer. Preferably, the semiconducting copolymer may be a 50:50 9,9-bis(5-cyano-5-methylhexyl)fluorene:9,9-bis[2-(2-methoxyethoxy)ethyl]-9H-fluorene random copolymer.

The semiconducting copolymer according to the second aspect of the invention may be prepared using methods as discussed herein.

The present inventors have surprisingly found that the semiconducting compositions of the first aspect of the invention and semiconducting copolymers of the second aspect of the invention provide very real advantages in use. The semiconducting polymers comprised in the semiconducting compositions of the first aspect of the invention and the semiconducting copolymers of the second aspect of the invention exhibit high relative permittivity (i.e. have a relative permittivity greater than 3.4 at 1000 Hz) and have desirable solubility properties. The desirable solubility properties are exhibited by high solubility in a range of different solvents. Furthermore, the polymers and compositions comprising them exhibit excellent film forming properties. OTFT devices prepared using the polymers and compositions comprising them exhibit low turn on voltages ($V_{to}$). Finally, the polymers are prepared by simplified and lower cost methods compared to prior art materials. These desirable properties have several advantages in use, as follows:

(a) allows the semiconducting polymers (including the copolymers) to be formulated with a range of different solvents, allowing access to new and improved thin film device morphologies.
(b) the excellent film forming properties of the polymers and compositions of this invention allow the fabrication of large area organic electronics with high reproducibility (low standard deviation of properties).
(c) power savings can be realised in electronic devices comprising the polymers and compositions of this invention, such as display backplanes, due to the low $V_{to}$ (close to 0V) compared to electronic devices comprising OTFTs with higher turn on voltages, such as greater than +5V or +10V.
(d) the good solubility of the polymers of this invention enables high viscosity organic semiconducting compositions, enabling alternative coating methods such as flexographic, gravure, offset, stencil and screen printing.

It is believed that the semiconducting polymers comprised in the semiconducting compositions of the first aspect of the invention and the semiconducting copolymers of the second aspect of the invention may be combined with small molecule OSCs and one or more suitable solvents to make a formulated semiconductor 'ink'. This ink can be used as a component of OTFT devices exhibiting highly desirable characteristics (for example high mobility, uniformity, air stability etc). The costs and fabrication processes are relevant to commercial large area electronics manufacture.

Additionally, the semiconducting compositions and copolymers of the first and second aspects of the invention are simple to prepare from commercially available reagents.

A further aspect of the invention provides a semiconducting composition comprising a semiconducting copolymer according to the second aspect of the invention. The semiconducting composition may further comprise a semiconducting non-polymeric polycyclic compound.

A further aspect of the invention provides a semiconducting layer comprising a semiconducting composition, wherein the semiconducting composition comprises a semiconducting copolymer according to the second aspect of the invention.

A further aspect of the invention provides an electronic device comprising a semiconducting composition, wherein the semiconducting composition comprises a semiconducting copolymer according to the second aspect of the invention.

A further aspect of the invention provides an electronic device comprising a semiconducting layer, wherein the semiconducting layer comprises a semiconducting composition comprising a semiconducting copolymer according to the second aspect of the invention.

Features of the compositions, layers and electronic devices are as discussed herein.

Uses

A further aspect of the invention provides the use of a semiconducting copolymer according to the second aspect of the invention as an organic binder in a semiconducting composition.

Attention is directed to all papers and documents which are filed concurrently with or previous to this specification in connection with this application and which are open to public inspection with this specification, and the contents of all such papers and documents are incorporated herein by reference.

All of the features disclosed in this specification (including any accompanying claims, and drawings), and/or all of the steps of any method or process so disclosed, may be combined in any combination, except combinations where at least some of such features and/or steps are mutually exclusive.

Each feature disclosed in this specification (including any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extends to any novel one, or any novel combination, of the features disclosed in this specification (including any accompanying claims, and drawings), or to any novel one, or any novel combination, of the steps of any method or process so disclosed.

BRIEF DESCRIPTION OF DRAWINGS

For a better understanding of the invention, and to show how exemplary embodiments of the same may be carried into effect, reference will be made, by way of example only, to the accompanying diagrammatic Figures, in which FIG. 1 shows a transfer graph for Formulation Example 1(a) after 12 hours of dark storage.

The invention will be further discussed with reference to the following non-limiting Examples.

EXAMPLES

Method for the Measurement of the Relative Permittivity, $\varepsilon_r$, of the Polymers The relative permittivity of each of the semiconducting polymers of Examples 1 to 6 was measured by fabricating capacitors according to the method detailed below.

50 nm titanium bottom contact pads were prepared using sputter coating and standard photolithography and wet etching techniques. The semiconducting polymer of interest was then coated from solution, using a spin coater, to obtain a film thickness of typically between 200 nm and 500 nm. For capacitor fabrication, the polymer was coated as a 5% w/w solution in bromobenzene unless otherwise stated. Wherever possible two thicknesses were tested to ensure no variation of the relative permittivity result with thickness. The solvents used to dissolve the materials are shown below for each example. A top contact pad of approximately 50 nm aluminium was then deposited using shadow mask evaporation. The capacitance was measured using a calibrated Agilent Precision LCR meter E4980A set at a frequency of 1000 Hz. Film thickness measurements were performed using a Dektak surface profilometer. The area of overlap for the top and bottom contact pads, i.e. the area of the capacitor formed, was measured using a Zeiss stereo microscope equipped with image analysis software. Using these values the relative permittivity values were then calculated using the equation:

$$\varepsilon_r = \frac{C \cdot d}{A \cdot \varepsilon_0}$$

where:
$\varepsilon_r$ is the relative permittivity of the semiconducting polymer
C is the measured capacitance of the capacitor
d is the thickness of the film of the semiconducting polymer
A is the area of the capacitor and
$\varepsilon_o$ is the permittivity of free space (a constant with a value of $8.854 \times 10^{-12}$ F/m).

The capacitor array used contains 64 capacitors with areas of $0.11$ cm$^2$ and $0.06$ cm$^2$ respectively (32 of each size). The standard deviation for the value of relative permittivity on each array was calculated, which includes the standard deviation of capacitance, film thickness and area measurement combined.

Method a for Measurement of the Charge Mobility of the Semiconducting Polymers and of the Blends with Small Molecule Semiconductors 10 cm square glass substrates (layer 01) (Corning Eagle XG) were cleaned using sonication for 20 minutes in Deconex (3% w/w in water) followed by rinsing in ultrapure water and dried using compressed air. The substrates were then spin coated with a UV crosslinkable acrylate formulation PCAF01 (available from NeuDrive Ltd). After spin coating, the substrates were first placed on a hotplate at 95° C. for 1 minute to softbake, then UV flash exposed (1000 mJ) under a nitrogen blanket and post exposure baked at 115° C. for 10 minutes. The measured final thickness of the PCAF layer was measured to be 1 micron.

After the preparation of the PCAF01 sublayer the substrates were sputter coated with 50 nm of Au, then source and drain electrodes were prepared with a combination of photolithographic and wet etching techniques (potassium iodide and iodine in water etchant composition). After removal of the residual photolithographic resist from the source and drain contact by UV flash exposure and spin developing, the substrates were inspected under an optical microscope and channel length features measured in several areas of the substrate.

Before proceeding with the organic thin-film transistor (OTFT) fabrication, the substrates were treated again in a Plasma Etch Inc. PE100 surface treatment system, using an Ar/O$_2$ plasma. Each gas was supplied at a concentration of 50 sccm and a RF power of 250 W for 65 s.

Prior to spin coating of a semiconducting composition according to the invention, a 10 mM solution of 4-fluoro-thiophenol or 3-fluoro-4-methoxythiophenol (with 3-fluoro-4-methoxythiophenol being used in Example 1(a)) in 2-propanol was applied to the surface of the electrodes for 1 minute followed by spin coating and rinsing in 2-propanol (2 times), followed by drying on a hotplate. Unless otherwise stated, the OSC formulation was spin coated onto the SD electrodes using a Suss RC12 spinner set at 1500 rpm for 1 minute followed by baking on a hotplate for 60 seconds at 100° C. A solution of 1 part Cytop 809M (Asahi Glass) to 2 parts FC43 solvent (Acros Organics) was spin coated at 1500 rpm for 20 seconds and the sample was baked on a hotplate for 60 seconds at 100° C.

The substrates were then coated with 50 nm of Au by thermal evaporation and the gate electrodes were patterned as before with a combination of photolithography and wet etching.

Method B for Measurement of the Charge Mobility of the Semiconducting Polymers and of the Blends with Small Molecule Semiconductors 10 cm square glass substrates (layer 01) (Corning Eagle XG) were cleaned using sonication for 20 minutes in Deconex (3% w/w in water) followed by rinsing in ultrapure water and dried using compressed air. The substrates were then spin coated with a thermally crosslinkable polymer (P11) (available from NeuDrive Ltd). After spin coating, the substrates were first placed on a hotplate at 95° C. for 2 minutes to softbake, then baked at 150° C. for 60 minutes. The final thickness of the P11 layer was measured to be 1 micron.

After the preparation of the P11 sublayer the substrates were sputter coated with 50 nm of Au, then source and drain electrodes were prepared with a combination of photolithographic and wet etching techniques (potassium iodide and iodine in water etchant composition). After removal of the residual photolithographic resist from the source and drain contact by UV flash exposure and spin developing, the substrates were inspected under an optical microscope and channel length features measured in several areas of the substrate.

Before proceeding with the organic thin-film transistor (OTFT) fabrication, the substrates were treated again in a Plasma Etch Inc. PE100 surface treatment system, using an Ar/O$_2$ plasma. Each gas was supplied at a concentration of 50 sccm and a RF power of 250 W for 65 s.

Prior to spin coating of a semiconducting composition according to the invention, a 10 mM solution of 3-fluoro-4-methoxythiophenol in 2-propanol was applied to the surface of the electrodes for 1 minute followed by spin coating and rinsing in 2-propanol (2 times), followed by drying on a hotplate. Unless otherwise stated, the OSC formulation was spin coated onto the SD electrodes using a Suss RC12 spinner set at 1250 rpm for 1 minute followed by baking on a hotplate for 60 seconds at 100° C. A solution of 1 part Cytop 809M (Asahi Glass) to 2 parts FC43 solvent (Acros Organics) was spin coated at 1500 rpm for 20 seconds and the sample was baked on a hotplate for 60 seconds at 100° C.

The substrates were then coated with 50 nm of Au by thermal evaporation and the gate electrodes were patterned as before with a combination of photolithography and wet etching.

OTFT Characterisation

OTFTs were tested using a Wentworth Pegasus 300S semi-automated probe station in conjunction with a Keithley S4200 semiconductor parameter analyser. This allowed a statistically significant number of OTFT device measurements to be made on each substrate. The Keithley system calculated the linear mobility according to the equation shown below:

$$\mu = \frac{\partial I_{DS}}{\partial V_{GS}} \frac{L}{WC_i V_{DS}}$$

where L is the transistor length, W is the transistor width, $I_{ds}$ is the drain to source current and $C_i$ is the dielectric capacitance per unit area. $V_{DS}$ (drain source voltage) was set at −2V unless otherwise stated, $V_{GS}$ (gate voltage) was varied from depletion to accumulation (typically +20V to −30V in 1V steps). The mobility values reported are an average of the 5 highest points in accumulation for each transistor. The data is reported for the channel lengths shown below and is displayed as an average of the devices measured. To exclude the small proportion of devices with gate leakage, a ratio of the gate current to the source-drain current was made at the highest $V_{GS}$ value for a $V_{DS}$ of −2V. If this ratio was below 10 (i.e. the gate current was more than 10% of the source drain current, then the device was excluded from the results). The standard deviation of the mobility values is reported as a percentage of the mean, and the number of devices measured is indicated in the results also. Turn on voltage of the transistors ($V_{to}$) is defined as the gate voltage point at which the derivative of the logarithm of the drain current with respect to gate voltage is a maximum. It represents the transition point where the device starts to switch from the off state towards the on state. Turn on voltages close to 0V are preferred compared with higher turn on voltages, such as greater than +5V or +10V since this saves power in a display backplane driving scheme. In the device testing, since light absorption in the organic semiconductor layer can influence the $V_{to}$ of the transistors through the photo-generation of charge carriers, then the electrical tests were repeated after 12 hours of storage in the dark to determine the inherent $V_{to}$ for the devices, following the dissipation of the photogenerated charge in the devices.

Preparative Examples 1 to 6

NMR data was collected using instruments supplied by JEOL, specifically models ECX 300 and ECX 400.

Trace metal analysis for palladium (Pd) was performed using an Agilent 7700 ICP-MS in Spectrum Analysis (multi-tune) acquisition mode. Values are reported for the Pd content of the polymer in ppm and are indicative of the levels of Pd catalyst remaining after the synthetic procedure.

Unless otherwise stated, UPLC data was collected using a Waters Acquity™ UPLC system, using an XBridge BEH C18 2.5 µm column and a gradient of 40-98% v/v acetonitrile in 10 mM ammonium bicarbonate ($NH_4HCO_3$) pH 10 over 1.2 minutes.

All solvents used were of HPLC grade, unless otherwise stated.

Silica gel purifications were carried out using Davisil® 60 Å 40-63 µm, a product of Grace Davison Discovery Sciences, unless otherwise stated.

The number average molecular weight ($M_n$) quoted in the Examples herein were determined by gel permeation chromatography (GPC) using a Hewlett Packard 1100 HPLC system with UV detection at a wavelength of 254 nm. Liquid chromatography data was processed using CIRRUS GPC Multi Detector Software, calibrated against polystyrene standards (supplied by Agilent). 13 calibration points were used with a molecular weight range 162-113300.

For convenience, the Examples herein which are polymers are identified by the substituent positions on the aromatic rings of their repeat units.

Example 1

Synthesis of the 30:70 9,9-bis(5-cyano-5-methyl-hexyl)fluorene:9,9-dioctyl-9H-fluorene Random Copolymer 1(a) Synthesis of 9,9-dioctyl-9H-fluorene-2,7-diboronic Acid bis(pinacol) ester

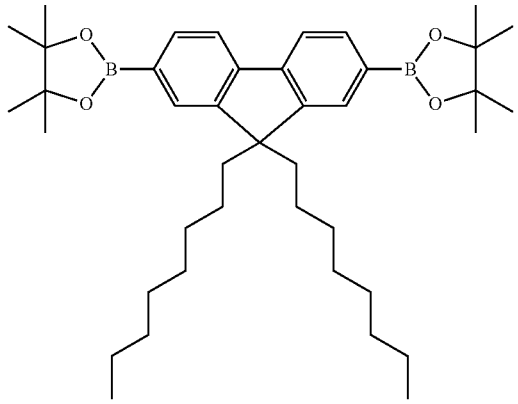

1,4-dioxane (666 mL) was charged to an argon purged 2 L 3-necked round bottom flask fitted with magnetic stirrer, thermometer and reflux condenser. The solvent was degassed with argon for 10 minutes, then 9,9-dioctyl-2,7-dibromofluorene (25 g, 0.0456 mol), bis(pinacolato)diboron (23.2 g, 0.0912 mol), potassium acetate (15.7 g, 0.16 mol) and palladium (II) chloride diphenylphosphinylferrocene (dppf) complex (1.7 g, 0.0023 mol) were added. The reaction mixture was heated at 100° C. for 18 hours, cooled to room temperature, and diluted with toluene (200 mL) and water (200 mL). After stirring for 10 minutes the mixture was filtered through a celite pad, washing with toluene. The filtrate layers were separated and the organic phase washed with water (2×200 mL), then dried ($Na_2SO_4$) and filtered. Concentration of the filtrates in vacuo gave a dark solid (31 g) which was refluxed with acetone (40 mL) for 5 minutes then cooled to 10° C. and filtered at the pump, washing with a small quantity of cold (10° C.) acetone. Drying in vacuo (50° C.) gave a brown solid (24.7 g). The part purified product was recrystallized from a mixture of acetonitrile (40 mL) and tetrahydrofuran (28 mL) to give, after isolation and drying in vacuo (50° C.), 9,9-dioctyl-9H-fluorene-2,7-diboronic acid bis(pinacol) ester as a pale beige solid (24.2 g, 83%).

$^1$H NMR (400 MHz, CDCl$_3$) 7.8 (d, 2H), 7.73 (s, 2H), 7.71 (d, 2H), 1.99 (m, 4H), 1.37 (s, 24H), 1.23-0.95 (m, 20H), 0.81 (t, 6H), 0.53 (m, 4H).

1(b) Synthesis of 2,7-dibromo-9,9-bis(5-cyano-5-methylhexyl)fluorene

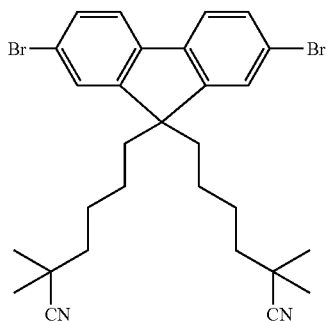 [SMILES: CC(C)(C#N)CCCCC1(CCCCC(C)(C)C#N)c2cc(Br)ccc2-c2ccc(Br)cc21]

2,7-dibromofluorene (7.97 g, 0.025 mol) was suspended in anhydrous DMSO (100 mL) in an argon purged 1 L, 3-necked round bottom flask fitted with magnetic stirrer, thermometer and reflux condenser. Sodium tert-butoxide (5.44 g, 0.0566 mol) was added portionwise at room temperature to produce a dark orange suspension. The reaction mixture was heated to 80° C. and 6-bromo-2,2-dimethylhexane nitrile (11.55 g, 9.65 mL, 0.0566 mol) was added dropwise over 15 minutes. The reaction mixture was heated at 80° C. for a further 10 minutes then cooled to room temperature and added to ice-water (200 mL) with stirring. The resulting mixture was extracted with ethyl acetate (2×200 mL), then the combined organics washed with 1 M HCl (200 mL) and brine (200 mL), dried (MgSO$_4$) and filtered. Concentration of the filtrates in vacuo gave the crude product which was purified by flash chromatography (gradient elution 10 to 20% v/v ethyl acetate in heptane). The product containing fractions were concentrated in vacuo then the residue triturated with methanol (60 mL). The resulting suspension was filtered at the pump washing with a small amount of cold (5° C.) methanol. Drying of the solid product gave 2,7-dibromo-9,9-bis(5-cyano-5-methylhexyl)fluorene as an off white solid (12.05 g, 86%).

$^1$H NMR (400 MHz, CDCl$_3$) 7.51 (d, 2H), 7.47 (d, 2H), 7.43 (s, 2H), 1.98 (m, 4H), 1.24 (m, 20H), 0.57 (m, 4H).

UPLC Retention time 1.07 min (95.5%), m/z (MH$^+$) 569.32.

Synthesis of the 30:70 9,9-bis(5-cyano-5-methylhexyl)fluorene:9,9-dioctyl-9H-fluorene Random Copolymer (Example 1)

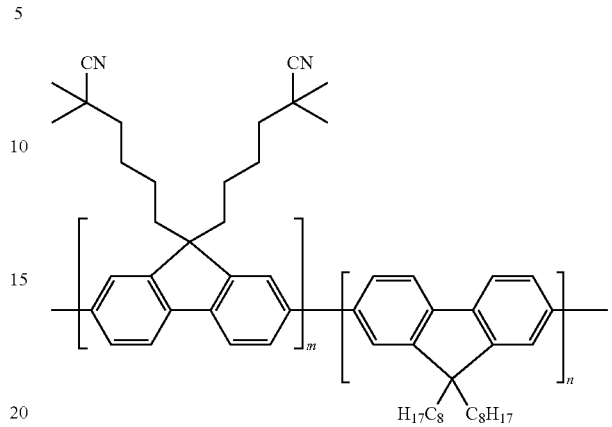

1,4-dioxane (48 mL) and deionised water (DIW) (23 mL) were charged to an argon flushed 250 mL 3-necked round bottom flask, fitted with an overhead stirrer, a thermometer and a condenser. The solvents were degassed with argon for 30 minutes then 9,9-dioctyl-9H-fluorene-2,7-diboronic acid bis(pinacol) ester (3 g, 4.67 mmol), 2,7-dibromo-9,9-dioctyl-9H-fluorene (1.02 g, 1.87 mmol), 2,7-dibromo-9,9-bis(5-cyano-5-methylhexyl)fluorene (1.6 g, 2.80 mmol) and tripotassium phosphate (K$_3$PO$_4$) (4.99 g, 23.34 mmol) were introduced. After degassing for a further 20 minutes, tris(dibenzylideneacetone)dipalladium(0) (4.3 mg, 0.0047 mmol) and tricyclohexylphosphine (3 mg, 0.01 mmol) were added and the reaction mixture was heated at 70° C. for 18 hours. After cooling to room temperature, reaction liquids were decanted and the residual solid dissolved in toluene (90 mL). The toluene solution was shaken with DIW (30 mL) and the biphasic mixture filtered through celite, washing with toluene. The layers were separated and the organic phase dried (Na$_2$SO$_4$) and filtered. Concentration of the filtrates in vacuo gave a light green solid (3.74 g). The solid was dissolved in a 1:1 mixture of heptane and toluene, then purified by dry flash chromatography eluting sequentially with 1:1 heptane-toluene, toluene and 9:1 toluene-tetrahydrofuran. The product containing fractions were concentrated in vacuo to give a yellow foam (2.18 g), which was dissolved in toluene (200 mL) and treated with activated carbon (250 mg). The mixture was heated at 50° C. for 15 minutes, then filtered through a glass fibre membrane. The filtrate was treated with activated carbon a further five times in the same manner, then the filtrates were concentrated in vacuo to give a brown gum (2.03 g). The brown gum was dissolved in tetrahydrofuran (12 mL) and then added dropwise to vigorously stirred (500 rpm) methanol (40 mL) in a glass beaker. The resulting solids were collected at the pump and washed with 4:1 methanol-tetrahydrofuran (20 mL). Drying in vacuo gave the 30:70 9,9-bis(5-cyano-5-methylhexyl)fluorene:9,9-dioctyl-9H-fluorene random copolymer as an off white solid (1.61 g). GPC M$_n$ 9029, PD 1.98.

The polymer of Example 1 had a relative permittivity of 4.16 at 1000 Hz, and a charge mobility of $2.52 \times 10^{-4}$ cm$^2$/Vs (formulated in absence of small molecule OSC as a 1% by weight tetralin solution, L=11.6 μm). The average values for m and n in the polymer prepared, rounded to the nearest integer, were 7 and 16 respectively.

The trace metal content of the polymer of Example (1) was analysed by ICP-MS giving the following result: Pd content 16.8 ppm. This showed that the polymer contained very low levels of metal impurities.

Formulation Example 1(a)

In these Examples the ratio of polymer to the semiconductor is in parts by weight. The polymer of Example 1 was formulated with 1,4,8,11-tetramethyl-6,13-bis(triethylsilylethynyl)pentacene (TMTES) in a ratio 2:1 at a total solids loading of 1.2% by weight in tetralin and coated as an OSC layer in an OTFT device according to Method A described in the above procedure.

The OTFT performance of Formulation 1(a) is shown below:

| Formulation | Channel length of OTFT [microns] | Mobility $cm^2/Vs$ | Standard deviation of mobility, % | Turn on voltage $V_{to}$ [V] and value after dark storage test shown in square brackets (value shown is the median for the working devices tested) | Number of working transistors tested on substrate (out of 36) |
|---|---|---|---|---|---|
| Polymer Example (1) 30:70 9,9-bis(5-cyano-5-methylhexyl)fluorene:9,9-dioctyl-9H-fluorene random copolymer and TMTES in tetralin | 6.3 | 3.51 | 9.0 | 2.5 [1.5] | 30 |

Organic thin film transistors (OTFT) fabricated using Formulation 1(a) as the semiconducting layer showed excellent charge carrier mobility at short channel length, and high device to device uniformity. $V_{to}$ values for devices fabricated using Formulation 1(a) are excellent, being only +1.5V for a channel length of 6 microns, as shown in FIG. 1.

Formulation Example 1(b)

In these Examples the ratio of polymer to the semiconductor is in parts by weight. The polymer of Example 1 was formulated with 1,4,8,11-tetramethyl-6,13-bis(triethylsilylethynyl)pentacene (TMTES) in a ratio 2:1 at a total solids loading of 1.2% by weight in tetralin and 2-propanol mixed solvent (ratio 9:1 by weight) and coated as an OSC layer in an OTFT device according to Method B described in the above procedure.

The OTFT performance of Formulation 1(b) is shown below:

| Formulation | Channel length of OTFT [microns] | Mobility $cm^2/Vs$ | Standard deviation of mobility, % | Number of working transistors tested on substrate (out of 36) |
|---|---|---|---|---|
| Polymer Example (1) 30:70 9,9-bis(5-cyano-5-methylhexyl)fluorene:9,9-dioctyl-9H-fluorene random copolymer and TMTES in tetralin/2-propanol mixed solvent | 7.8 | 2.87 | 11 | 36 |

Organic thin film transistors (OTFT) fabricated using Formulation 1(b) as the semiconducting layer showed excellent charge carrier mobility at short channel length, and high device to device uniformity.

Formulation Example 1(c)

In these Examples the ratio of polymer to the semiconductor is in parts by weight. The polymer of Example 1 was formulated with 1,4,8,11-tetramethyl-6,13-bis(triethylsilylethynyl)pentacene (TMTES) in a ratio 2:1 at a total solids loading of 1.2% by weight in tetralin and coated as an OSC layer in an OTFT device according to Method B described in the above procedure.

The OTFT performance of Formulation 1(c) is shown below:

| Formulation | Channel length of OTFT [microns] | Mobility cm²/Vs | Standard deviation of mobility, % | Number of working transistors tested on substrate (out of 36) |
|---|---|---|---|---|
| Polymer Example (1) 30:70 9,9-bis(5-cyano-5-methylhexyl)fluorene:9,9-dioctyl-9H-fluorene random copolymer and TMTES in tetralin | 8.0 | 3.33 | 12 | 36 |

Organic thin film transistors (OTFT) fabricated using Formulation 1(c) as the semiconducting layer showed excellent charge carrier mobility at short channel length, and high device to device uniformity.

Example 2

Synthesis of the 50:50 9,9-bis(5-cyano-5-methylhexyl)fluorene:9,9-dioctyl-9H-fluorene Alternating Copolymer

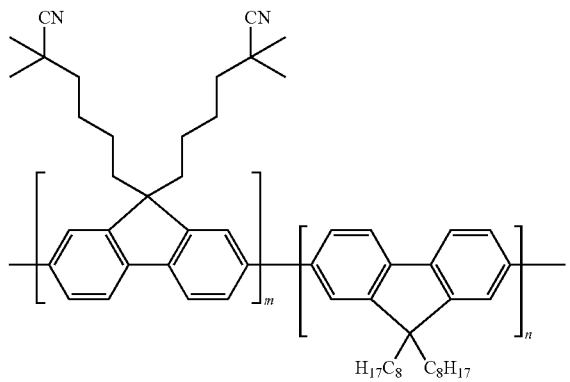

1,4-dioxane (45 mL) and deionised water (DIW) (23 mL) were charged to an argon flushed 250 mL 3-necked round bottom flask, fitted with overhead stirrer, thermometer and condenser. The solvents were degassed with argon for 30 minutes then 9,9-dioctyl-9H-fluorene-2,7-diboronic acid bis (pinacol) ester (3 g, 4.67 mmol), 2,7-dibromo-9,9-bis(5-cyano-5-methylhexyl)fluorene (2.66 g, 4.67 mmol) and tripotassium phosphate ($K_3PO_4$) (4.99 g, 23.34 mmol) were introduced. After degassing for a further 20 minutes, tris (dibenzylideneacetone)dipalladium(0) (4.3 mg, 0.0047 mmol) and tricyclohexylphosphine (3 mg, 0.01 mmol) were added and the reaction mixture was heated at 70° C. for 18 hours. After cooling to room temperature, the reaction mixture was worked up in identical manner to Example 1 above, providing a light green solid (3.78 g). The solid was dissolved in toluene, then purified by dry flash chromatography eluting sequentially with toluene and 9:1 toluene-tetrahydrofuran. The product containing fractions were concentrated in vacuo to give a green/yellow foam, which was dissolved in toluene (130 mL) and treated with activated carbon (160 mg). The mixture was heated at 50° C. for 15 minutes, then filtered through a glass fibre membrane. The filtrate was treated with activated carbon a further time in the same manner, then the filtrates were concentrated in vacuo to give a green solid. The brown gum was dissolved in tetrahydrofuran (10 mL) and then added dropwise to vigorously stirred (500 rpm) methanol (40 mL) in a glass beaker. The resulting solids were collected at the pump and washed with 4:1 methanol-tetrahydrofuran (10 mL). Drying in vacuo gave the 50:50 9,9-bis(5-cyano-5-methylhexyl)fluorene:9,9-dioctyl-9H-fluorene alternating copolymer as an off white solid (1.4 g). GPC $M_n$ 16471, PD 2.01.

The polymer of Example 2 had a relative permittivity of 5.16 at 1000 Hz and a charge mobility of $1.3 \times 10^4$ cm²/Vs (formulated in absence of small molecule OSC as a 1% by weight tetralin solution, L=12.2 μm). The average values for m and n in the polymer prepared, rounded to the nearest integer, were both 21.

Formulation Example 2(a)

In these Examples the ratio of polymer to the semiconductor is in parts by weight. The polymer of Example 2 was formulated with 1,4,8,11-tetramethyl-6,13-bis(triethylsilylethynyl)pentacene (TMTES) in a ratio 2:1 at a total solids loading of 1.2% by weight in tetralin and 2-propanol mixed solvent (ratio 9:1 by weight) and coated as an OSC layer in an OTFT device according to Method B described in the above procedure.

The OTFT performance of Formulation 2(a) is shown below:

| Formulation | Channel length of OTFT [microns] | Mobility cm²/Vs | Standard deviation of mobility, % | Number of working transistors tested on substrate (out of 36) |
|---|---|---|---|---|
| Polymer Example (2) 50:50 9,9-bis(5-cyano-5-methylhexyl)fluorene:9,9-dioctyl-9H-fluorene random copolymer and TMTES in tetralin/2-propanol mixed solvent | 7.8 | 3.07 | 11 | 34 |

Organic thin film transistors (OTFT) fabricated using Formulation 2(a) as the semiconducting layer showed excellent charge carrier mobility at short channel length, and high device to device uniformity.

Example 3

Synthesis of the 50:50 9,9-bis(4-cyano-4-methylpentyl)fluorene:6,6,12,12-tetraoctyl-6,12-dihydroindeno[1,2-b]fluorene Random Copolymer 3(a) Synthesis of 5-chloro-2,2-dimethylpentanenitrile

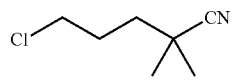

Diisopropylamine (23.7 mL, 0.17 mol) was added to anhydrous tetrahydrofuran (70 mL) and cooled to −70° C. under argon atmosphere. n-butyl lithium (2.1 M in hexane, 77 mL, 0.16 mol) was added dropwise. After cooling back to −70° C., a solution of isobutyronitrile (9.5 mL, 0.11 mol) in anhydrous THF (35 mL) was added dropwise to give a yellow solution, then stirred at −70° C. for 20 min. A solution of 1-chloro-3-bromopropane (25 g, 0.16 mol) in anhydrous THF (35 mL) was added dropwise at −70° C. and the reaction mass stirred for a further 30 min. The reaction was quenched with saturated aqueous ammonium chloride and allowed to warm to room temperature. Heptane was added, the layers split and the aqueous phase extracted with further heptane (2×). The combined organics were dried ($Na_2SO_4$) and filtered. Concentration of the filtrates in vacuo gave an orange oil, which was purified by dry flash chromatography (0 to 10% ethyl acetate in heptane) to give 5-chloro-2,2-dimethylpentanenitrile as a colourless oil (10 g, 43%).

$^1$H NMR (300 MHz, $CDCl_3$) 3.54 (t, 2H), 1.92 (m, 2H), 1.65 (m, 2H), 1.31 (s, 6H).

3(b) Synthesis of 5-iodo-2,2-dimethylpentanenitrile

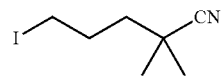

5-chloro-2,2-dimethylpentanenitrile (Example 3(a)) (10 g, 0.069 mol) was dissolved in methyl ethyl ketone (100 mL). Sodium iodide (13.4 g, 0.089 mol) was added and the mixture heated at reflux for 18 hours. After cooling to room temperature, the solids were filtered off and washed with heptane. The filtrates were concentrated in vacuo then triturated with heptane. The solids were filtered and washed again with heptane, then the combined heptane layers concentrated in vacuo. The residue was taken up in ethyl acetate and washed with 10% w/w sodium thiosulfate followed by brine. The organic layer was dried ($Na_2SO_4$) and filtered. Concentration of the filtrates in vacuo gave 5-iodo-2,2-dimethylpentanenitrile as a yellow oil (14.3 g, 87%).

$^1$H NMR (300 MHz, $CDCl_3$) 3.20 (t, 2H), 2.02 (m, 2H), 1.63 (m, 2H), 1.35 (s, 6H).

3(c) Synthesis of 2,7-dibromo-9,9-bis(4-cyano-4-methylpentyl)fluorene

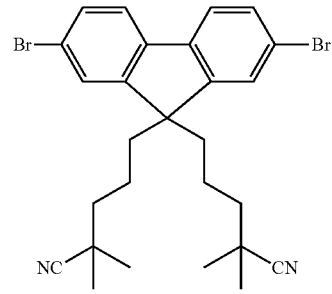

2,7-dibromofluorene (Sigma Aldrich) (6.4 g, 0.02 mol) was dissolved 1 h anhydrous tetrahydrofuran (70 mL) under argon atmosphere. Sodium tert-butoxide (4.3 g, 0.044 mol) was added portionwise to give a deep red solution, which was stirred for 20 minutes at room temperature. A solution of 5-iodo-2,2-dimethylpentanenitrile (Example 3(b)) (10.5 g, 0.044 mol) in anhydrous tetrahydrofuran (25 mL) was added dropwise, then the reaction mixture stirred at room temperature overnight. The following day, ethyl acetate and water were added and the layers separated. The aqueous phase was extracted with ethyl acetate (2×). The combined organics were dried ($Na_2SO_4$) and filtered. Concentration of the filtrates in vacuo gave an orange oil, which was purified by dry flash chromatography (5 to 20% ethyl acetate in heptane) to give an orange oil. The sample was purified a second time by dry flash chromatography (elution as above) then recrystallised from heptane to give 2,7-dibromo-9,9-bis(4-cyano-4-methylpentyl)fluorene as a yellow solid (6.06 g, 56%).

$^1$H NMR (300 MHz, $CDCl_3$) 7.56-7.45 (m, 6H), 2.01 (t, 4H), 1.28 (m, 4H), 1.11 (s, 12H), 0.80 (m, 4H).

3(d) Synthesis of 2,2'-(6,6,12,12-tetraoctyl-6,12-dihydroindeno[1,2-b]fluorene-2,8-diyl)bis(4,4,5,5-tetramethyl-1,3,2-dioxaborolane)

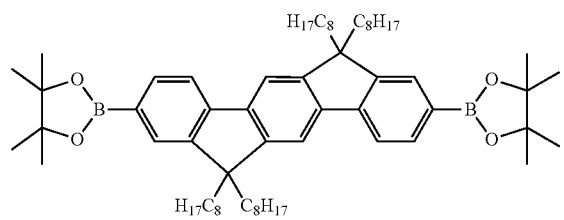

A round bottom flask was charged with 2,8-dibromo-6,6,12,12-tetraoctyl-6,12-dihydroindeno[1,2-b]fluorene (8.84 g, Sigma-Aldrich), potassium acetate (3.53 g, Alfa-Aesar) and bis(pinacolato)diboron (5.74 g, Allychem) in dioxane (220 mL). The mixture was degassed for 15 minutes then [1,1'-bis(diphenylphosphino)ferrocene]-dichloropalladium (II) (419 mg, Peakdale) was added and the reaction mixture heated to 100° C. for 18 hours. The mixture was concentrated and the residue was taken up in DCM/water (2:1) and filtered through a pad of celite washing with DCM. The organic layer was washed with brine, dried ($MgSO_4$) and concentrated onto silica. Purification by dry flash column eluting with heptane/ethyl acetate mixtures gave a yellow solid which was recrystallised from THF/MeCN to give 2,2'-(6,6,12,12-tetraoctyl-6,12-dihydroindeno[1,2-b]fluorene-2,8-diyl)bis(4,4,5,5-tetramethyl-1,3,2-dioxaborolane) as a yellow solid (5.92 g, 60%).

$^1$H NMR (400 MHz, CDCl$_3$) 7.83 (m, 2H), 7.73 (m, 4H), 7.62 (s, 2H), 1.91-2.12 (br m, 8H), 1.39 (s, 24H), 0.91-1.22 (br m, 40H), 0.79 (m, 12H), 0.50-0.70 (br m, 8H).

Synthesis of the 50:50 9,9-bis(4-cyano-4-methylpentyl)fluorene:6,6,12,12-tetraoctyl-6,12-dihydroindeno[1,2-b]fluorene Random Copolymer (Example 3)

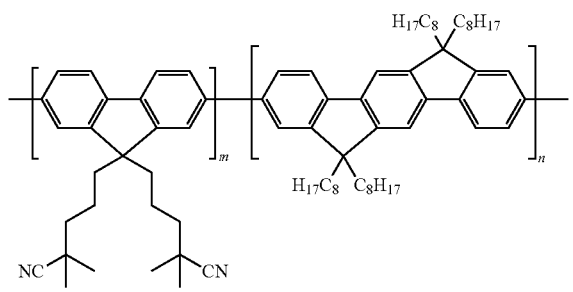

A mixture of 1,4-dioxane (134 mL) and water (66 mL) was degassed with argon for 20 minutes. 2,7-dibromo-9,9-bis(4-cyano-4-methylpentyl)fluorene (Example 3(c)) (5.08 g, 9.4 mmol), 2,2'-(6,6,12,12-tetraoctyl-6,12-dihydroindeno[1,2-b]fluorene-2,8-diyl)bis(4,4,5,5-tetramethyl-1,3,2-dioxaborolane) (Example 3(d)) (8.95 g, 9.4 mmol) and tripotassium phosphate (9.94 g, 47 mmol) were added, followed by tris(dibenzylideneacetone)dipalladium(0) (9 mg, 0.0094 mmol) and tricyclohexylphosphine (6 mg, 0.022 mmol). The reaction mixture was heated at 70° C. for 18 hours. After cooling to room temperature, a solid mass formed. The reaction liquids were decanted and the residual solid dissolved in toluene (300 mL), then the solution was stirred with deionized water (150 mL) and filtered through a celite pad washing with toluene. The filtrate layers were separated and the organic phase washed with deionized water (200 mL). Concentration of the organic phase in vacuo gave a dark green oil, which was purified by dry flash chromatography (toluene) to give a dark yellow foam. This material was dissolved in toluene (200 mL) and activated charcoal (1 g) was added, then the mixture heated at 50° C. and filtered hot. The activated charcoal treatment and filtration was repeated three times in total, then the filtrate was concentrated in vacuo to give a yellow foam (8 g). The material was dissolved in tetrahydrofuran (75 mL) and added dropwise to stirred methanol (250 mL). After 45 minutes of stirring, the liquids were decanted off and the solids dried to give the 50:50 9,9-bis(4-cyano-4-methylpentyl)fluorene:6,6,12,12-tetraoctyl-6,12-dihydroindeno[1,2-b]fluorene random copolymer as a pale yellow powder (6.8 g). GPC M$_n$ 5143, PD 2.12.

The polymer of Example 3 had a relative permittivity of 6.0 at 1000 Hz, and a charge mobility of 2.3×10$^{-4}$ cm$^2$/Vs (formulated in absence of small molecule OSC as a 2% by weight tetralin solution, L=10.5 µm). The average values for m and n in the polymer prepared, rounded to the nearest integer, were 5 and 5 respectively.

Formulation Example 3(a)

In these Examples the ratio of polymer to the semiconductor is in parts by weight. The polymer of Example 3 was formulated with 1,4,8,11-tetramethyl-6,13-bis(triethylsilylethynyl)pentacene (TMTES) in a ratio 2:1 at a total solids loading of 1.2% by weight in a tetralin and 2-propanol mixed solvent (ratio 9:1 by weight) and coated as an OSC layer in an OTFT device according to Method B described in the above procedure.

The OTFT performance of Formulation 3(a) is shown below:

| Formulation | Channel length of OTFT [microns] | Mobility cm$^2$/Vs | Standard deviation of mobility, % | Number of working transistors tested on substrate (out of 36) |
|---|---|---|---|---|
| Polymer Example (3) 50:50 9,9-bis(4-cyano-4-methylpentyl)fluorene:6,6,12,12-tetraoctyl-6,12-dihydroindeno[1,2-b]fluorene random copolymer and TMTES in tetralin/2-propanol mixed solvent | 8.0 | 1.47 | 16 | 36 |

Organic thin film transistors (OTFT) fabricated using Formulation 3(a) as the semiconducting layer showed excellent charge carrier mobility at short channel length, and high device to device uniformity.

Example 4

Synthesis of the 50:50 9,9-bis(5-cyano-5-methylhexyl)fluorene:9,9-Bis[2-(2-methoxyethoxy)ethyl]-9H-fluorene Random Copolymer 4(a) Synthesis of 2,7-dibromo-9,9-Bis[2-(2-methoxyethoxy)ethyl]-9H-fluorene

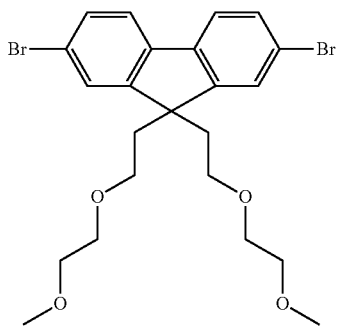 [SMILES: COCCOCCC1(CCOCCOC)c2cc(Br)ccc2-c2ccc(Br)cc21]

2,7-dibromofluorene (Sigma Aldrich) (15.7 g, 0.048 mol) was dissolved in anhydrous tetrahydrofuran (150 mL) and cooled to 5° C. under argon atmosphere. Sodium tert-butoxide (10.5 g, 0.109 mol) was added portionwise, giving a deep red colour. After completion of addition, the reaction mixture was stirred at room temperature for 20 minutes. A solution of 1-bromo-2-(2-methoxyethoxy)ethane (Sigma Aldrich) (20 g, 0.109 mol) in anhydrous THF (50 mL) was added dropwise. The solution turned dark purple and an exotherm to 30° C. was observed. The reaction mixture was stirred at room temperature for 72 hours then diluted with water and ethyl acetate. The layers were separated and the aqueous phase extracted with ethyl acetate (2×). The combined organic layers were washed with water and brine then dried (Na$_2$SO$_4$) and filtered. Concentration of the filtrates in vacuo followed by purification of the residue by dry flash chromatography (0 to 40% ethyl acetate in heptane) gave 2,7-dibromo-9,9-Bis[2-(2-methoxyethoxy)ethyl]-9H-fluorene as a yellow oil (10 g, 40%).

$^1$H NMR (300 MHz, CDCl$_3$) 7.52-7.42 (m, 6H), 3.27 (m, 10H), 3.16 (m, 4H), 2.76 (m, 4H), 2.34 (m, 4H).

4(b) Synthesis of 9,9-Bis[2-(2-methoxyethoxy)ethyl]-9H-fluorene-2,7-diboronic Acid bis(pinacol) ester

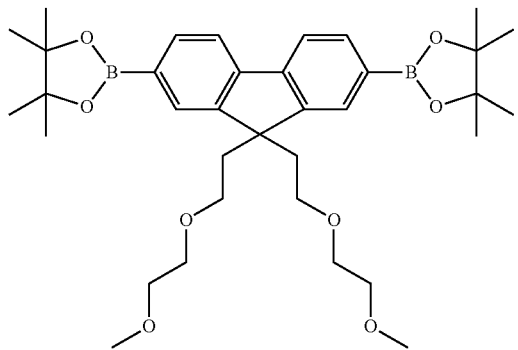

2,7-dibromo-9,9-Bis[2-(2-methoxyethoxy)ethyl]-9H-fluorene (Example 4(a)) (10 g, 0.019 mol) was dissolved in 1,4-dioxane (220 mL) and the solution degassed with argon while stirring. Bis(pinacolato)diboron (10.6 g, 0.042 mol), potassium acetate (6.5 g, 0.066 mol) and palladium (II) chloride diphenylphosphinylferrocene (dppf) complex (0.693 g, 0.0009 mol) were added, and the reaction mixture was heated at 100° C. for 18 hours. After cooling to room temperature, the reaction mixture was filtered through a celite pad then the filtrate concentrated in vacuo to give a sticky black solid. The solid was triturated with isopropanol (15 mL) to give a suspension, then the solids collected at the pump and washed with isopropanol (3×10 mL). Drying gave a beige solid which was recrystallised from isopropanol to give 9,9-Bis[2-(2-methoxyethoxy)ethyl]-9H-fluorene-2,7-diboronic acid bis(pinacol) ester as a beige solid (6.7 g, 57%).

$^1$H NMR (300 MHz, CDCl$_3$) 7.85 (s, 2H), 7.80 (m, 2H), 7.70 (m, 2H), 3.30-3.26 (m, 10H), 3.15 (m, 4H), 2.67 (m, 4H), 2.44 (m, 4H).

Synthesis of the 50:50 9,9-bis(5-cyano-5-methylhexyl)fluorene:9,9-Bis[2-(2-methoxyethoxy)ethyl]-9H-fluorene Random Copolymer (Example 4)

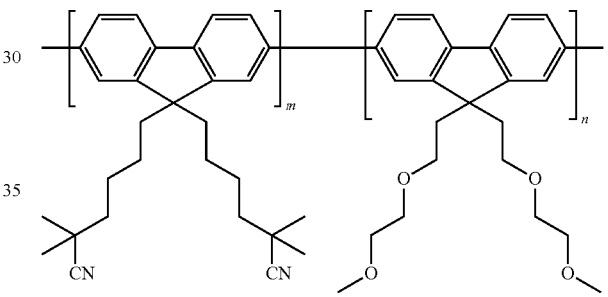

A mixture of 1,4-dioxane (66 mL) and deionised water (33 mL) was degassed with argon for 1 hour. 9,9-Bis[2-(2-methoxyethoxy)ethyl]-9H-fluorene-2,7-diboronic acid bis (pinacol) ester (Example 4(b)) (4 g, 0.0064 mol), 2,7-dibromo-9,9-bis(5-cyano-5-methylhexyl)fluorene (Example 1(b)) (3.7 g, 0.0064 mol) and tripotassium phosphate (17.5 g, 0.083 mol) were added and the resulting mixture warmed to 50° C. while continuing argon degassing. Tris(dibenzylideneacetone)dipalladium(0) (15 mg, 0.016 mmol) and tricyclohexylphosphine (10 mg, 0.04 mmol) were added, and the reaction mixture was heated at 70° C. for 18 hours, during this time a solid polymer mass formed. The reaction was cooled to room temperature and the liquids decanted. The solid was then stirred with toluene (200 mL) at room temperature for 18 hours. A thick gel formed. The mixture was concentrated in vacuo, then tetrahydrofuran (500 mL) was added to the residue and heated at 60° C. with stirring. The tetrahydrofuran solution was decanted. This warm extraction process was repeated (3×) and the tetrahydrofuran extracts combined, then concentrated in vacuo to give a plastic-like solid. The solid was redissolved in tetrahydrofuran then passed through a celite pad, eluting with tetrahydrofuran. The product eluate was partially concentrated, then rediluted to ca 300 mL total volume with tetrahydrofuran. Activated charcoal (1 g) was added. The mixture was heated at 50° C. for 30 minutes and filtered while hot. The activated charcoal treatment and filtration was repeated three times in total, then the filtrate was concentrated in vacuo to give a yellow foam. The foam was redissolved in tetrahydrofuran (75 mL) then added dropwise to rapidly stirred methanol (250 mL) in a glass beaker. The resulting solids were collected by vacuum filtration and air dried (50° C.) to give the 50:50 9,9-bis(5-cyano-5-methylhexyl)fluorene:9,9-Bis[2-(2-methoxyethoxy)ethyl]-9H-fluorene random copolymer as a yellow solid (1.27 g). GPC $M_n$ 45783, PD 4.50.

The polymer of Example 4 had a relative permittivity of 5.9 at 1000 Hz, and a charge mobility of $6.2 \times 10^{-7}$ cm$^2$/Vs (formulated in absence of small molecule OSC as a 1% by weight bromobenzene solution, L=12.2 μm). The average values for m and n in the polymer prepared, rounded to the nearest integer, were 58 and 58 respectively.

Formulation Example 4(a)

In these Examples the ratio of polymer to the semiconductor is in parts by weight. The polymer of Example 4 was formulated with 1,4,8,11-tetramethyl-6,13-bis(triethylsilylethynyl)pentacene (TMTES) in a ratio 2:1 at a total solids loading of 1.2% by weight in a bromobenzene and 2-propanol mixed solvent (ratio 9:1 by weight) and coated as an OSC layer in an OTFT device according to Method B described in the above procedure.

The OTFT performance of Formulation 4(a) is shown below:

| Formulation | Channel length of OTFT [microns] | Mobility cm$^2$/Vs | Standard deviation of mobility, % | Number of working transistors tested on substrate (out of 36) |
|---|---|---|---|---|
| Polymer Example (4) 50:50 9,9-bis(5-cyano-5-methylhexyl)fluorene:9,9-Bis[2-(2-methoxyethoxy)ethyl]-9H-fluorene random copolymer and TMTES in bromobenzene/2-propanol mixed solvent | 7.4 | 2.28 | 11 | 35 |

Organic thin film transistors (OTFT) fabricated using Formulation 4(a) as the semiconducting layer showed excellent charge carrier mobility at short channel length, and high device to device uniformity.

Example 5

Synthesis of the 9-hexyl-9-(5-cyano-5-methylhexyl))fluorene homopolymer 5(a) Synthesis of 6-chloro-2,2-dimethylhexanenitrile

Diisopropylamine (31.4 g, 0.31 mol) was added to anhydrous tetrahydrofuran (140 mL) and cooled to −70° C. under argon atmosphere. n-butyl lithium (2.1 M in hexane, 138 mL, 0.29 mol) was added dropwise maintaining T<−60° C. using external cooling. After cooling back to −70° C., a solution of isobutyronitrile (13.5 g, 0.19 mol) in anhydrous THF (70 mL) was added dropwise and the reaction mixture stirred at −70° C. for 20 min. A solution of 1-chloro-4-bromobutane (50 g, 0.29 mol) in anhydrous THF (70 mL) was added dropwise at −70° C. and the reaction mass stirred for a further 2.5 hours. The reaction was quenched with saturated aqueous ammonium chloride (150 mL) and allowed to warm to room temperature. Heptane was added, the layers split and the aqueous phase extracted with further heptane (2×). The combined organics were washed with brine, dried (Na$_2$SO$_4$) and filtered. Concentration of the filtrates in vacuo gave a pale yellow oil, which was purified by dry flash chromatography (0 to 10% ethyl acetate in heptane) to give 6-chloro-2,2-dimethylhexanenitrile as a colourless oil (28 g, 92%).

$^1$H NMR (300 MHz, CDCl$_3$) 3.54 (t, 2H), 1.80 (m, 2H), 1.62 (m, 2H), 1.52 (m, 2H), 1.32 (s, 6H).

5(b) Synthesis of 6-iodo-2,2-dimethylhexanenitrile

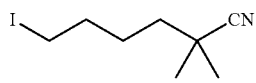

6-chloro-2,2-dimethylhexanenitrile (28 g, 0.18 mol) was dissolved in methyl ethyl ketone (300 mL). Sodium iodide (34.2 g, 0.23 mol) was added and the mixture heated at reflux for 18 hours. After cooling to room temperature, the solids were filtered off and washed with heptane. The filtrates were concentrated in vacuo then triturated with heptane. The solids were filtered and washed again with heptane, then the combined heptane layers concentrated in vacuo to give 6-iodo-2,2-dimethylhexanenitrile as a yellow oil (43.8 g, 97%).

$^1$H NMR (300 MHz, CDCl$_3$) 3.16 (t, 2H), 1.80 (m, 2H), 1.62-1.46 (m, 4H), 1.31 (s, 6H).

5(c) Synthesis of 9-hexyl-9-(5-cyano-5-methylhexyl)fluorene

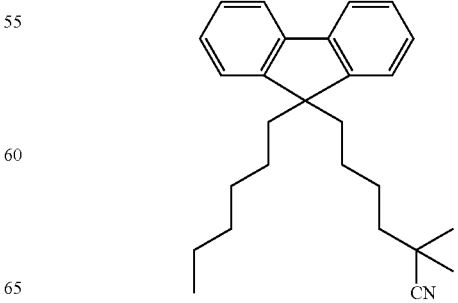

Fluorene (Sigma Aldrich) (10 g, 0.06 mol) was dissolved in anhydrous tetrahydrofuran (150 mL) and cooled to −70° C. under argon atmosphere. n-butyl lithium (2.5 M in hexane, 24 mL, 0.06 mol) was added dropwise to give an orange suspension, then the reaction mixture warmed to −10° C. and stirred for 1 hour. The reaction mixture was cooled back to −70° C., then 1-bromohexane (9.93 g, 0.06 mol) was added dropwise. The reaction mixture was allowed to warm to room temperature and stirred for 2 hours while maintaining argon atmosphere, then cooled back to −70° C. n-butyl lithium (2.5 M in hexane, 24 mL, 0.06 mol) was added dropwise to give a red solution. The reaction mixture was warmed to −10° C. and stirred for 1 hour, then cooled back to −70° C. before dropwise addition of 6-iodo-2,2-dimethylhexane nitrile (Example 5(a)) (15.1 g, 0.06 mol). The reaction mixture was stirred at room temperature for 18 hours, then cooled to 5° C. and quenched with water (150 mL). The layers were separated and the aqueous phased extracted with ethyl acetate (200 mL). The combined organics were washed with water (200 mL) and brine (200 mL), dried ($Na_2SO_4$) and filtered. Concentration of the filtrate in vacuo gave an orange oil, which was partially purified by dry flash chromatography (0 to 10% ethyl acetate in heptane). The product containing fractions were concentrated in vacuo and repurified by dry flash chromatography using a narrower gradient (0 to 5% ethyl acetate in heptane). Pure column fractions were concentrated in vacuo to give 9-hexyl-9-(5-cyano-5-methylhexyl)fluorene as a solidifying off white oil (3.4 g, 15%).

$^1$H NMR (300 MHz, $CDCl_3$) 7.70 (m, 2H), 7.37-7.30 (m, 6H), 2.04 (m, 4H), 1.28 (m, 10H), 1.12-1.04 (m, 6H), 0.79 (t, 3H), 0.64 (m, 4H).

Synthesis of the 9-hexyl-9-(5-cyano-5-methyl-hexyl))fluorene homopolymer (Example 5)

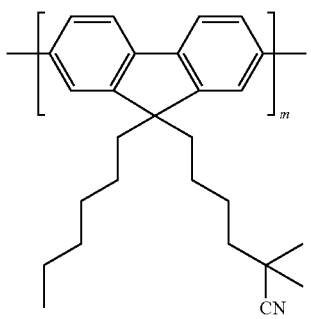

Anhydrous iron (III) chloride (5.9 g, 0.036 mol) was suspended in dichloromethane (80 mL) and cooled to 0° C. under argon atmosphere, with stirring. 9-hexyl-9-(5-cyano-5-methylhexyl)fluorene (Example 5(b)) (3.4 g, 0.009 mol) was dissolved in dichloromethane (20 mL) and added dropwise. A black suspension formed. The reaction mixture was stirred at room temperature for 96 hours, then poured into vigorously stirred methanol (200 mL). The solids were collected by vacuum filtration, then redissolved in toluene (200 mL). Deionised water (150 mL) was added then the mixture filtered through a celite pad, rinsing with toluene and deionised water. The layers were separated and the organic phase concentrated in vacuo to give a yellow solid. The solid was redissolved in toluene (80 mL) and activated charcoal (1 g) was added. The mixture was heated at 50° C. for 30 minutes and filtered while hot. The activated charcoal treatment and filtration was repeated three times in total, then the filtrate was concentrated in vacuo to give a yellow solid. The foam was redissolved in tetrahydrofuran (45 mL) then added dropwise to rapidly stirred methanol (150 mL) in a glass beaker. The resulting solids were collected by vacuum filtration and air dried (50° C.) to give 9-hexyl-9-(5-cyano-5-methylhexyl)fluorene homopolymer as a yellow solid (1.77 g). GPC $M_n$ 12276, PD 2.86.

The polymer of Example 5 had a relative permittivity of 6.2 at 1000 Hz, and a charge mobility of $1.0 \times 10^{-5}$ $cm^2/Vs$ (formulated in absence of small molecule OSC as a 2% by weight tetralin solution, L=10.5 μm). The average value for m in the polymer prepared, rounded to the nearest integer, was 33.

Formulation Example 5(a)

In these Examples the ratio of polymer to the semiconductor is in parts by weight. The polymer of Example 5 was formulated with 1,4,8,11-tetramethyl-6,13-bis(triethylsilyl-ethynyl)pentacene (TMTES) in a ratio 2:1 at a total solids loading of 1.2% by weight in tetralin solvent and 2-propanol mixed solvent (ratio 9:1 by weight) and coated as an OSC layer in an OTFT device according to Method B described in the above procedure.

The OTFT performance of Formulation 5(a) is shown below:

| Formulation | Channel length of OTFT [microns] | Mobility $cm^2/Vs$ | Standard deviation of mobility, % | Number of working transistors tested on substrate (out of 36) |
|---|---|---|---|---|
| Polymer Example (5) 9-hexyl-9-(5-cyano-5-methylhexyl))fluorene homopolymer and TMTES in tetralin/2-propanol mixed solvent | 8.3 | 3.72 | 10 | 36 |

Organic thin film transistors (OTFT) fabricated using Formulation 5(a) as the semiconducting layer showed excellent charge carrier mobility at short channel length, and high device to device uniformity.

Formulation Example 5(b)

In these Examples the ratio of polymer to the semiconductor is in parts by weight. The polymer of Example 5 was formulated with 1,4,8,11-tetramethyl-6,13-bis(triethylsilylethynyl)pentacene (TMTES) in a ratio 2:1 at a total solids loading of 1.2% by weight in tetralin solvent and coated as an OSC layer in an OTFT device according to Method B described in the above procedure.

The OTFT performance of Formulation 5(b) is shown below:

| Formulation | Channel length of OTFT [microns] | Mobility cm$^2$/Vs | Standard deviation of mobility, % | Number of working transistors tested on substrate (out of 36) |
|---|---|---|---|---|
| Polymer Example (5) 9-hexyl-9-(5-cyano-5-methylhexyl))fluorene homopolymer and TMTES in tetralin | 8.1 | 2.53 | 19 | 20 |

Organic thin film transistors (OTFT) fabricated using Formulation 5(b) as the semiconducting layer showed excellent charge carrier mobility at short channel length, and high device to device uniformity.

Example 6

Synthesis of the 50:50 9,9-bis(5-cyano-5-methylhexyl)fluorene 9,10-dioctylphenanthrene Random Copolymer 6(a) Synthesis of 4,4'-dibromo-2-biphenylcarboxylic Acid

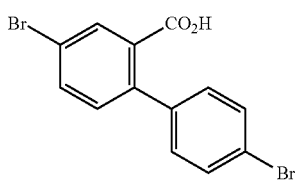 [SMILES: O=C(Cl)c1cc(Br)ccc1-c1ccc(Br)cc1]

2,7-dibromofluorenone (Sigma Aldrich) (28.4 g, 0.069 mol), potassium hydroxide (39 g, 0.69 mol) and toluene (470 mL) were combined and heated at reflux with stirring for 4 hours. The reaction mass was cooled to room temperature, diluted with water (1 L) and toluene (500 mL) and briefly stirred. The layers were separated and the organic phase washed with water (300 mL). The toluene phase was discarded. The combined aqueous layers were acidified with 2 M hydrochloric acid and a white precipitate formed. After stirring for 15 minutes, the solids were collected by vacuum filtration and washed with water, then air dried (50° C.) to constant weight. This gave 4,4'-dibromo-2-biphenylcarboxylic acid as a white solid (23.1 g, 94%).

$^1$H NMR (d$_6$ DMSO) 7.87 (d, 1H), 7.75 (dd, 1H), 7.59 (2H, d), 7.32-7.23 (m, 3H).

6(b) Synthesis of 4,4'-Dibromo-2-biphenylcarboxylic Acid Chloride

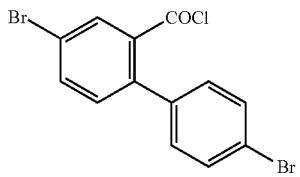

4,4'-dibromo-2-biphenylcarboxylic acid (Example 6(a)) (23.2 g, 0.065 mol) was suspended in dichloromethane (230 mL) under an argon atmosphere. Oxalyl chloride (11 mL, 0.13 mol) was added followed by N,N-dimethylformamide (1-2 drops). The reaction mixture was stirred at room temperature for 18 hours (gas evolution) and an orange solution formed. The reaction mixture was concentrated in vacuo to give an orange solid, which was recrystallised from heptane. Prior to cooling and crystallisation the hot heptane solution containing the product was decanted to remove a small amount of non soluble residue. After cooling the heptane solution, the solid product was collected by vacuum filtration and dried under vacuum (40° C.). This gave 4,4'-dibromo-2-biphenylcarboxylic acid chloride as a light brown solid (20.9 g, 86%).

$^1$H NMR (300 MHz, CDCl$_3$) 8.13 (d, 1H), 7.74 (dd, 1H), 7.55 (m, 2H), 7.24 (d, 1H), 7.16 (m, 2H).

6(c) Synthesis of 9-octadecyne

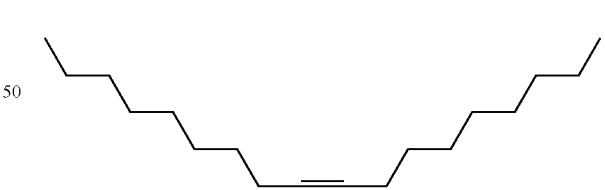

1-decyne (15 g, 0.108 mol) was dissolved in anhydrous tetrahydrofuran (250 mL) and cooled to −78° C. under argon. n-butyl lithium (2.5 M in hexane, 39.2 mL, 0.098 mol) was added dropwise, maintaining the reaction temperature <−60° C., and the mixture was then stirred at −78° C. for 30 minutes before warming to room temperature. n-octyl bromide (15 mL, 0.087 mol) and sodium iodide (1.62 g, 0.0087 mol) were added, and the reaction mixture heated at reflux for 18 hours. After cooling to 0° C., the reaction was quenched by addition of saturated ammonium chloride solution. The mixture was diluted with water (50 mL) and ethyl acetate (200 mL). The layers were separated and the aqueous phase extracted with ethyl acetate (2×). The combined organics were washed with water (200 mL), brine (200 mL) then dried (Na$_2$SO$_4$) and filtered. Concentration of the filtrate in vacuo gave 9-octadecyne as an orange oil (25.1 g, 93%).

$^1$H NMR (300 MHz, CDCl$_3$) 2.18-2.10 (m, 4H), 1.55-1.15 (m, 24H), 0.85 (m, 6H).

6(d) Synthesis of 2,7-dibromo-9,10-dioctylphenanthrene

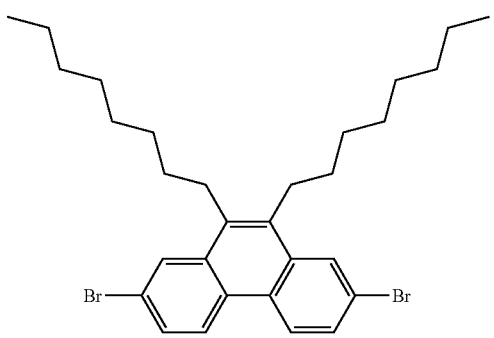 [SMILES: CCCCCCCCc1c(CCCCCCCC)c2cc(Br)ccc2c2ccc(Br)cc12]

Note: Xylenes (Mixture of Isomers) was Thoroughly Degassed with Argon Prior to Use.

4,4'-dibromo-2-biphenylcarboxylic acid chloride (Example 6(b)) (6.7 g, 0.018 mol) and 9-octadecyne (Example 6(c)) (5.3 g, 0.021 mol) were dissolved in xylenes (40 mL) to prepare 'Solution A'. In a round bottom flask, 1,5-cyclooctadiene iridium (I) chloride dimer (0.12 g, 0.00018 mol) was dissolved in xylenes (180 mL). Tri(tert-butyl phosphine) (1 M in toluene, 0.36 mL, 0.00036 mol) was added, followed by 'Solution A'. The reaction mixture was heated at 130° C. for 18 hours to give a dark orange solution. After cooling to room temperature, the reaction mixture was concentrated in vacuo to give a black solid. The solid was triturated with isopropanol and stirred at room temperature for 1 hour. The solids were collected by vacuum filtration, washed with isopropanol (2×) and partially dried. Recrystallisation of the partially purified solid from isopropanol gave 2,7-dibromo-9,10-dioctylphenanthrene as an off white solid (5.2 g, 52%).

$^1$H NMR (300 MHz, CDCl$_3$) 8.49 (d, 2H), 8.19 (m, 2H), 7.66 (m, 2H), 3.06 (m, 4H), 1.69-1.51 (m, 10H), 1.42-1.32 (m, 14H), 0.90 (m, 6H).

6(e) Synthesis of 9,10-dioctylphenanthrene-2,7-diboronic Acid bis(pinacol) ester

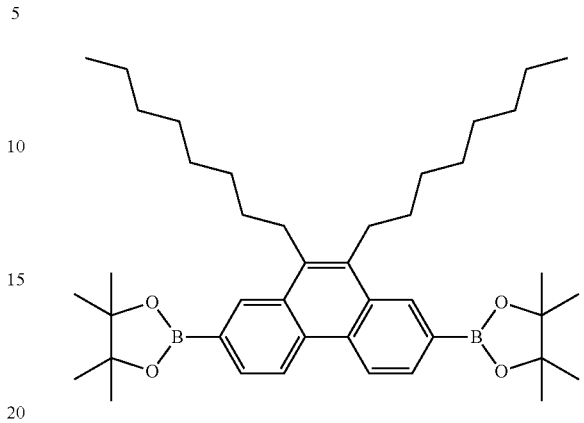

2,7-dibromo-9,10-dioctylphenanthrene (Example 6(d)) (10.2 g, 0.018 mol) was dissolved in 1,4-dioxane (220 mL) and the solution degassed with argon for 30 minutes. Bis(pinacolato)diboron (10.2 g, 0.04 mol), potassium acetate (6.3 g, 0.064 mol) and palladium (II) chloride diphenylphosphinylferrocene (dppf) complex (0.666 g, 0.0009 mol) were added, and the reaction mixture was heated at 90-100° C. for 18 hours. At this stage thin layer chromatography (TLC) analysis showed a small amount of starting material remaining, and the reaction mixture was heated at 90-100° C. for a further 3 hours. After cooling to room temperature, the reaction mixture was filtered through a celite pad washing with dichloromethane, then the filtrate was concentrated in vacuo to give a dark solid. Recrystallisation from isopropanol gave 9,10-dioctylphenanthrene-2,7-diboronic acid bis (pinacol) ester as a brown solid (8.6 g, 73%)

$^1$H NMR (300 MHz, CDCl$_3$) 8.70 (d, 2H), 8.59 (s, 2H), 7.96 (d, 2H), 3.22 (m, 4H), 1.77-1.67 (m, 4H), 1.63-1.53 (m, 4H), 1.48-1.27 (m, 40H), 0.90 (6H, m).

Synthesis of the 50:50 9,9-bis(5-cyano-5-methylhexyl)fluorene 9,10-dioctylphenanthrene Random Copolymer (Example 6)

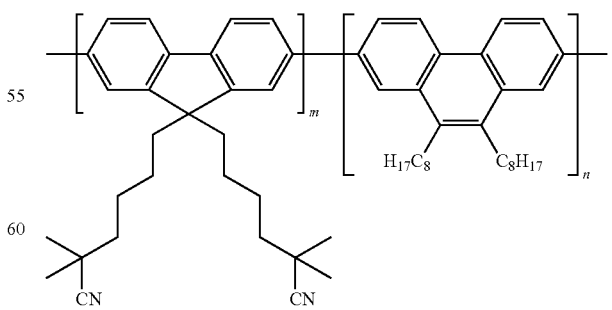

A mixture of 1,4-dioxane (110 mL) and deionized water (50 mL) was degassed with argon. 2,7-dibromo-9,9-bis(5-cyano-5-methylhexyl)fluorene (Example 1(b)) (4.36 g, 0.0076 mol), 9,10-dioctylphenanthrene-2,7-diboronic acid bis(pinacol) ester (Example 6(e)) (5 g, 0.0076 mol) and tripotassium phosphate (8.1 g, 0.038 mol) were added and the resulting solution degassed again with argon. Tris(dibenzylideneacetone)dipalladium(0) (7 mg, 0.0076 mmol) and tricyclohexylphosphine (5 mg, 0.018 mmol) were added, and the reaction mass was heated at 70° C. for 18 hours. Formation of a green solid mass was observed. After cooling to room temperature, the liquids were decanted and the solid mass was dissolved in toluene (300 mL). Deionised water (200 mL) was added and the mixture filtered through a celite pad, washing through with toluene. The layers were separated and the organic phase was washed with deionised water (200 mL), then concentrated in vacuo. The crude product was redissolved in toluene, then purified by dry flash chromatography eluting first with toluene and then with 1:1 tetrahydrofuran-toluene. The product containing fractions were combined and concentrated in vacuo to give a dark green solid. The solid was redissolved in toluene (250 mL). Activated charcoal (1 g) was added, then the mixture heated at 50° C. for 30 minutes and filtered while hot. The activated charcoal treatment and filtration was repeated three times in total, then the filtrate was concentrated in vacuo and redissolved in tetrahydrofuran (75 mL). This solution was added dropwise to stirred methanol (250 mL). After 45 minutes of stirring, the solids were filtered at the pump then air dried (50° C.) to give the 50:50 9,9-bis(5-cyano-5-methylhexyl) fluorene:9,10-dioctylphenanthrene random copolymer (4.52 g) as a green solid. GPC $M_n$ 9241, PD 2.07.

The polymer of Example 6 had a relative permittivity of 7.3 at 1000 Hz, and a charge mobility of $1.4 \times 10^{-5}$ cm$^2$/Vs (formulated in absence of small molecule OSC as a 2% by weight bromobenzene solution, L=10.5 μm). The average values for m and n in the polymer prepared, rounded to the nearest integer, were 11 and 11 respectively.

Formulation Example 6(a)

In these Examples the ratio of polymer to the semiconductor is in parts by weight. The polymer of Example 6 was formulated with 1,4,8,11-tetramethyl-6,13-bis(triethylsilylethynyl)pentacene (TMTES) in a ratio 2:1 at a total solids loading of 1.2% by weight in bromobenzene solvent and coated as an OSC layer in an OTFT device according to Method B described in the above procedure.

The OTFT performance of Formulation 6(a) is shown below:

| Formulation | Channel length of OTFT [microns] | Mobility cm$^2$/Vs | Standard deviation of mobility, % | Number of working transistors tested on substrate (out of 36) |
|---|---|---|---|---|
| Polymer Example (6) 50:50 9,9-bis(5-cyano-5-methylhexyl)fluorene:9,10-dioctylphenanthrene random copolymer and TMTES in bromobenzene | 7.9 | 2.14 | 21 | 35 |

Organic thin film transistors (OTFT) fabricated using Formulation 6(a) as the semiconducting layer showed excellent charge carrier mobility at short channel length, and high device to device uniformity.

Formulation Example 6(b)

In these Examples the ratio of polymer to the semiconductor is in parts by weight. The polymer of Example 6 was formulated with 1,4,8,11-tetramethyl-6,13-bis(triethylsilylethynyl)pentacene (TMTES) in a ratio 2:1 at a total solids loading of 1.2% by weight in bromobenzene solvent and 2-propanol mixed solvent (ratio 9:1 by weight) and coated as an OSC layer in an OTFT device according to Method B described in the above procedure.

The OTFT performance of Formulation 6(b) is shown below:

| Formulation | Channel length of OTFT [microns] | Mobility cm$^2$/Vs | Standard deviation of mobility, % | Number of working transistors tested on substrate (out of 36) |
|---|---|---|---|---|
| Polymer Example (6) 50:50 9,9-bis(5-cyano-5-methylhexyl)fluorene:9,10-dioctylphenanthrene random copolymer and TMTES in bromobenzene/2-propanol mixed solvent | 8 | 1.81 | 28 | 35 |

Organic thin film transistors (OTFT) fabricated using Formulation 6(b) as the semiconducting layer showed excellent charge carrier mobility at short channel length, and high device to device uniformity.

The invention claimed is:

1. A semiconducting composition comprising a semiconducting polymer and a semiconducting non-polymeric polycyclic compound, wherein the semiconducting polymer comprises units of A and B:

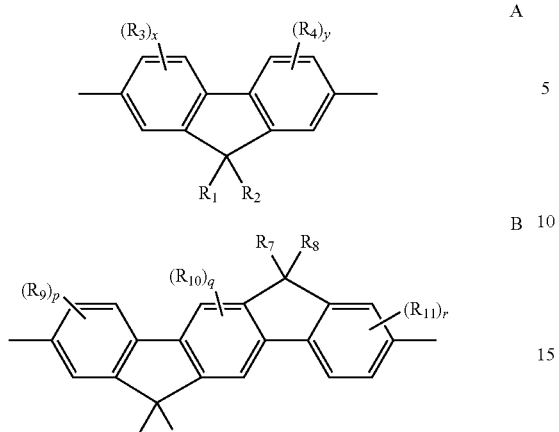

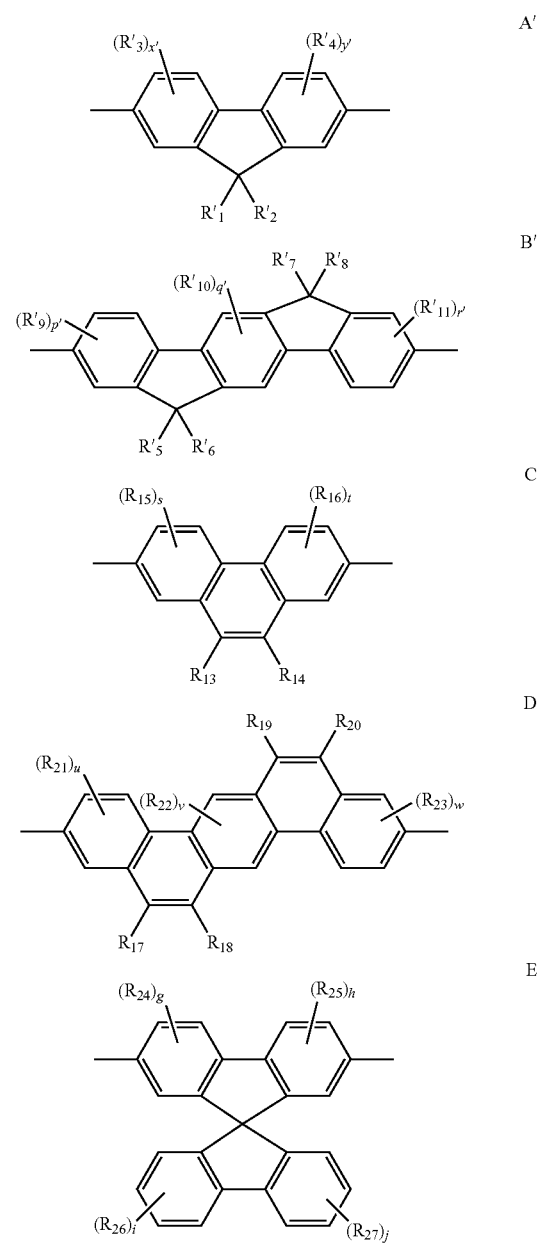

wherein $R_1$, $R_2$, $R_5$, $R_6$, $R_7$ and $R_8$ are each independently selected from $C_1$-$C_{12}$ alkyl, $C_2$-$C_{12}$ alkenyl and aryl;

wherein when any $R_1$, $R_2$, $R_5$, $R_6$, $R_7$ and/or $R_8$ group is $C_1$-$C_{12}$ alkyl or $C_2$-$C_{12}$ alkenyl, then each $R_1$, $R_2$, $R_5$, $R_6$, $R_7$ and/or $R_8$ group is optionally substituted by one or more substituents independently selected from cyano, hydroxy, $C_1$-$C_{10}$ alkoxy, $C_3$-$C_8$ cycloalkyl, heterocyclyl, aryl and a group of the formula —$(OCH_2CH_2)_z$—$OR_{12}$, wherein z is 1, 2, 3, 4, 5 or 6 and $R_{12}$ is $C_1$-$C_4$ alkyl;

and wherein any aryl group present in $R_1$, $R_2$, $R_5$, $R_6$, $R_7$ and/or $R_8$ is optionally substituted by one or more substituents independently selected from $C_1$-$C_4$ alkyl, $C_1$-$C_4$ alkoxy, cyano, hydroxy, fluoro, chloro, trifluoromethyl and trifluoromethoxy;

wherein in the units A (when present) at least one of the $R_1$ and $R_2$ groups is substituted by one or more cyano groups and in the units B (when present) at least one of the $R_5$, $R_6$, $R_7$ and $R_8$ groups is substituted by one or more cyano groups;

x represents 0, 1, 2 or 3;

y represents 0, 1, 2 or 3;

p represents 0, 1, 2 or 3;

q represents 0, 1 or 2;

r represents 0, 1, 2 or 3;

wherein each $R_3$, $R_4$, $R_9$, $R_{10}$ and $R_{11}$ (when present) is independently selected from $C_1$-$C_6$ alkyl and $C_1$-$C_4$ alkoxy.

2. The semiconducting composition according to claim 1, wherein the semiconducting polymer has a relative permittivity of greater than 3.4 at 1000 Hz.

3. The semiconducting composition according to claim 1, wherein the semiconducting polymer comprises at least 20% monomeric B units.

4. The semiconducting composition according to claim 1, wherein the semiconducting polymer comprises at least 20% monomeric A units.

5. The semiconducting composition according to claim 1, wherein the semiconducting polymer is a copolymer comprising units of A and B and further comprising units of A', B', C, D and/or E:

wherein $R'_1$, $R'_2$, $R'_5$, $R'_6$, $R'_7$, $R'_8$, $R_{13}$, $R_{14}$, $R_{17}$, $R_{18}$, $R_{19}$ and/or $R_{20}$ are each independently selected from $C_1$-$C_{12}$ alkyl, $C_2$-$C_{12}$ alkenyl and aryl;

wherein when any $R'_1$, $R'_2$, $R'_5$, $R'_6$, $R'_7$, $R'_8$, $R_{13}$, $R_{14}$, $R_{17}$, $R_{18}$, $R_{19}$ and/or $R_{20}$ group is $C_1$-$C_{12}$ alkyl or $C_2$-$C_{12}$ alkenyl, then each $R'_1$, $R'_2$, $R'_5$, $R'_6$, $R'_7$, $R'_8$, $R_{13}$, $R_{14}$, $R_{17}$, $R_{18}$, $R_{19}$ and/or $R_{20}$ group is optionally substituted by one or more substituents independently selected from cyano, hydroxy, $C_1$-$C_{10}$ alkoxy, $C_3$-$C_8$ cycloalkyl, heterocyclyl, aryl and a group of the formula —$(OCH_2CH_2)_{z'}$—$OR_{28}$, wherein z' is 1, 2, 3, 4, 5 or 6 and $R_{28}$ is $C_1$-$C_4$ alkyl;

and wherein any aryl group present in $R'_1$, $R'_2$, $R'_5$, $R'_6$, $R'_7$, $R'_8$, $R_{13}$, $R_{14}$, $R_{17}$, $R_{18}$, $R_{19}$ and/or $R_{20}$ is optionally substituted by one or more substituents independently selected from $C_1$-$C_4$ alkyl, $C_1$-$C_4$ alkoxy, cyano, hydroxy, fluoro, chloro, trifluoromethyl and trifluoromethoxy;

x' represents 0, 1, 2 or 3;
y' represents 0, 1, 2 or 3;
p' represents 0, 1, 2 or 3;
q' represents 0, 1 or 2;
r' represents 0, 1, 2 or 3;
s represents 0, 1, 2 or 3;
t represents 0, 1, 2 or 3;
u represents 0, 1, 2 or 3;
v represents 0, 1 or 2;
w represents 0, 1, 2 or 3;
g represents 0, 1, 2 or 3;
h represents 0, 1, 2 or 3;
i represents 0, 1, 2, 3 or 4;
j represents 0, 1, 2, 3 or 4;
wherein each $R'_3$, $R'_4$, $R'_9$, $R'_{10}$, $R'_{11}$, $R_{15}$, $R_{16}$, $R_{21}$, $R_{22}$, $R_{23}$, $R_{24}$, $R_{25}$, $R_{26}$ and $R_{27}$ (when present) is independently selected from $C_1$-$C_6$ alkyl and $C_1$-$C_4$ alkoxy.

6. The semiconducting composition according to claim 5, wherein the semiconducting polymer is a copolymer comprising units of A and B and units of A', units of A and B and units of B', or units of A and B and units of C.

7. The semiconducting composition according to claim 6, wherein the semiconducting polymer is a copolymer comprising units of A and B and units of A',
wherein $R_1$ and $R_2$ are each independently selected from $C_1$-$C_{12}$ alkyl, wherein the $C_1$-$C_{12}$ alkyl is optionally substituted by one or more substituents independently selected from cyano, hydroxyl, $C_1$-$C_{10}$ alkoxy, $C_3$-$C_8$ cycloalkyl, heterocyclyl, aryl and —$(OCH_2CH_2)_z$—$OR_{12}$, wherein z is 1, 2, 3, 4, 5 or 6 and $R_{12}$ is $C_1$-$C_4$ alkyl;
and wherein any aryl group present in $R_1$ and/or $R_2$ is optionally substituted by one or more substituents independently selected from $C_1$-$C_4$ alkyl, $C_1$-$C_4$ alkoxy, cyano, hydroxy, fluoro, chloro, trifluoromethyl and trifluoromethoxy;
wherein at least one of the $R_1$ and/or $R_2$ groups is substituted by one or more cyano groups;
wherein x represents 0, 1, 2 or 3 and y represents 0, 1, 2 or 3;
wherein each $R_3$ and $R_4$ (when present) is independently selected from $C_1$-$C_6$ alkyl and $C_1$-$C_4$ alkoxy;
wherein $R'_1$ and $R'_2$ are each independently selected from $C_1$-$C_{12}$ alkyl, wherein the $C_1$-$C_{12}$ alkyl is optionally substituted by one or more substituents independently selected from cyano, hydroxy, $C_1$-$C_{10}$ alkoxy, $C_3$-$C_8$ cycloalkyl, heterocyclyl, aryl and a group of the formula —$(OCH_2CH_2)_{z'}$—$OR_{28}$, wherein z' is 1, 2, 3, 4, 5 or 6 and $R_{28}$ is $C_1$-$C_4$ alkyl;
and wherein any aryl group present in $R'_1$ and/or $R'_2$ is optionally substituted by one or more substituents independently selected from $C_1$-$C_4$ alkyl, $C_1$-$C_4$ alkoxy, cyano, hydroxy, fluoro, chloro, trifluoromethyl and trifluoromethoxy;
wherein x' represents 0, 1, 2 or 3 and y' represents 0, 1, 2 or 3;
and wherein each $R'_3$ and $R'_4$ (when present) is independently selected from $C_1$-$C_6$ alkyl and $C_1$-$C_4$ alkoxy.

8. The semiconducting composition according to claim 7, wherein $R_1$ and $R_2$ are each independently selected from $C_1$-$C_{12}$ alkyl, wherein the $C_1$-$C_{12}$ alkyl is substituted by one or more cyano groups;
wherein x represents 0 and y represents 0;
wherein $R'_1$ and $R'_2$ are each independently selected from $C_1$-$C_{12}$ alkyl, wherein the $C_1$-$C_{12}$ alkyl is optionally substituted by one or more substituents independently selected from cyano, hydroxy, $C_1$-$C_{10}$ alkoxy, $C_3$-$C_8$ cycloalkyl, heterocyclyl, aryl and a group of the formula —$(OCH_2CH_2)_{z'}$—$OR_{28}$, wherein z' is 1, 2, 3, 4, 5 or 6 and $R_{28}$ is $C_1$-$C_4$ alkyl;
and wherein any aryl group present in $R'_1$ and/or $R'_2$ is optionally substituted by one or more substituents independently selected from $C_1$-$C_4$ alkyl, $C_1$-$C_4$ alkoxy, cyano, hydroxy, fluoro, chloro, trifluoromethyl and trifluoromethoxy;
wherein x' represents 0 and y' represents 0.

9. A semiconducting layer comprising a semiconducting composition according to claim 1.

10. An electronic device comprising a semiconducting composition according to claim 1.

11. A semiconducting copolymer comprising units of A and B:

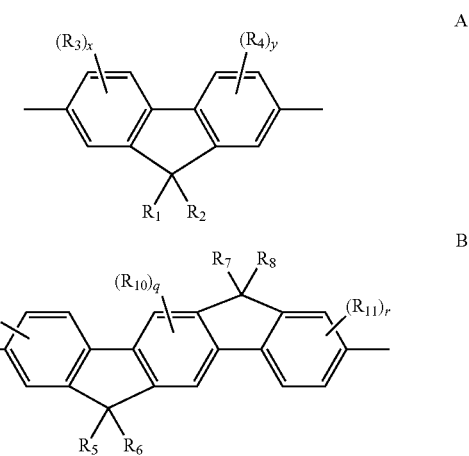

wherein $R_1$, $R_2$, $R_5$, $R_6$, $R_7$ and $R_8$ are each independently selected from $C_1$-$C_{12}$ alkyl, $C_2$-$C_{12}$ alkenyl and aryl;
wherein when any $R_1$, $R_2$, $R_5$, $R_6$, $R_7$ and/or $R_8$ group is $C_1$-$C_{12}$ alkyl or $C_2$-$C_{12}$ alkenyl, then each $R_1$, $R_2$, $R_5$, $R_6$, $R_7$ and/or $R_8$ group is optionally substituted by one or more substituents independently selected from cyano, hydroxy, $C_1$-$C_{10}$ alkoxy, $C_3$-$C_8$ cycloalkyl, heterocyclyl, aryl and a group of the formula —$(OCH_2CH_2)_z$—$OR_{12}$, wherein z is 1, 2, 3, 4, 5 or 6 and $R_{12}$ is $C_1$-$C_4$ alkyl;
and wherein any aryl group present in $R_1$, $R_2$, $R_5$, $R_6$, $R_7$ and/or $R_8$ is optionally substituted by one or more substituents independently selected from $C_1$-$C_4$ alkyl, $C_1$-$C_4$ alkoxy, cyano, hydroxy, fluoro, chloro, trifluoromethyl and trifluoromethoxy;
wherein in the units A (when present) at least one of the $R_1$ and $R_2$ groups is substituted by one or more cyano groups and in the units B (when present) at least one of the $R_5$, $R_6$, $R_7$ and $R_8$ groups is substituted by one or more cyano groups;
x represents 0, 1, 2 or 3;
y represents 0, 1, 2 or 3;
p represents 0, 1, 2 or 3;
q represents 0, 1 or 2;
r represents 0, 1, 2 or 3;
wherein each $R_3$, $R_4$, $R_9$, $R_{10}$ and $R_{11}$ (when present) is independently selected from $C_1$-$C_6$ alkyl and $C_1$-$C_4$ alkoxy.

12. The semiconducting copolymer according to claim 11, further comprising units of A', B', C, D and/or E:

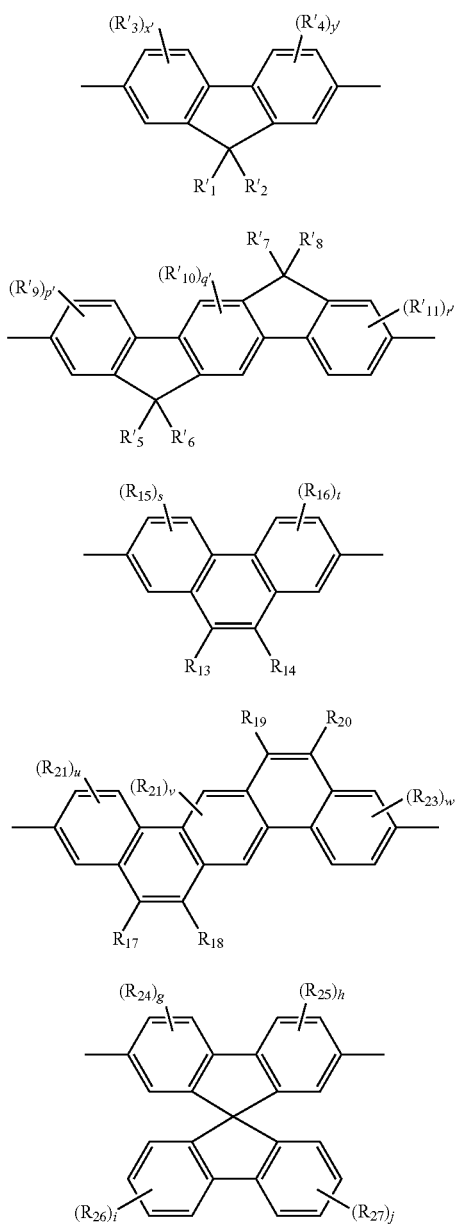

wherein $R'_1$, $R'_2$, $R'_5$, $R'_6$, $R'_7$, $R'_8$, $R_{13}$, $R_{14}$, $R_{17}$, $R_{18}$, $R_{19}$ and/or $R_{20}$ are each independently selected from $C_1$-$C_{12}$ alkyl, $C_2$-$C_{12}$ alkenyl and aryl;

wherein when any $R'_1$, $R'_2$, $R'_5$, $R'_6$, $R'_7$, $R'_8$, $R_{13}$, $R_{14}$, $R_{17}$, $R_{18}$, $R_{19}$ and/or $R_{20}$ group is $C_1$-$C_{12}$ alkyl or $C_2$-$C_{12}$ alkenyl, then each $R'_1$, $R'_2$, $R'_5$, $R'_6$, $R'_7$, $R'_8$, $R_{13}$, $R_{14}$, $R_{17}$, $R_{18}$, $R_{19}$ and/or $R_{20}$ group is optionally substituted by one or more substituents independently selected from cyano, hydroxy, $C_1$-$C_{10}$ alkoxy, $C_3$-$C_8$ cycloalkyl, heterocyclyl, aryl and a group of the formula —$(OCH_2CH_2)_{z'}$—$OR_{28}$, wherein $z'$ is 1, 2, 3, 4, 5 or 6 and $R_{28}$ is $C_1$-$C_4$ alkyl;

and wherein any aryl group present in $R'_1$, $R'_2$, $R'_5$, $R'_6$, $R'_7$, $R'_8$, $R_{13}$, $R_{14}$, $R_{17}$, $R_{18}$, $R_{19}$ and/or $R_{20}$ is optionally substituted by one or more substituents independently selected from $C_1$-$C_4$ alkyl, $C_1$-$C_4$ alkoxy, cyano, hydroxy, fluoro, chloro, trifluoromethyl and trifluoromethoxy;

x' represents 0, 1, 2 or 3;
y' represents 0, 1, 2 or 3;
p' represents 0, 1, 2 or 3;
q' represents 0, 1 or 2;
r' represents 0, 1, 2 or 3;
s represents 0, 1, 2 or 3;
t represents 0, 1, 2 or 3;
u represents 0, 1, 2 or 3;
v represents 0, 1 or 2;
w represents 0, 1, 2 or 3;
g represents 0, 1, 2 or 3;
h represents 0, 1, 2 or 3;
i represents 0, 1, 2, 3 or 4;
j represents 0, 1, 2, 3 or 4;
wherein each $R'_3$, $R'_4$, $R'_9$, $R'_{10}$, $R'_{11}$, $R_{15}$, $R_{16}$, $R_{21}$, $R_{22}$, $R_{23}$, $R_{24}$, $R_{25}$, $R_{26}$ and $R_{27}$ (when present) is independently selected from $C_1$-$C_6$ alkyl and $C_1$-$C_4$ alkoxy.

13. The semiconducting copolymer according to claim 12, wherein the copolymer comprises units of A and B and units of A', units of A and B and units of B', or units of A and B and units of C.

14. The semiconducting copolymer according to claim 11, having a relative permittivity of greater than 3.4 at 1000 Hz.

15. The semiconducting copolymer according to claim 11, wherein the copolymer comprises at least 20% monomeric B units.

16. The semiconducting copolymer according to claim 15, wherein the copolymer comprises at least 20% monomeric A units.

17. A semiconducting composition comprising a semiconducting copolymer according to claim 11.

18. A semiconducting layer comprising a semiconducting composition according to claim 17.

19. An electronic device comprising a semiconducting composition according to claim 17.

20. An organic binder in a semiconducting composition, wherein the organic binder comprises a semiconducting copolymer according to claim 11.

* * * * *